(12) United States Patent
Muto et al.

(10) Patent No.: US 11,037,847 B2
(45) Date of Patent: Jun. 15, 2021

(54) METHOD OF MANUFACTURING SEMICONDUCTOR MODULE AND SEMICONDUCTOR MODULE

(71) Applicant: Renesas Electronics Corporation, Tokyo (JP)

(72) Inventors: Kuniharu Muto, Tokyo (JP); Koji Bando, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/736,052

(22) Filed: Jan. 7, 2020

(65) Prior Publication Data

US 2020/0144147 A1 May 7, 2020

Related U.S. Application Data

(62) Division of application No. 15/969,897, filed on May 3, 2018, now Pat. No. 10,566,258.

(30) Foreign Application Priority Data

Jun. 30, 2017 (JP) ................. 2017-128640

(51) Int. Cl.
*H01L 23/31* (2006.01)
*H01L 23/495* (2006.01)
(Continued)

(52) U.S. Cl.
CPC ........ *H01L 23/3135* (2013.01); *H01L 21/481* (2013.01); *H01L 21/4842* (2013.01);
(Continued)

(58) Field of Classification Search
CPC .......... H01L 23/3135; H01L 23/49537; H01L 23/49562; H01L 25/165; H01L 25/50; H01L 21/162; H01L 23/4952; H01L 23/49568; H01L 21/4842; H01L 23/4006; H01L 24/73; H01L 24/48; H01L 24/45; H01L 21/481; H01L 21/565;
(Continued)

(56) References Cited

U.S. PATENT DOCUMENTS

2005/0067719 A1  3/2005  Hayashi et al.
2009/0057929 A1*  3/2009  Sasaki ................ H01L 23/3121
                                                              257/796
(Continued)

FOREIGN PATENT DOCUMENTS

JP     2005-109100 A    4/2005
JP     2012-195492 A   10/2012

*Primary Examiner* — Ermias T Woldegeorgis
(74) *Attorney, Agent, or Firm* — Mattingly & Malur, PC

(57) ABSTRACT

Reliability of a semiconductor module is improved. In a resin mold step of assembly of a semiconductor module, an IGBT chip, a diode chip, a control chip, a part of each of chip mounting portions are resin molded so that a back surface of each of the chip mounting portions is exposed from a back surface of a sealing body. After the resin molding, an insulating layer is bonded to the back surface of the sealing body so as to cover each back surface (exposed portion) of the chip mounting portions, and then, a TIM layer is bonded to an insulating layer. Here, a region of the TIM layer in a plan view is included in a region of the insulating layer.

3 Claims, 34 Drawing Sheets

(51) Int. Cl.
- *H01L 25/16* (2006.01)
- *H01L 25/00* (2006.01)
- *H01L 21/48* (2006.01)
- *H01L 23/40* (2006.01)
- *H01L 23/00* (2006.01)
- *H01L 25/07* (2006.01)
- *H01L 23/36* (2006.01)
- *H01L 25/18* (2006.01)
- *H01L 21/56* (2006.01)
- *H01L 23/29* (2006.01)

(52) U.S. Cl.
CPC .......... *H01L 23/36* (2013.01); *H01L 23/4006* (2013.01); *H01L 23/4952* (2013.01); *H01L 23/49537* (2013.01); *H01L 23/49541* (2013.01); *H01L 23/49562* (2013.01); *H01L 23/49568* (2013.01); *H01L 23/49575* (2013.01); *H01L 24/48* (2013.01); *H01L 24/73* (2013.01); *H01L 25/072* (2013.01); *H01L 25/162* (2013.01); *H01L 25/165* (2013.01); *H01L 25/18* (2013.01); *H01L 25/50* (2013.01); *H01L 21/565* (2013.01); *H01L 23/296* (2013.01); *H01L 23/3107* (2013.01); *H01L 23/49582* (2013.01); *H01L 24/45* (2013.01); *H01L 2023/405* (2013.01); *H01L 2023/4031* (2013.01); *H01L 2023/4068* (2013.01); *H01L 2023/4087* (2013.01); *H01L 2224/0603* (2013.01); *H01L 2224/45124* (2013.01); *H01L 2224/45144* (2013.01); *H01L 2224/48101* (2013.01); *H01L 2224/48108* (2013.01); *H01L 2224/48137* (2013.01); *H01L 2224/48139* (2013.01); *H01L 2224/48175* (2013.01); *H01L 2224/48247* (2013.01); *H01L 2224/4903* (2013.01); *H01L 2224/49112* (2013.01); *H01L 2224/49171* (2013.01); *H01L 2224/49505* (2013.01); *H01L 2224/73265* (2013.01); *H01L 2224/92247* (2013.01); *H01L 2924/1203* (2013.01); *H01L 2924/13055* (2013.01); *H01L 2924/13091* (2013.01); *H01L 2924/181* (2013.01)

(58) Field of Classification Search
CPC . H01L 25/072; H01L 23/36; H01L 23/49575; H01L 23/49541; H01L 25/18; H01L 2224/48139; H01L 2924/181; H01L 2224/48247; H01L 23/49582; H01L 23/3107; H01L 21/56; H01L 2224/0603; H01L 2224/4903; H01L 2224/49171; H01L 2224/92247; H01L 2224/48175; H01L 2924/13055; H01L 2924/13091; H01L 2924/1203; H01L 2224/73265; H01L 2023/4031; H01L 2023/405; H01L 2023/4068; H01L 2023/4087; H01L 2224/45144; H01L 2224/45124; H01L 2224/49505; H01L 23/296; H01L 2224/48101; H01L 2224/48108; H01L 2224/48137; H01L 2224/49112; H01L 24/49; H01L 2224/49109
See application file for complete search history.

(56) References Cited

U.S. PATENT DOCUMENTS

| | | |
|---|---|---|
| 2009/0218666 A1 | 9/2009 | Yang |
| 2009/0243078 A1 | 10/2009 | Lim et al. |
| 2012/0236503 A1 | 9/2012 | Asada et al. |

* cited by examiner

METHOD OF MANUFACTURING SEMICONDUCTOR MODULE AND SEMICONDUCTOR MODULE

CROSS-REFERENCE TO RELATED APPLICATION

The present application claims priority from. Japanese Patent Application No. 2017-128640 filed on Jun. 30, 2017, the content of which is hereby incorporated by reference into this application.

TECHNICAL FIELD OF THE INVENTION

The present invention relates to, for example, a method of manufacturing a power semiconductor module (Intelligent Power Module (IPM), electronic device, etc.) and a structure of the power semiconductor module.

BACKGROUND OF THE INVENTION

Japanese Patent Application Laid-Open Publication No. 2012-195492 (Patent Document 1) describes a technique relating to a power semiconductor module having a Metal Oxide Semiconductor Field Effect Transistor (MOSFET) and its mounting structure. This power semiconductor module includes a first metal substrate with a power semiconductor element mounted thereon and a second metal substrate without a power semiconductor element mounted thereon, and has such a structure that a back surface opposite to a power semiconductor element mounting surface of the first metal substrate is exposed outside a resin package to form a heat dissipation surface.

Japanese Patent Application Laid-Open Publication No. 2005-109100 (Patent Document 2) describes a semiconductor device having a power chip and its manufacturing technique. More specifically, in assembly of a semiconductor device described in the Patent Document 2, this document discloses a resin molding technique of placing a resin sheet attached with a metal foil on an inner bottom surface of a resin sealing mold.

SUMMARY OF THE INVENTION

In a power type semiconductor module, in a full mold type structure having a chip mounting portion on which the semiconductor chip is mounted is not exposed from a sealing body, heat dissipation from the chip mounting portion to the outside of the sealing body is poor. Therefore, the present inventors have studied a structure in a semiconductor module having a plurality of chip mounting portions on which a plurality of semiconductor chips are mounted, the structure having some of the plurality of chip mounting portions exposed to the outside of the sealing body.

According to the studies made by the present inventors, when a heat sink is mounted on the semiconductor module having the structure having some of the plurality of chip mounting portions exposed to the outside of the sealing body, there is a possibility of short circuit in some of the plurality of chip mounting portions through the heat sink. Therefore, in consideration of reliability of the semiconductor module, the present inventors have found issues to be improved.

Other object and novel characteristics will be apparent from the description of the present specification and the accompanying drawings.

A method of manufacturing a semiconductor module according to an embodiment seals a first semiconductor chip, a second semiconductor chip, a part of a first chip mounting portion, and a part of a second chip mounting portion so that each of a second surface of the first chip mounting portion and a second surface of the second chip mounting portion is exposed from a second surface of a sealing body. After the sealing, an insulating layer is bonded onto the second surface of the sealing body so as to cover the second surface of the first chip mounting portion and the second surface of the second chip mounting portion, and then, a heat transfer material layer is bonded onto the insulating layer. Here, in a plan view, a region of the heat transfer material layer is included in a region of the insulating layer.

Another method of manufacturing a semiconductor module according to an embodiment seals a first semiconductor chip, a second semiconductor chip, a part of a first chip mounting portion, and a part of a second chip mounting portion so that each of a second surface of the first chip mounting portion and a second surface of the second chip mounting portion is exposed from a second surface of a sealing body. After the sealing, a sheet structural body is bonded onto the second surface of the sealing body so that an insulating layer having the sheet structural body formed by bonding the insulating layer and a heat transfer material layer covers the second surface of the first chip mounting portion and the second surface of the second chip mounting portion. In a plan view, a region of the heat transfer material layer having the sheet structural body is included in a region of the insulating layer.

A semiconductor module according to an embodiment includes a first surface and a second surface, and includes a sealing body sealing a first semiconductor chip, a second semiconductor chip, a part of a first chip mounting portion, and a part of a second chip mounting portion so that each of a second surface of the first chip mounting portion and a second surface of the second chip mounting portion is exposed from the second surface. Further, the semiconductor module includes an insulating layer bonded on the second surface of the sealing body so as to cover the second surface of the first chip mounting portion and the second surface of the second chip mounting portion and a heat transfer material layer laminated and bonded on the insulating layer. In a plan view, a region of the heat transfer material layer is included in a region of the insulating layer.

According to the embodiment, reliability of the semiconductor module can be improved.

BRIEF DESCRIPTIONS OF THE DRAWINGS

DESCRIPTIONS OF THE PREFERRED EMBODIMENTS

Figure 1:
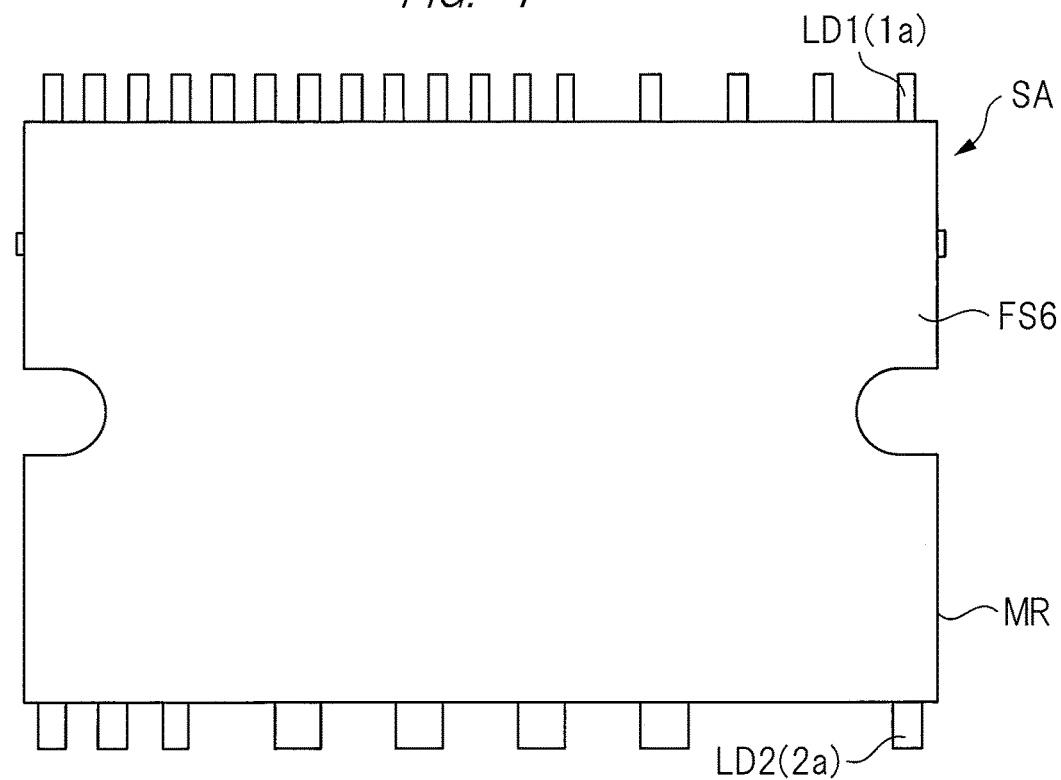
FIG. 1 is a plan view showing a structure of a semiconductor module of a first embodiment.

In the following embodiments, the description of the same or similar components will not be repeated in principle unless particularly required.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, or others), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

When expressions such as "having A" or "including A" are mentioned for components and others in the following embodiments, it is needless to say that other components than A is not eliminated unless otherwise stated so that the component is particularly described as only the component or others. Similarly, in the embodiments described below, when the shape of the components, positional relation thereof, or others are mentioned, the substantially approximate and similar shapes or others are included therein unless otherwise stated or except the case where it is conceivable that they are apparently excluded in principle. The same goes for the numerical value and the range described above.

Hereinafter, embodiments of the present invention will be described in detail based on the accompanying drawings. Note that components having the same function are denoted by the same reference symbols throughout all the drawings for describing the embodiment, and the repetitive description thereof will be omitted. Further, hatching is added in some cases even in a plan view so as to make the drawings easy to see.

<Explanation of Terms>

In the present specification, a "semiconductor module" is a structural body including a semiconductor component (semiconductor chip) and an external connection terminal electrically connected to the semiconductor component, and means a structural body in which the semiconductor component is covered with a sealing body. In particular, the "semiconductor module" is configured to be electrically connectable to an external device by an external connection terminal.

In the present specification, a "power transistor" means an aggregate of unit transistors achieving a function of a unit transistor even in a larger current than an allowable current of the unit transistor by parallel connection of a plurality of unit transistors (cell transistors) (for example, parallel connection of several thousands to tens of thousands of unit transistors). For example, when the unit transistor functions as a switching element, the "power transistor" becomes a switching element applicable to even the larger current than the allowable current of the unit transistor. As the "power transistor" that constitutes the switching element, an Insulated Gate Bipolar Transistor (IGBT) and a power MOSFET can be exemplified. In the present specification, the term "power transistor" is used as a phrase indicating a broader concept including, for example, both the "power MOSFET" and the "IGBT".

First Embodiment

<Structure of Semiconductor Module>

Figure 2:
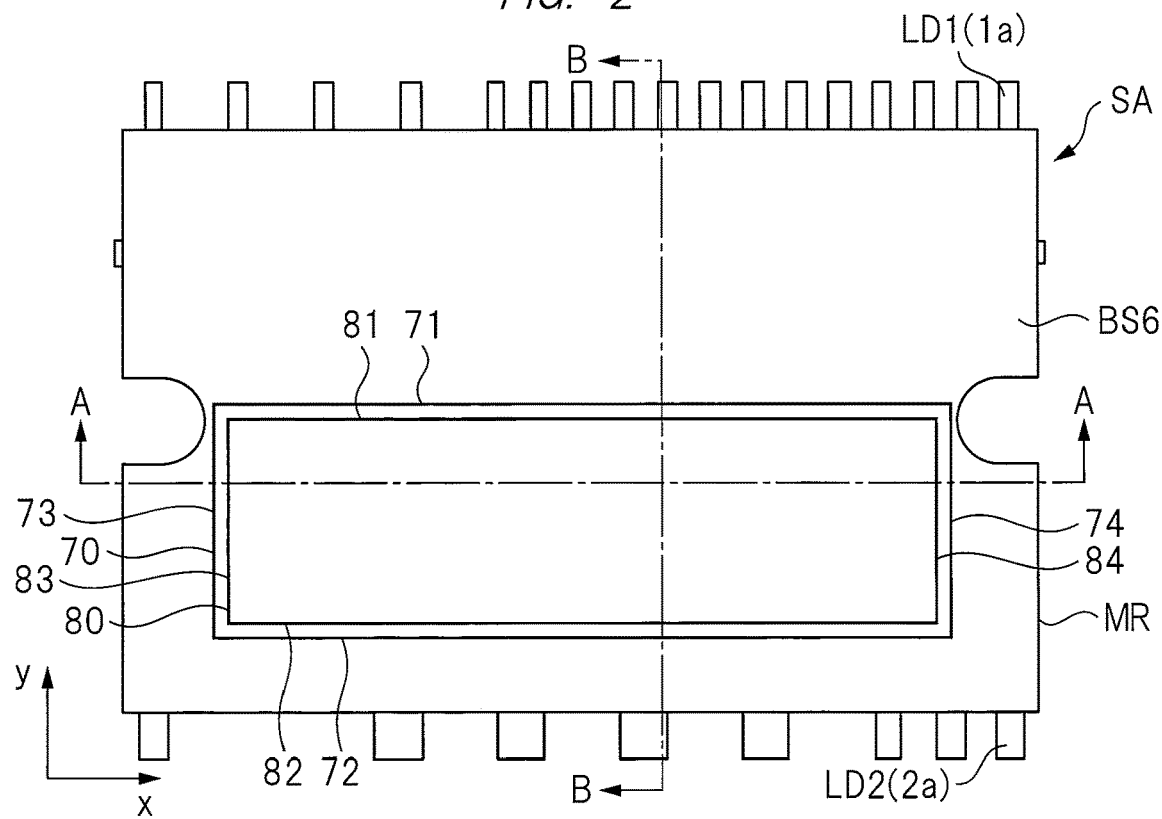
FIG. 2 is a back view showing the structure of the semiconductor module of FIG. 1.
Figure 3:
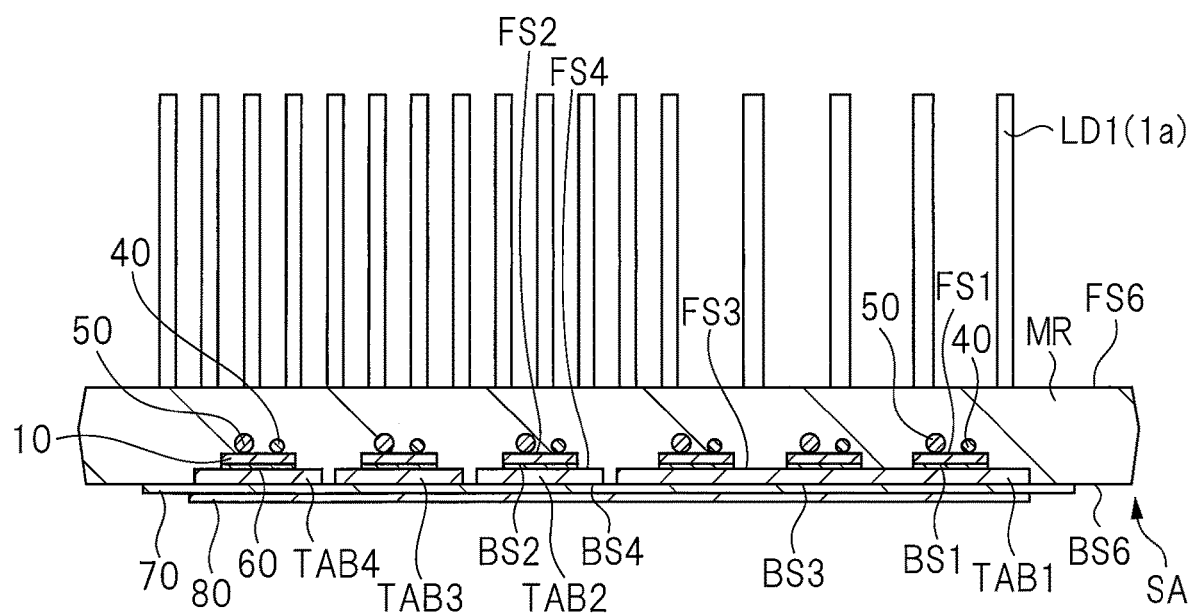
FIG. 3 is a cross-sectional view showing a structure taken along a line A-A of FIG. 2.
Figure 4:
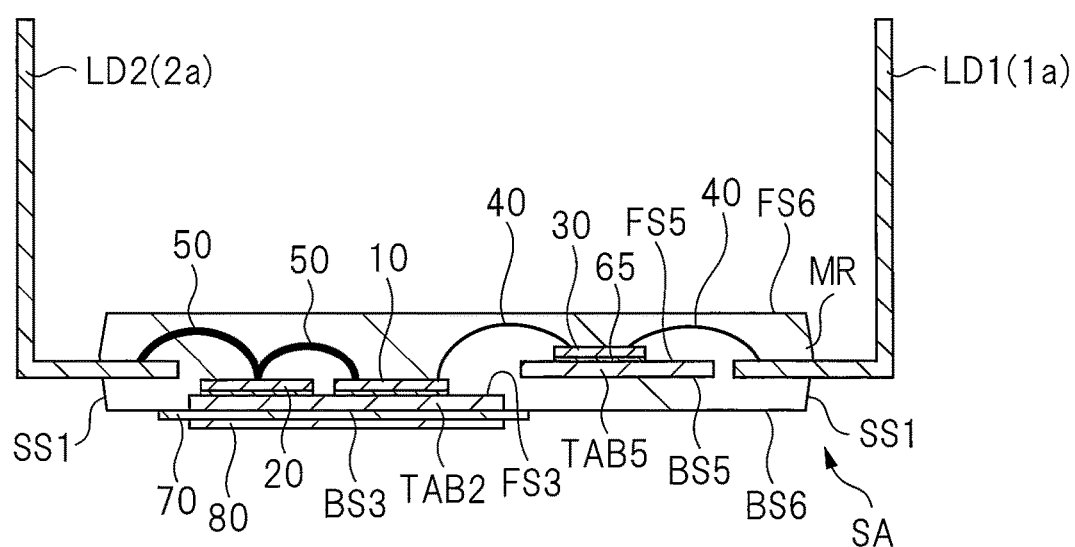
FIG. 4 is a cross-sectional view showing a structure taken along a line B-B of FIG. 2.
Figure 5:
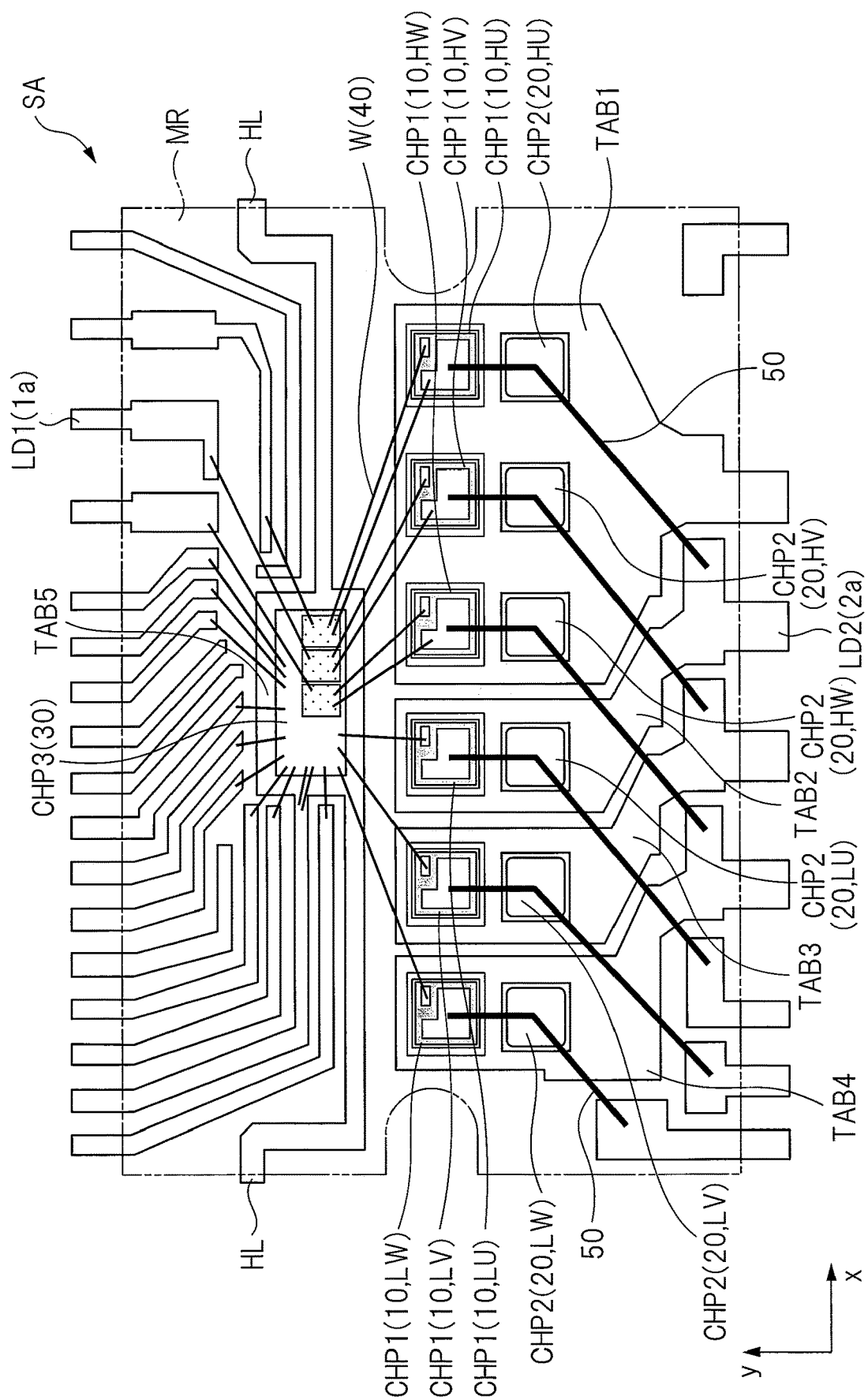
FIG. 5 is a transparent plan view showing an internal structure of the semiconductor module of FIG. 1.

FIG. 1 is a plan view showing a structure of a semiconductor module of the first embodiment, FIG. 2 is a back view showing the structure of the semiconductor module of FIG. 1, FIG. 3 is a cross-sectional view showing a structure taken along a line A-A of FIG. 2, FIG. 4 is a cross-sectional view showing a structure taken along a line B-B of FIG. 2, and FIG. 5 is a transparent plan view showing an internal structure of the semiconductor module of FIG. 1.

The semiconductor module according to the first embodiment shown in FIG. 1 to FIG. 5 is used in, for example, a driving circuit of a three-phase induction motor used for an air conditioner or others. More specifically, the drive circuit includes an inverter circuit, and this inverter circuit is a circuit having a function of converting a direct-current power into an alternate-current power.

The present first embodiment will explain a case of the IGBT as the power transistor embedded in the semiconductor module, in which a plurality of IGBT chips are mounted in the semiconductor module. When it is unnecessary to distinguish a plurality of semiconductor chips formed with IGBTs constituting a three-phase inverter circuit from one another, note that they are simply referred to as "IGBT chip 10" in the present specification. Similarly, when it is unnecessary to distinguish a plurality of semiconductor chips formed with diodes constituting a three-phase inverter circuit from one another, note that they are simply referred to as "diode chip 20" in the present specification.

As shown in FIG. 3 to FIG. 5, a schematic configuration of a semiconductor module SA according to the present first embodiment will be described so as to include a plurality of IGBT chips 10 each embedding a power transistor, a plurality of diode chips 20 each having a diode, and a control chip 30 controlling the operation of each of the plurality of IGBT chips 10. While the plurality of diode chips 20 and the plurality of IGBT chips 10 including a first semiconductor chip and a second semiconductor chip are mounted on any of chip mounting portions TAB1 to TAB4 through a conductive bonding material 60, the control chip 30 is mounted on a chip mounting portion TAB5 through a nonconductive bonding material 65.

As shown in FIG. 5, the control chip 30 and the IGBT chip 10 are electrically connected by a gold wire 40, and the IGBT chip 10 and the diode chip 20 are electrically connected by an aluminum wire 50 having a larger wire diameter than that of the gold wire 40. Here, while the gold wire 40 is a conductive member containing gold (Au) as a main component, the aluminum wire 50 is a conductive member containing aluminum (Al) as a main component.

A plurality of leads LD1 and leads LD2 are provided around the chip mounting portions TAB1 to TAB5. The plurality of leads LD1 are arranged around the chip mounting portion TAB5 while the plurality of leads LD2 are arranged around the chip mounting portions TAB1 to TAB4. While the control chip 30 and the plurality of leads LD1 are electrically connected by the gold wires 40, respectively, the diode chip 20 and the plurality of leads LD2 are electrically connected by the aluminum wires 50, respectively. Note that the plurality of leads LD2 include a lead integrally connected to the chip mounting portion TAB2 and a lead separate from the chip mounting portion TAB. More specifically, the IGBT chip 10 mounted on the chip mounting portion TAB1 is electrically connected to any one of the chip mounting portions TAB through the diode chip 20 or the aluminum wire 50. On the other hand, the IGBT chip 10 mounted on each of the chip mounting portions TAB2 to TAB4 is electrically connected to any single lead LD2 through the diode chip 20 or the aluminum wire 50.

The plurality of IGBT chips 10, the plurality of diode chips 20, the control chip 30, a part of each of the chip mounting portions TAB1 to TAB4, the chip mounting portion TAB5, the plurality of gold wires 40, the plurality of aluminum wires 50, a part of each of the plurality of leads LD1 (inner portion) and a part of each of the plurality of leads LD2 (inner portion) are sealed by the sealing body MR made of resin. Note that the sealing body MR has a front surface (third main surface) FS6, a back surface (third back surface) BS6 opposite to the front surface FS6, and a side surface SS1 located between the front surface FS6 and the back surface BS6 as shown in FIG. 4.

As shown in FIG. 1, FIG. 2, FIG. 4, and FIG. 5, an outer lead 1a which is an outer portion of each of the plurality of leads LD1 is exposed from a portion of the side surface SS1 of the sealing body MR, the portion being closer to the chip mounting portion TAB5. On the other hand, an outer lead 2a which is an outer portion of each of the plurality of leads LD2 is exposed from a portion of the side surface SS1 of the sealing body MR, the portion being closer to each of the chip mounting portions TAB1 to TAB4. As shown in FIG. 4, each of the plurality of outer leads 1a and 2a is bent toward the front surface FS6 of the sealing body MR.

In the sealing body MR, each back surface of the chip mounting portions TAB1 to AB4 is exposed from the back surface BS6. However, the back surface BS5 of the chip mounting portion TAB5 is not exposed from the back surface BS6 of the sealing body MR. That is, only the chip mounting portion TAB5 is buried inside the sealing body MR.

As shown in FIG. 2 to FIG. 4, in the semiconductor module SA according to the present first embodiment, an insulating layer 70 is joined (bonded) to the back surface BS6 of the sealing body MR. More specifically, the insulating layer 70 is joined (bonded) to the back surface BS6 of the sealing body MR so as to cover each back surface (exposed portion) of the chip mounting portions TAB1 to TAB4 exposed from the back surface BS6. Further, the semiconductor module SA has a thin film-form TIM (Thermal Interface Material, thermal transfer material, thermal interface material) layer 80 laminated and joined (bonded) onto the insulating layer 70.

As shown in FIG. 2, in a plan view (back view) of the semiconductor module SA, a region of the TIM layer 80 is included in a region of the insulating layer 70. That is, the semiconductor module SA has such a configuration that the insulating layer 70 is larger than in the TIM layer 80 in a size of a plan view so that the insulating layer 70 protrudes from each of four sides of the rectangular TIM layer 80. As relations between the insulating layer 70 and the TIM layer 80 in a size and a position, there is also a case in which an edge of the region of the TIM layer 80 is in contact with an edge of the region of the insulating layer 70 although not illustrated. However, in order to secure a creepage distance L2 shown in FIG. 50 to be described later, the relations between the insulating layer 70 and the TIM layer 80 in the size and the position as shown in FIG. 2 are preferable. More specifically, in a plan view, the insulating layer 70 has a first side 71 extending in a first direction (x direction), a second side 72 on the opposite side of the first side 71, a third side 73 extending in a second direction (y direction) crossing the first direction (x direction), and a fourth side 74 on the opposite side of the third side 73. The TIM layer 80 has a fifth side 81 extending in the first direction (x direction), a sixth side 82 on the opposite side of the fifth side 81, a seventh side 83 extending in the second direction (y direction, and an eighth side 84 on the opposite side of the seventh side 83. In a plan view, the fifth side 81 of the TIM layer 80 is located between the first side 71 of the insulating layer 70 and the second side 72 of the insulating layer 70, and the sixth side 82 of the TIM layer 80 is located between the second side 72 of the insulating layer 70 and the fifth side 81 of the TIM layer 80. Further, the seventh side 83 of the TIM layer 80 is located between the third side 73 of the insulating layer 70 and the fourth side 74 of the insulating layer 70, the eighth side 84 of the TIM layer 80 is located between the fourth side 74 of the insulating layer 70 and the seventh side 83 of the TIM layer 80, and the insulating layer 70 and the TIM layer 80 preferable have the above-described relations in the size and the position.

The semiconductor module SA of the present first embodiment is obtained by forming the sealing body MR by resin molding in its assembly, and then, bonding the insulating layer 70 and the TIM layer 80.

Here, the TIM layer 80, the insulating layer 70, and the lead frame (see FIG. 19 described later) 90 will be described. First, the TIM layer 80 is a thin film layer having a thermal transfer function. Then, a stress generated by a difference in a thermal expansion coefficient between upper and lower members of the TIM layer 80 is moderated by the TIM layer. In other words, the TIM layer 80 flexibly follows thermal deformation of the members arranged above and below the TIM layer 80. Further, the TIM layer also has a function of absorbing irregularity on a joint surface between the upper and lower members. The TIM layer 80 is, for example, a resin sheet material containing carbon particles, a silicone resin layer containing metal or ceramic, a heat dissipating grease layer or others. Further, a thickness of the TIM layer 80 is, for example, 0.15 to 0.5 mm. Further, a thermal conductivity of the TIM layer 80 is, for example, 40 to 90 W/mk.

The insulating layer 70 is, for example, an insulating resin sheet made of a ceramic material or an insulating resin material, and has a thickness of, for example, 85 µm or 210 µm. In the case of the insulating layer 70 having the thickness of 85 µm, its thermal conductivity is, for example, 3 W/mk. Further, in the case of the insulating layer 70 having the thickness of 210 µm, its thermal conductivity is, for example, 11 W/mk.

The lead frame 90 is a plate material made of, for example, a copper-based alloy, an iron-based alloy, or others, and has a thickness of, for example, 0.5 mm. In that case, each thickness of the leads LD1 and LD2 and the chip mounting portions TAB1 to TAB5 including the chip mounting portion (first chip mounting portion) TAB1 and the chip mounting portion (second chip mounting portion) TAB2 is also 0.5 mm. Therefore, each thickness of the chip mounting portions TAB1 to TAB5 is equal to or larger than each thickness of the insulating layer 70 and the TIM layer 80.

Next, with reference to FIG. 5, a structure obtained by transparently viewing the sealing body MR of the semiconductor module SA of the present first embodiment will be described. Here, the transparent structure of the semiconductor module SA that achieves a three-phase inverter circuit will be described.

In the semiconductor module SA, the chip mounting portions TAB1 to TAB4 are arranged so as to be aligned in the x direction, and the chip mounting portion TAB5 is arranged on the upper side (y direction side) of the chip mounting portions TAB1 to TAB4. On the chip mounting portion TAB1, a semiconductor chip CHP1 (IGBT chip 10, HU) formed with a high-side IGBT for a U phase, a semiconductor chip CHP1 (IGBT chip 10, HV) formed with a high-side IGBT for a V-phase, and a semiconductor chip CHP1 (IGBT chip 10, HW) formed with a high-side IGBT for a W phase are mounted. On the chip mounting portion TAB1, semiconductor chips CHP2 (diode chip 20, HU), CHP2 (diode chip 20, HV), and CHP2 (diode chip 20, HW) each formed with a diode are also mounted.

Similarly, on the chip mounting portion TAB2, a semiconductor chip CHP1 (IGBT chip 10, LU) formed with a low side IGBT for the U phase and a semiconductor chip CHP2 (diode chip 20, LU) formed with a diode are mounted. On the chip mounting portion TAB5, a semiconductor chip CHP1 (IGBT chip 10, LV) formed with a low side IGBT for the V phase and a semiconductor chip CHP2 (diode chip 20, LV) formed with a diode are mounted. Further, on the chip mounting portion TAB4, a semiconductor chip CHP1 (IGBT chip 10, LW) formed with a low side IGBT for the W phase and a semiconductor chip CHP2 (diode chip 20, LW) formed with a diode are mounted.

Meanwhile, on the chip mounting portion TAB5 connected to a conductive member (suspension lead) HL, a semiconductor chip CHP3 (control chip 30) formed collectively with a gate control circuit of a three-phase inverter circuit is mounted.

In this case, the semiconductor chip CHP3 (control chip 30) and these six IGBT chips 10 are electrically connected to each other by the wires W (gold wires 40), respectively. At this time, the semiconductor chip CHP3 is arranged at the center in the x direction in which these six IGBT chips 10 are aligned. In other words, the semiconductor chip CHP3 (control chip 30) is arranged on a virtual line (not shown) along the y direction passing between the third IGBT chip 10 counted from left on a view facing the drawing and the fourth IGBT chip 10 counted from left on the view facing the drawing out of these six IGBT chips 10 arranged along a long side (a side extending along the x direction shown in FIG. 5) of the sealing body MR. As a result, each of the six IGBT chips 10 arranged in the x direction and one semiconductor chip CHP3 (control chip 30) arranged at the center portion in the x direction are electrically connected to each other through the gold wire 40. By such arrangement, gate wiring lengths from the control chip 30 to the IGBT chips 10 can be almost made equal to each other, which leads to improvement in the reliability of the semiconductor module 100.

The semiconductor chip CHP3 (control chip 30) is electrically connected to each of the plurality of leads LD1 arranged on one side surface SS1 of the sealing body MR through the gold wire W (gold wire 40). Further, each of the six IGBT chips 10 and each of the six diode chips 20 are electrically connected to each other through an aluminum wire 50 having a larger wire diameter than that of the gold wire 40. Further, each of the six diode chips 20 and each of the plurality of leads LD2 arranged on the other side surface SS1 of the sealing body MR are electrically connected to each other through the aluminum wire 50.

Note that the chip mounting portion TAB5 on which the semiconductor chip CHP3 (control chip 30) is mounted is supported by two suspended leads HL.

Figure 6:
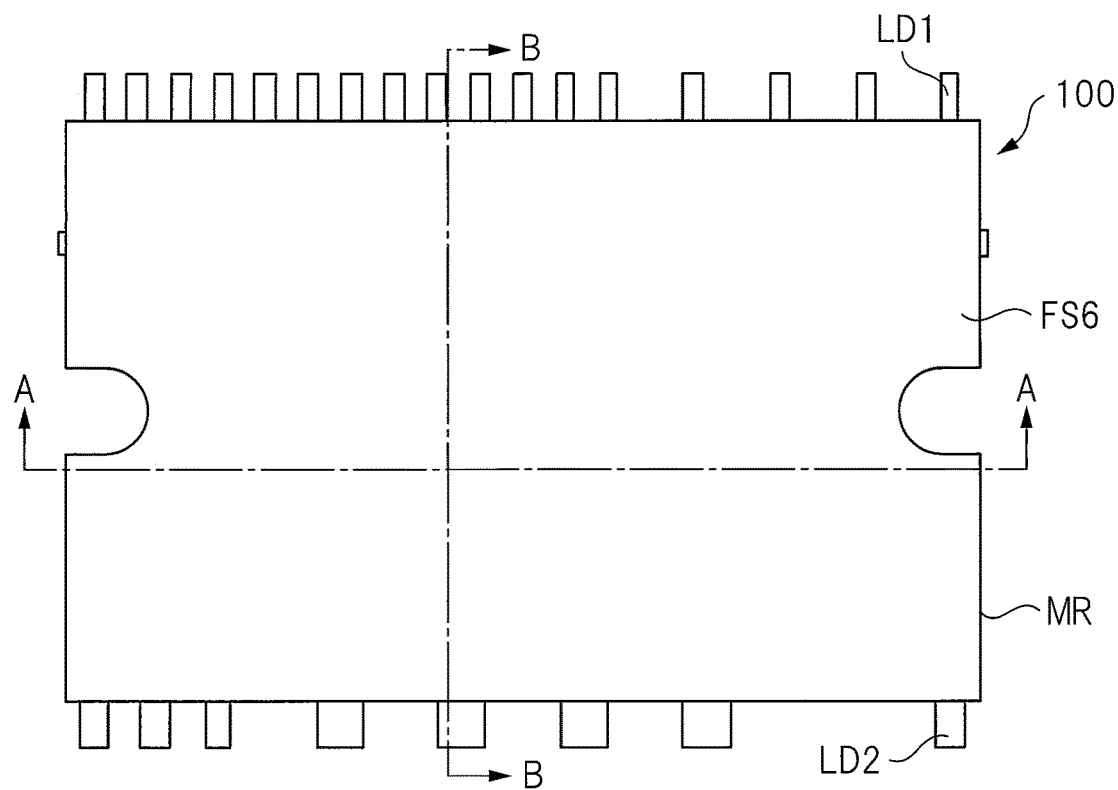
FIG. 6 is a plan view showing a structure of a semiconductor module having been compared and studied by the present inventors.
Figure 7:
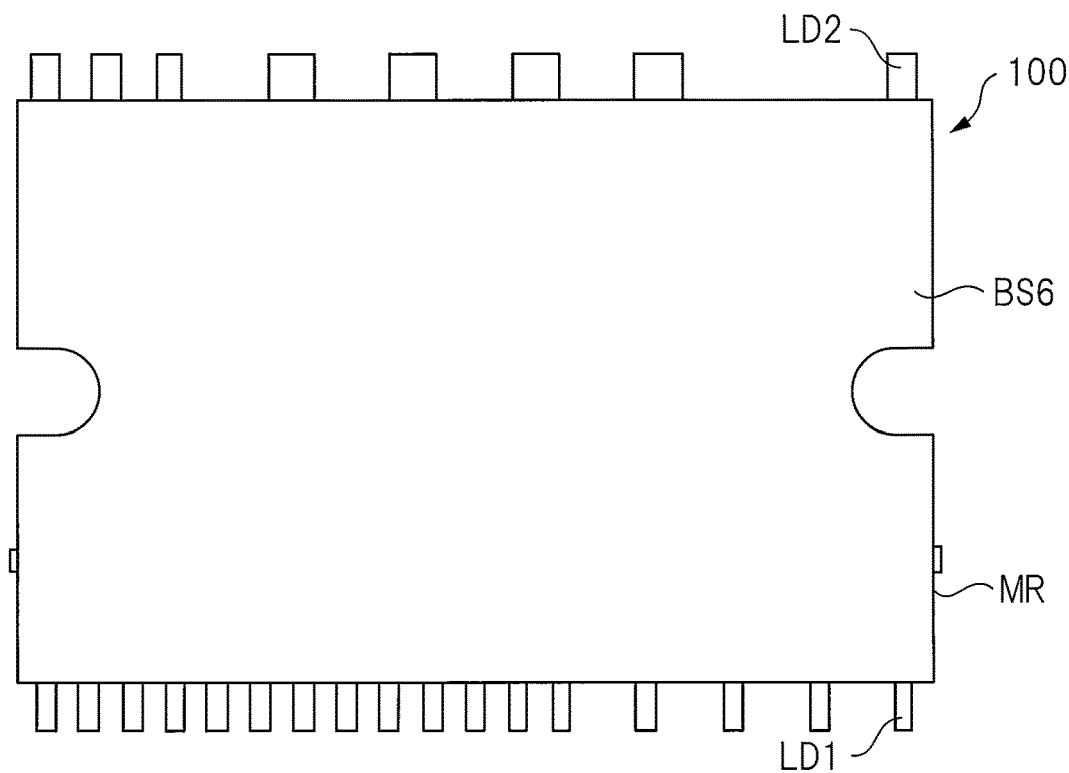
FIG. 7 is a back view showing the structure of the semiconductor module of FIG. 6.
Figure 8:
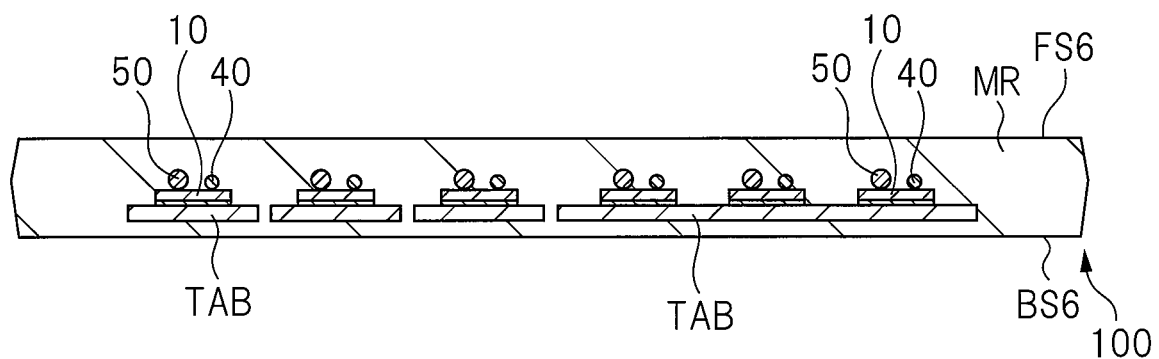
FIG. 8 is a cross-sectional view showing the structure taken along the a line A-A of FIG. 6.
Figure 9:
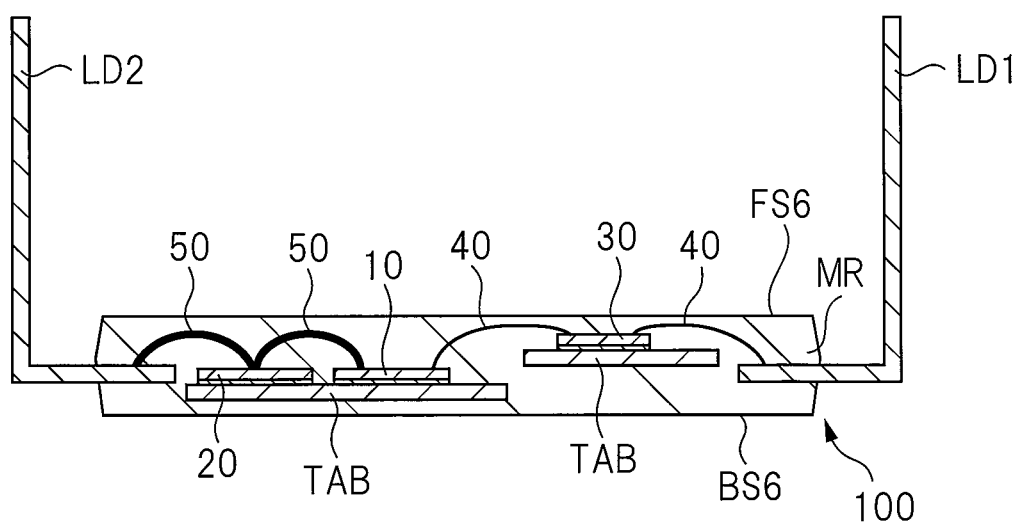
FIG. 9 is a cross-sectional view showing the structure taken along the a line B-B of FIG. 6.

Next, with reference to FIG. 6 to FIG. 9, the details of the problem of the present invention will be described while exemplifying a semiconductor module which has been compared and studied by the present inventors. FIG. 6 is a plan view showing a structure of the semiconductor module which has been compared and studied by the present inventors, FIG. 7 is a back view showing the structure of the semiconductor module of FIG. 6, FIG. 8 is a cross-sectional view showing a structure taken along a line A-A of FIG. 6, and FIG. 9 is a cross-sectional view showing a structure taken along a line B-B of FIG. 6.

The present inventors have studied a semiconductor module 100 of a full mold type shown in FIG. 6 to FIG. 9. The semiconductor module 100 of the full mold type has a structure in which the embedded semiconductor chip, the chip mounting portion, the plurality of wires, and the part (inner portion) other than the outer portion of the lead are covered with the sealing body MR. That is, the semiconductor module 100 has a structure in which the chip mounting portion TAB is entirely covered with resin.

When the semiconductor chip (IGBT chip 10) including the power transistors such as the IGBT and the MOSFET is embedded in the above-described semiconductor module 100, these semiconductor chips become heat generation sources. At that time, in the semiconductor module 100 of the full mold type as shown in FIG. 6 to FIG. 9, the chip mounting portion TAB mounting the semiconductor chip is covered with the resin so as not to be exposed from the sealing body MR, and therefore, heat dissipation from the chip mounting portion TAB to the outside of the package (sealing body MR) is poor.

In such a structure, it is conceivable to improve the heat dissipation by increasing a thermal capacity of the chip mounting portion TAB. However, because of the poor heat dissipation to the outside of the package (sealing body MR), it is required to increase the size of the semiconductor chip. As a result, the semiconductor module 100 cannot be downsized, and cost reduction cannot be achieved, either.

Therefore, the present inventors have studied a structure in which the back surface of each of a plurality of chip mounting portions TAB on which the plurality of semiconductor chips are mounted, respectively, is exposed to outside of the package (sealing body MR) in order to improve the heat dissipation.

However, when the semiconductor module that exposes the back surface of the chip mounting portion TAB from the back surface of the sealing body MR is mounted on a heatsink, a mounting structure is as attaching the back surface side of the sealing body MR to the heat sink. Therefore, by the studies of the present inventors, it has been found that there are a possibility of short circuit through the heat sink in a part of each of the plurality of chip mounting portions TAB exposed from the back surface of the sealing body MR, and a possibility of difficulty in securement of a withstanding-voltage distance between the heat sink and each exposed part of the chip mounting portions TAB.

Next, the details of the semiconductor module SA according to the present first embodiment will be explained.

Figure 10:
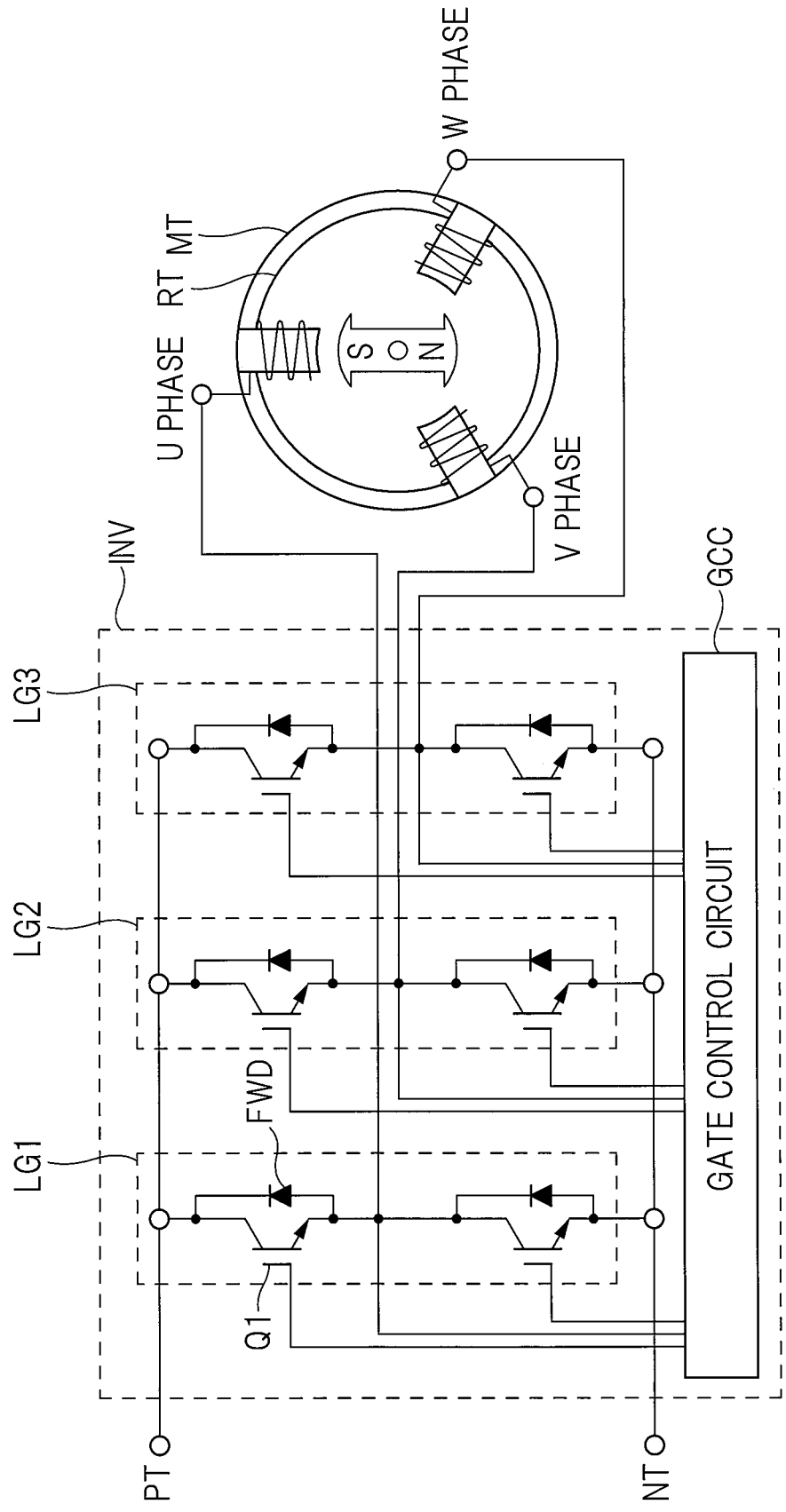
FIG. 10 is a circuit diagram showing a configuration of a motor circuit including a three-phase induction motor and an inverter circuit according to the semiconductor module of FIG. 1.

First, a configuration example of a three-phase inverter circuit in the semiconductor module SA according to the present first embodiment will be described. FIG. 10 is a circuit diagram showing a configuration of a motor circuit including a three-phase induction motor and an inverter circuit in the semiconductor module of FIG. 1.

In FIG. 10, the motor circuit has a three-phase induction motor MT and an inverter circuit INV. The three-phase induction motor MT is configured to be driven by voltages with three phases having different phases from one another. More specifically, in the three-phase induction motor MT, a rotating magnetic field is generated around a rotor RT which is a conductor, by using a three-phase alternating current called U phase, V phase, and W phase whose phases are shifted by 120 degrees from one another. In this case, a magnetic field rotates around the rotor RT. This means that a magnetic flux crossing the rotor RT which is the conductor changes. As a result, electromagnetic induction occurs in the rotor RT which is the conductor so that an inductive current flows in the rotor RT. Then, the flowing of the inductive current in the rotating magnetic field means that a force is applied to the rotor RT by Fleming's left hand rule, and the rotor RT is rotated by this force. Thus, in the three-phase induction motor MT, it can be seen that the rotor RT can be rotated by using the three-phase alternating current. That is, in the three-phase induction motor MT, the three-phase alternating current is required. Therefore, in the motor circuit, an alternate-current power is supplied to the induction motor by using the inverter circuit INV that creates an alternating current from a direct current. In the present first embodiment, three types (U phase, V phase, and W phase) of an alternate-current power are generated in one inverter circuit INV, and are supplied to the three-phase induction motor.

The configuration example of the inverter circuit INV will be described below. As shown in FIG. 10, the inverter circuit INV according to the present first embodiment is provided with, for example, IGBTs Q1 and diodes FWD so as to correspond to the three phases, respectively. That is, in the inverter circuit INV according to the present first embodiment, a switching element as a component of the inverter circuit INV is achieved by, for example, a configuration in which the IGBT Q1 and the diode FWD are connected in anti-parallel as shown in FIG. 10.

More specifically, each of an upper arm and a lower arm of a first leg LG1, an upper arm and a lower arm of a second leg LG2, and an upper arm and a lower arm of a third leg LG3 is configured by a component in which the IGBT Q1 and the diode FWD are connected in anti-parallel.

In other words, in the inverter circuit INV according to the present first embodiment, the IGBT Q1 and the diode FWD are connected in anti-parallel between a positive potential terminal PT and each phase (U phase, V phase, or W phase) of the three-phase induction motor MT, and the IGBT Q1 and the diode FWD are also connected in anti-parallel between each phase of the three-phase induction motor MT and a negative potential terminal NT. That is, two IGBTs Q1 and two diodes FWD are provided for each single phase. As a result, the inverter circuit INV according to the present first embodiment totally has six IGBTs Q1 and six diodes FWD. A gate control circuit GCC is connected to a gate electrode of each IGBT Q1, and the switching operation of the IGBT Q1 is controlled by the gate control circuit GCC. In the inverter circuit INV configured as described above, the switching operation of the IGBT Q1 is controlled by the gate control circuit GCC, so that the direct-current power is converted into the three-phase alternate-current power, and the three-phase alternate-current power is supplied to the three-phase induction motor MT.

Next, the necessity of the diode will be described.

As described above, in the inverter circuit INV according to the present first embodiment, the IGBT Q1 is used as a switching element, and the diode FWD is provided so as to be connected in anti-parallel to the IGBT Q1. The IGBT Q1 functioning as the switching element is necessary from a simple viewpoint of achieving the switching function by the switching element. But, it is considered that there is no need to provide the diode FWD. Regarding this point, when an inductance is included in a load connected to the inverter circuit INV, it is necessary to provide the diode FWD. A reason for this will be described below.

When the load is a pure resistance not including the inductance, the diode FWD is unnecessary because of no reflux energy. However, when a circuit including the inductance such as a motor is connected to the load, there is a flow mode of a load current in a direction opposite to a direction in a turning-on switch. That is, when the inductance is included in the load, energy may return from the inductance of the load to the inverter circuit INV (current may flow backward).

At this time, since the IGBT Q1 does not singularly have a function to allow this reflux current to flow, it is necessary to connect the diode FWD in anti-parallel to the IGBT Q1. That is, if the inductance is included in the load as in the motor control in the inverter circuit INV, an energy ($\frac{1}{2}LI^2$) stored in the inductance must be released when the IGBT Q1 is turned off. However, the IGBT Q1 cannot singularly flow the reflux current for releasing the energy stored in the inductance. Therefore, in order to reflux the electric energy stored in the inductance, the diode FWD is connected in anti-parallel to the IGBT Q1. That is, the diode FWD has a function of causing the reflux current to flow for releasing the electric energy stored in the inductance. From the above, in the inverter circuit connected to the load including the inductance, it is understood that it is necessary to provide the diode FWD in anti-parallel to the IGBT Q1 which is the switching element. This diode FWD is called a freewheel diode.

Next, the structure of the IGBT will be described.

Figure 11:
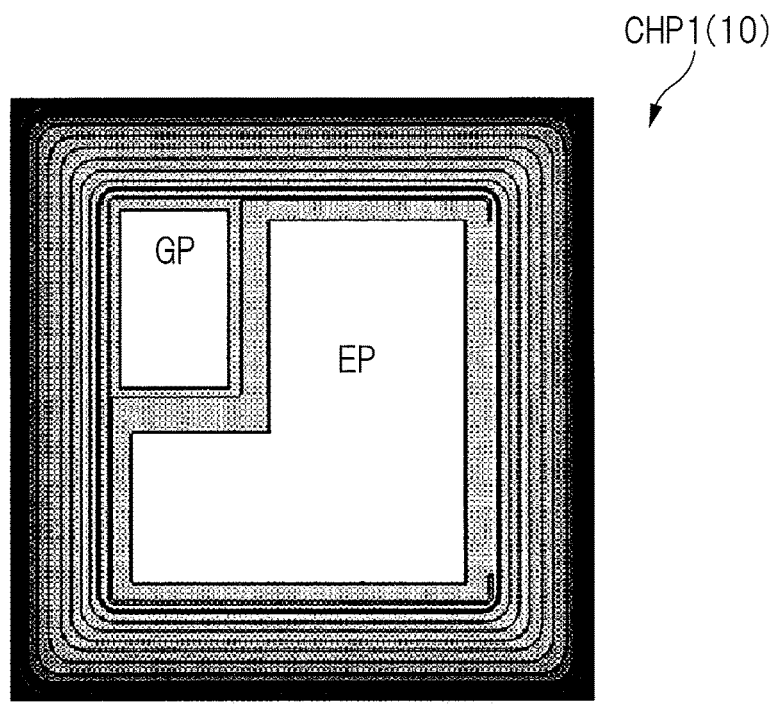
FIG. 11 is a plan view showing an external shape of a semiconductor chip in which an IGBT is formed in the semiconductor module of FIG. 1.

FIG. 11 is a plan view showing an external shape of a semiconductor chip in which an IGBT is formed in the semiconductor module SA of FIG. 1.

Each structure of the IGBT Q1 and the diode FWD configuring the inverter circuit INV according to the present first embodiment will be described with reference to the drawings. In the inverter circuit INV according to the first embodiment, the IGBT Q1 and the diode FWD are included.

In FIG. 11, a main surface (front surface) of the semiconductor chip CHP1 is shown. As shown in FIG. 11, a planar shape of the semiconductor chip CHP1 according to the present first embodiment is, for example, a square shape. An emitter electrode pad EP and a gate electrode pad GP are formed on the front surface of the square-shaped semiconductor chip CHP1. On the other hand, although not shown in FIG. 11, a collector electrode is formed on a back surface opposite to the front surface of the semiconductor chip CHP1.

Next, the device structure of the IGBT will be described.

Figure 12:
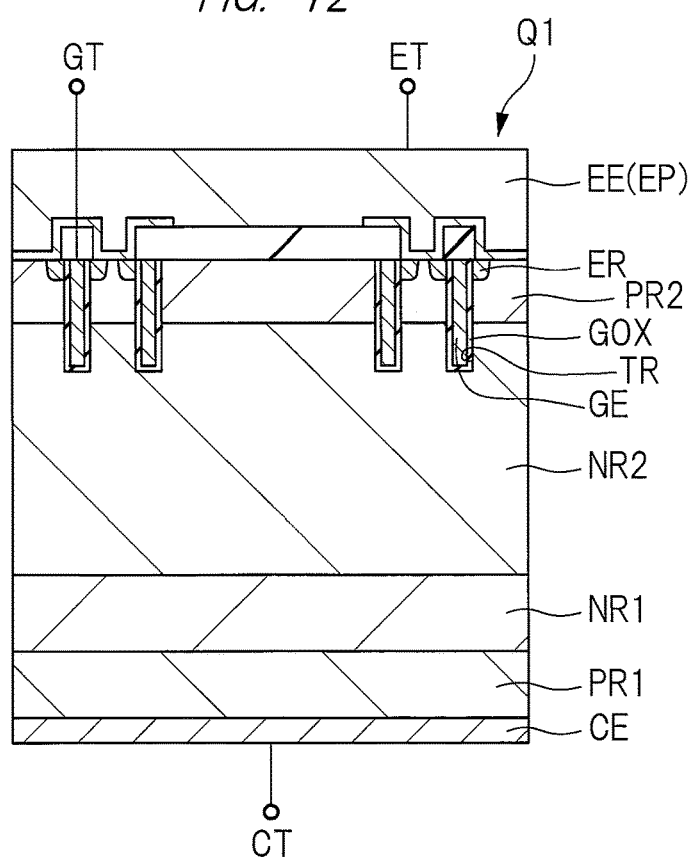
FIG. 12 is a cross-sectional view showing a device structure of the IGBT of FIG. 11.

FIG. 12 is a cross-sectional view showing the device structure of the IGBT of FIG. 11.

In FIG. 12, the IGBT Q1 has a collector electrode CE formed on the back surface of the semiconductor chip, and a $p^+$-type semiconductor region PR1 is formed on this collector electrode CE. An $n^+$-type semiconductor region NR1 is formed on the $p^+$-type semiconductor region PR1, and an $n^-$-type semiconductor region NR2 is formed on the n+-type semiconductor region NR1. A p-type semiconductor region PR2 is formed on the n−-type semiconductor region NR2, and a trench TR penetrating the p-type semiconductor region PR2 and reaching the n−-type semiconductor region NR2 is formed. In addition, an n+-type semiconductor region ER as an emitter region is formed to be aligned with the trench TR. A gate insulating film GOX made of, for example, silicon oxide film is formed inside the trench TR, and a gate electrode GE is formed through the gate insulating film GOX. The gate electrode GE is formed of, for example, a polysilicon film so as to be filled in the trench TR. Although the trench gate structure is shown in FIG. 12, the structure is not limited to this. For example, although not shown, an IGBT using a planar gate structure formed on a silicon substrate may be used.

In the IGBT Q1 configured as described above, the gate electrode GE is connected to a gate terminal GT via the gate electrode pad GP shown in FIG. 11. Similarly, the n+-type semiconductor region ER to be the emitter region is electrically connected to an emitter terminal ET via an emitter electrode EE (the emitter electrode pad EP). The p+-type semiconductor region PR1 to be the collector region is electrically connected to a collector electrode CE formed on the back surface of the semiconductor chip.

The IGBT Q1 configured as described above has both high-speed switching characteristics and voltage driving characteristics of the power MOSFET and low on-voltage characteristics of the bipolar transistor.

Note that the n+-type semiconductor region NR1 is called a buffer layer. The n+-type semiconductor region NR1 is provided to prevent a punch-through phenomenon in which, when the IGBT Q1 is turned off, a depletion layer growing from the p-type semiconductor region PR2 into the n−-type semiconductor region NR2 comes in contact with the p+ type semiconductor region PR1 formed below the n−-type semiconductor region NR2. In addition, for the purpose of limiting an amount of positive-hole injection from the p+-type semiconductor region PR1 to the n−-type semiconductor region NR2, the n+-type semiconductor region NR1 is provided.

Next, the operation of the IGBT will be described.

First, the operation of turning on the IGBT Q1 will be described. In FIG. 12, a sufficient positive voltage is applied between the gate electrode GE and the n+-type semiconductor region ER to be the emitter region, so that the MOSFET with the trench gate structure is turned on. In this case, a portion between the n−-type semiconductor region NR2 and the p+ type semiconductor region PR1 forming the collector region is forward biased, and the positive holes are injected from the p+-type semiconductor region PR1 to the n−-type semiconductor region NR2. Subsequently, electrons that are equivalent to the positive charge of the injected positive holes gather in the n−-type semiconductor region NR2. As a result, the resistance of the n−-type semiconductor region NR2 decreases (conductivity modulation), and the IGBT Q1 is turned on.

Although a junction voltage between the p+ type semiconductor region PR1 and the n−-type semiconductor region NR2 is added to the ON voltage, the resistance value of the n−-type semiconductor region NR2 decreases by one or more digit due to the conductivity modulation. Therefore, in a high withstanding voltage occupying most of the on-state resistance, the IGBT Q1 has a lower on-voltage than that of the power MOSFET. Therefore, it is understood that the IGBT Q1 is an effective device for achieving the high withstanding voltage. That is, in the power MOSFET, it is necessary to increase a thickness of an epitaxial layer to be a drift layer in order to achieve the high withstanding voltage. However, in this case, the on-resistance also increases. On the other hand, in the IGBT Q1, even when the thickness of the n−-type semiconductor region NR2 is increased in order to achieve the high withstanding voltage, the conductivity modulation occurs when the IGBT Q1 is turned on. Therefore, the ON resistance can be made lower than that of the power MOSFET. That is, by the IGBT Q1, a device with a low on-resistance can be achieved even in order to achieve the high withstanding voltage, as compared with the power MOSFET.

Subsequently, the operation of turning off the IGBT Q1 will be described. When the voltage between the gate electrode GE and the n+-type semiconductor region ER to be the emitter region is decreased, the MOSFET having the trench gate structure turns off. In this case, the positive-hole injection from the p+ type semiconductor region PR1 to the n−-type semiconductor region NR2 is stopped, and the already-injected positive holes end their lifetime, and an amount of them decreases. The remaining positive holes flow out directly to the emitter electrode EE (tail current), and the IGBT Q1 is turned off when the outflow is completed. In this manner, the IGBT Q1 can be turned on and off.

Next, the structure of the diode will be described.

Figure 13:
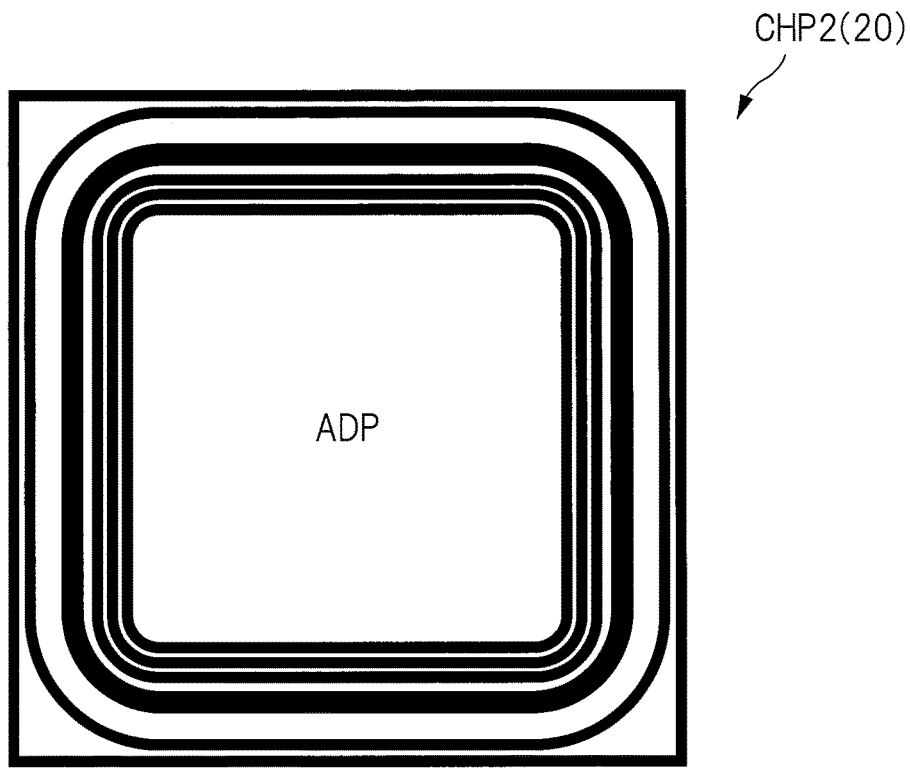
FIG. 13 is a plan view showing an external shape of a semiconductor chip having a diode formed in the semiconductor module of FIG. 1.

FIG. 13 is a plan view showing an external shape of a semiconductor chip in which a diode is formed in the semiconductor module of FIG. 1.

In FIG. 13, a main surface (front surface) of the semiconductor chip CHP2 is shown. As shown in FIG. 13, a planar shape of the semiconductor chip CHP2 according to the present first embodiment is a square shape. An anode electrode pad ADP is formed on the front surface of the square-shaped semiconductor CHP2. Meanwhile, although not shown, a cathode electrode pad is formed over the entire back surface opposite to the front surface of the semiconductor chip CHP2.

Figure 14:
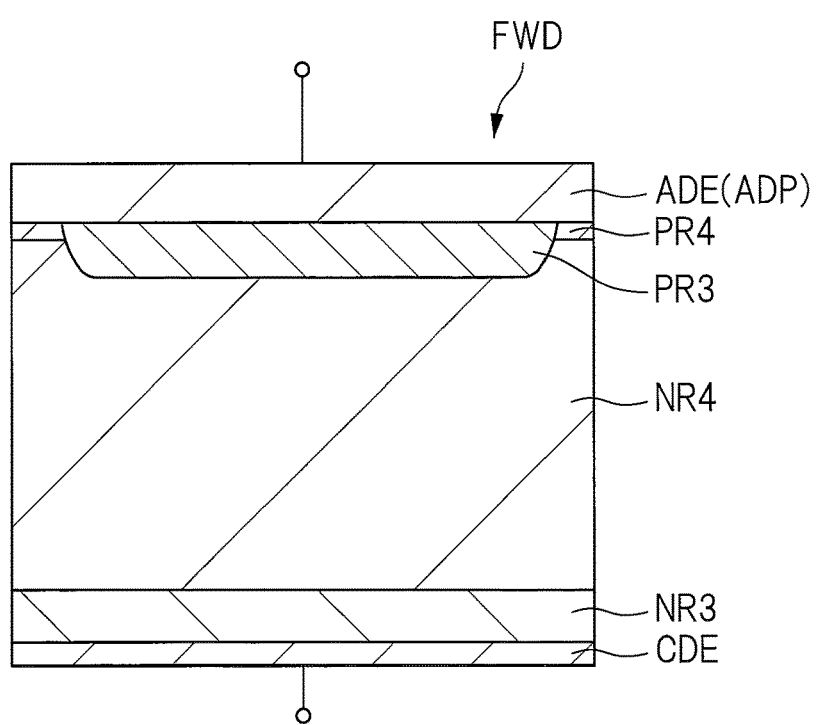
FIG. 14 is a cross-sectional view showing a device structure of the diode of FIG. 13.

Subsequently, the device structure of the diode FWD will be described. FIG. 14 is a cross-sectional view showing the device structure of the diode FWD of FIG. 13. In FIG. 14, a cathode electrode CDE is formed on the back surface of the semiconductor chip, and an n+-type semiconductor region NR3 is formed on the cathode electrode CDE. An n−-type semiconductor region NR4 is formed on the n+-type semiconductor region NR3, and a p-type semiconductor region PR3 is formed on the n−-type semiconductor region NR4. An anode electrode ADE (anode electrode pad ADP) is formed on the p-type semiconductor region PR3 and the p−-type semiconductor region PR4. The anode electrode ADE is made of, for example, aluminum-silicon.

Next, the operation of the diode will be described.

According to the diode FWD configured as described above, when a positive voltage is applied to the anode electrode ADE and a negative voltage is applied to the cathode electrode CDE, a p/n junction between the n−-type semiconductor region NR4 and the p-type semiconductor region PR3 is forward-biased, so that a current flows. On the other hand, when a negative voltage is applied to the anode electrode ADE and a positive voltage is applied to the cathode electrode CDE, the p/n junction between the n−-type semiconductor region NR4 and the p-type semiconductor region PR3 is reverse-biased, so that no current flows. In this manner, the diode FWD having a rectifying function can be operated.

Next, the configuration of the gate control circuit will be described.

Figure 15:
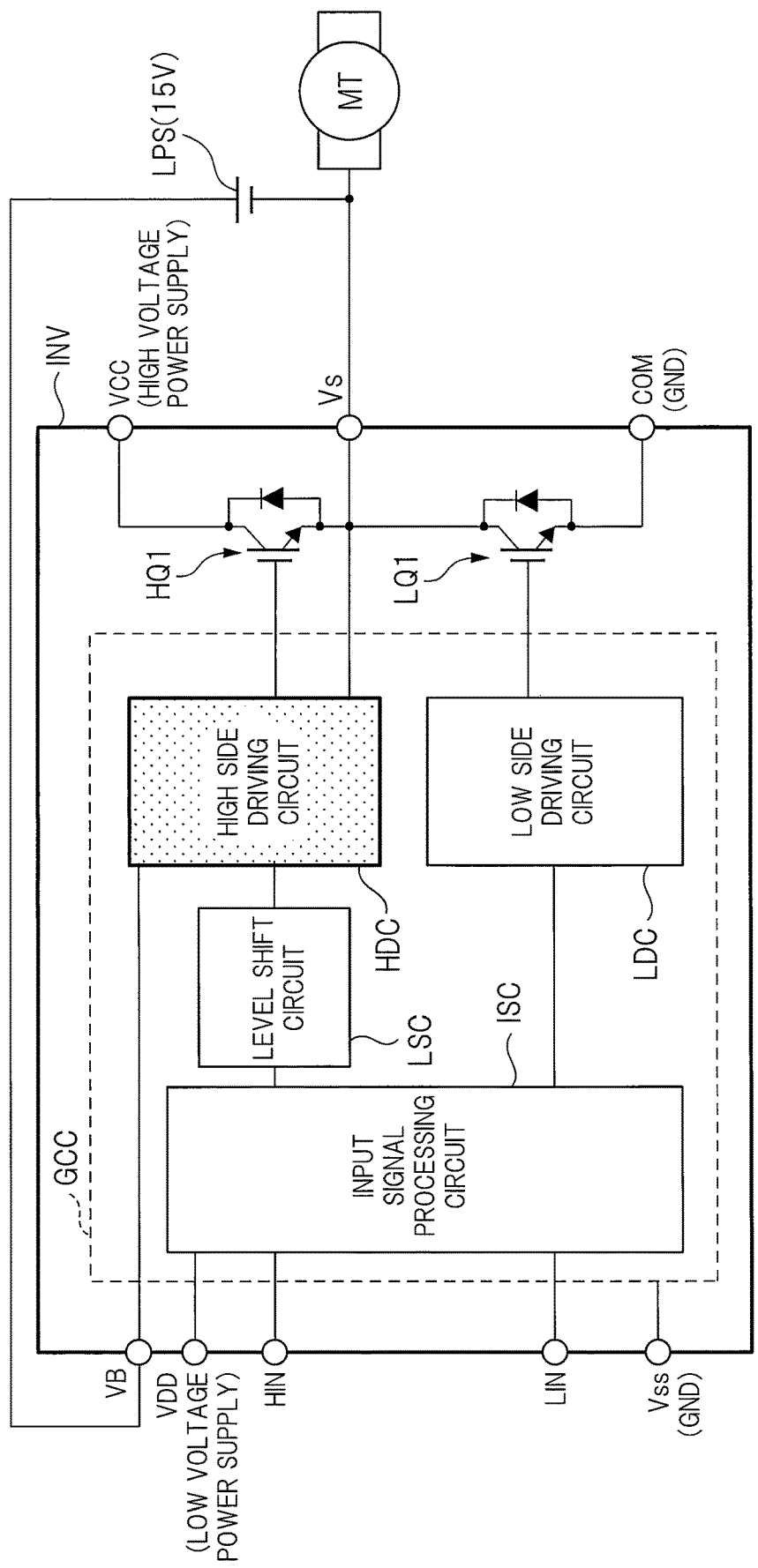
FIG. 15 is a diagram showing a circuit block configuration of a gate control circuit in the semiconductor module of FIG. 1.

FIG. 15 is a diagram showing a circuit block configuration of a gate control circuit in the semiconductor module of FIG. 1. In FIG. 15, the configuration of the gate control circuit GCC for controlling one phase will be described while exemplifying the one phase out of the three phases of the inverter circuit INV driving the three-phase induction motor MT. In FIG. 15, for example, a high side IGBT (HQ1) and a low side IGBT (LQ1) configured for one phase of the inverter circuit INV are connected in series between a terminal VCC electrically connected to a high voltage power supply (600 V) and a terminal COM electrically connected to a ground. An intermediate node between the high side IGBT (HQ1) and the low side IGBT (LQ1) is electrically connected to the three-phase induction motor MT via a terminal Vs.

Here, the gate control circuit GCC is configured to control on/off operation of the high-side IGBT (HQ1) and on/off operation of the low-side IGBT (LQ1). For example, the gate control circuit GCC achieves the on/off operation of the high-side IGBT (HQ1) by controlling the gate voltage applied to the gate electrode of the high-side IGBT (HQ1) and achieves the on/off operation of the low side IGBT (LQ1) by controlling the gate voltage applied to the gate electrode of the low side IGBT (LQ1).

More specifically, the gate control circuit GCC is connected to a terminal VDD electrically connected to a low voltage power supply and a terminal Vss electrically connected to the ground. The gate control circuit GCC has an input signal processing circuit ISC processing input signals input from a terminal HIN and a terminal LIN of the inverter circuit INV, a level shift circuit LSC, a low side driving circuit LDC, and a high side driving circuit HDC.

The low side driving circuit LDC controls the gate voltage applied to the gate electrode of the low side IGBT (LQ1) based on the processing signal output from the input signal processing circuit ISC. For example, in the low side driving circuit LDC, a GND potential (ground potential) is input from the terminal Vss, and the gate voltage generated with reference to the GND potential is supplied to the gate electrode of the low-side IGBT (LQ1). Here, when the gate voltage to be supplied to the gate electrode is equal to or higher than the threshold voltage with respect to the GND potential, the low side IGBT (LQ1) is turned on. On the other hand, when the gate voltage supplied to the gate electrode is lower than the threshold voltage with respect to the GND potential, the low side IGBT (LQ1) is turned off. In this manner, the on/off operation of the low side IGBT (LQ1) is controlled by the low side driving circuit LDC.

Meanwhile, in the high side driving circuit HDC, the processing signal of the input signal processing circuit ISC is input to the level shift circuit LSC, and then, the gate voltage to be applied to the gate electrode of the high side IGBT (HQ1) is controlled based on the output signal from the level shift circuit LSC. For example, in the high side driving circuit HDC, a reference potential as a reference is input from the terminal Vs. That is, also in the high side driving circuit HDC, it is necessary to generate a gate voltage to be applied to the gate electrode of the high-side IGBT (HQ1), and, when this gate voltage is generated, a reference potential is required. Regarding this point, for example, it is conceivable that the GND potential input from the terminal Vss used in the low side driving circuit LDC is used in the high side driving circuit HDC. However, in the high side driving circuit HDC, the GND potential input from the terminal Vss cannot be used as the reference potential. That is, in FIG. 15, in the low side IGBT (LQ1), a gate voltage equal to or higher than the threshold is applied to the emitter potential of the low side IGBT (LQ1), so that the low side IGBT (LQ1) can be turned on. Therefore, the gate voltage of the low side IGBT (LQ1) is generated with reference to the emitter potential of the low side IGBT (LQ1). At this time, since the emitter potential of the low side IGBT (LQ1) is the same potential as the GND potential, the gate voltage of the low side IGBT (LQ1) can be generated so as to take the GND potential input from the terminal Vss as a reference voltage.

On the other hand, as shown in FIG. 15, while the emitter potential of the high-side IGBT (HQ1) is used as the reference potential also in the high-side IGBT (HQ1), the emitter potential of the high-side IGBT (HQ1) changes between the GND potential and the power supply potential. That is, when the low-side IGBT (LQ1) is turned on, the emitter potential of the high-side IGBT (HQ1) becomes the same potential as the GND potential. On the other hand, when the high-side IGBT (HQ1) is turned on, the emitter potential of the high-side IGBT (HQ1) becomes the same potential as the power supply potential. This means that it is necessary to generate the gate voltage with reference to the power supply potential in order to turn on the high-side IGBT (HQ1). Therefore, the gate voltage to be applied to the gate electrode of the high-side IGBT (HQ1) cannot be generated with reference to the GND potential input from the terminal Vss.

Therefore, in the high side driving circuit HDC, the emitter potential of the high-side IGBT (HQ1) is input from the terminal Vs, and a gate voltage to be applied to the gate electrode of the high side IGBT (HQ1) is generated with reference to the potential input from the terminal Vs. Therefore, since the input potential from the terminal Vs changes to the power supply potential, a higher potential than the power supply potential is required for the gate voltage of the high-side IGBT (HQ1) generated with reference to the input potential from the terminal Vs. Therefore, in the high side driving circuit HDC, the higher gate voltage than the power supply potential is generated by, for example, connecting the terminal VB to the low voltage power supply LPS (15 V) located outside the inverter circuit INV, and using an input potential from the terminal VB and the above-described input potential from the terminal Vs. This gate voltage is supplied from the high side driving circuit HDC to the gate electrode of the high side IGBT (HQ1). As described above, when the gate voltage supplied to the gate electrode is equal to or higher than the threshold voltage with respect to the reference potential, the high-side IGBT (HQ1) is turned on. On the other hand, when the gate voltage supplied to the gate electrode is lower than the threshold voltage with respect to the reference potential, the high-side IGBT (HQ1) is turned off. In this manner, the on/off operation of the high-side IGBT (HQ1) is controlled by the high side driving circuit HDC.

Next, a configuration of a semiconductor chip which embodies the gate control circuit will be described.

The above-described gate control circuit GCC can be achieved by, for example, a semiconductor chip in which an integrated circuit is formed, and the semiconductor chip which embodies the gate control circuit GCC has the following features. That is, circuits such as the input signal processing circuit ISC, the level shift circuit LSC, and the low side driving circuit LDC, which are components of the gate control circuit GCC, are designed with reference to the GND potential supplied from the terminal Vss, and therefore, can be mounted on a semiconductor substrate. On the other hand, the high side driving circuit HDC is designed with reference to the potential which is supplied from the terminal Vs and which changes to the power supply potential, and therefore, is required to be separately formed from the semiconductor substrate (terminal Vss). More specifically, the high side driving circuit HDC adopts a floating structure with a high withstanding voltage, and a "floating island structure" independent from the low side driving circuit LDC is used. This "floating island structure" has a limitation on signal exchange with the low side driving circuit LDC so that exchange of only pulse signals through the level shift circuit LSC is possible. Therefore, it is required to form the "floating island structure" in the pad required for the high side driving circuit HDC. As described above, the "floating island structure" is formed in the semiconductor chip in which the gate control circuit GCC is formed.

Figure 16:
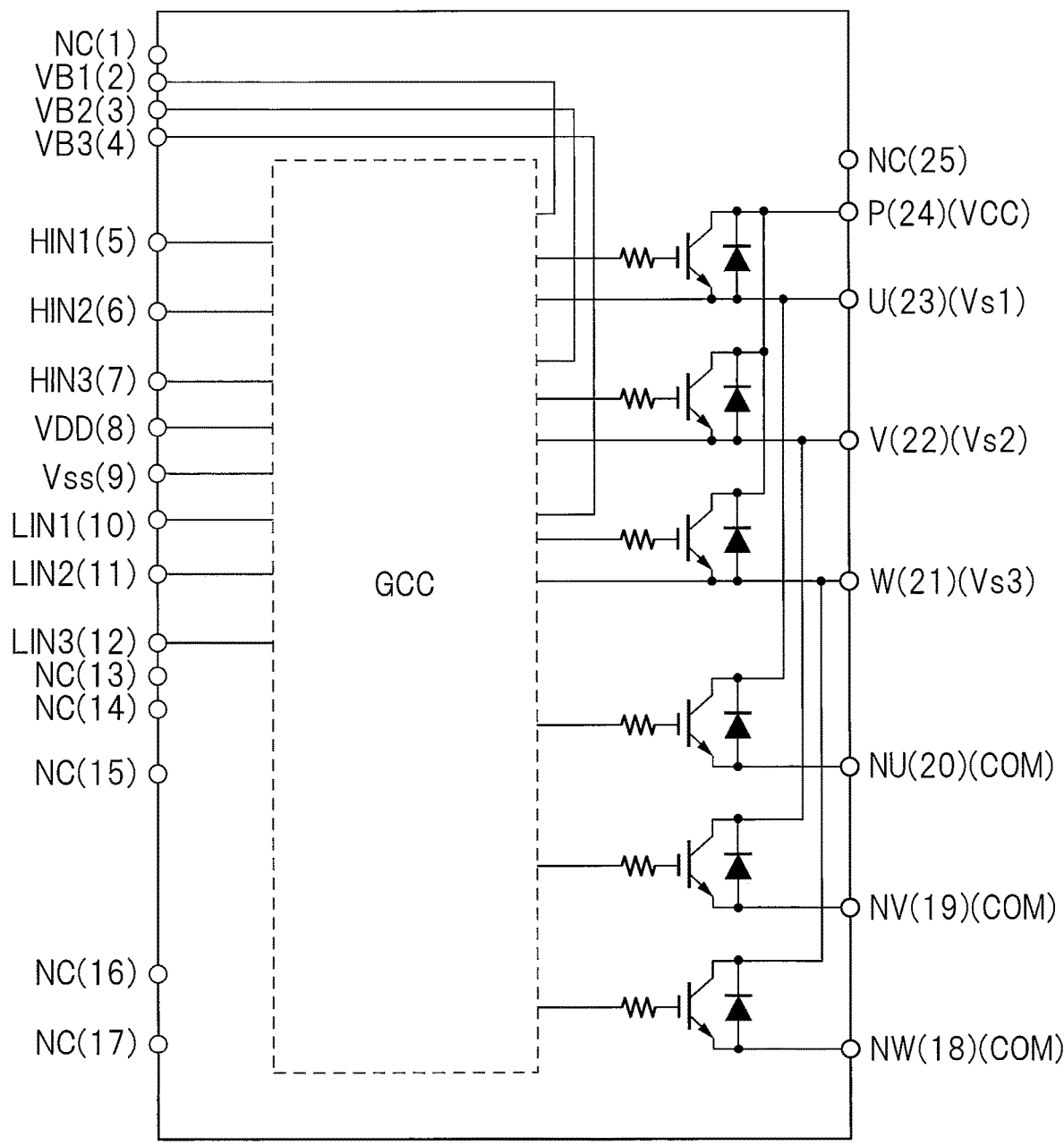
FIG. 16 is a diagram showing a circuit block configuration in the semiconductor module of FIG. 1.

Next, a circuit block configuration of the semiconductor module SA according to the present first embodiment will be described. FIG. 16 is a diagram showing the circuit block configuration in the semiconductor module of FIG. 1, which is a circuit block configuration for achieving the inverter circuit INV shown in FIG. 10. In FIG. 16, the semiconductor module SA according to the present first embodiment has six IGBTs, six diodes and the gate control circuit GCC, and besides, 25 external terminals. Each of terminals with a number 1, numbers 13 to 17, and a number 25 is a non-connect terminal NC. The terminals with numbers 2 to 4 are terminals VB1 to VB3 connected to the gate control circuit GCC, and the terminals with numbers 5 to 7 are terminals HIN1 to HIN3 from which an input signal is input to the gate control circuit GCC, respectively. Further, the terminal with a number 8 is the terminal VDD from which the low voltage power is supplied to the gate control circuit GCC, and the terminal with a number 9 is the terminal Vss from which the ground potential is supplied to the gate control circuit GCC. The terminals with numbers 10 to 12 are the terminals LIN1 to LIN3 from which the input signals are input to the gate control circuit GCC. Meanwhile, the terminal with a number 18 is a terminal NW (terminal COM) connected to the ground potential, the terminal with a number 19 is also a terminal NV (terminal COM) connected to the ground potential, and the terminal with a number 20 is also a terminal NU (terminal COM) connected to the ground potential. Further, the terminal with a number 21 is a terminal W (terminal Vs3) connected to the W phase of the three-phase motor, the terminal with a number 22 is a terminal V (terminal Vs2) connected to the V phase of the three-phase motor, and the terminal with a number 23 is a terminal U (terminal Vs1) connected to the U phase of the three-phase motor. Further, the terminal of a number 24 is a terminal P (terminal VCC) connected to the high voltage power supply.

Figure 17:
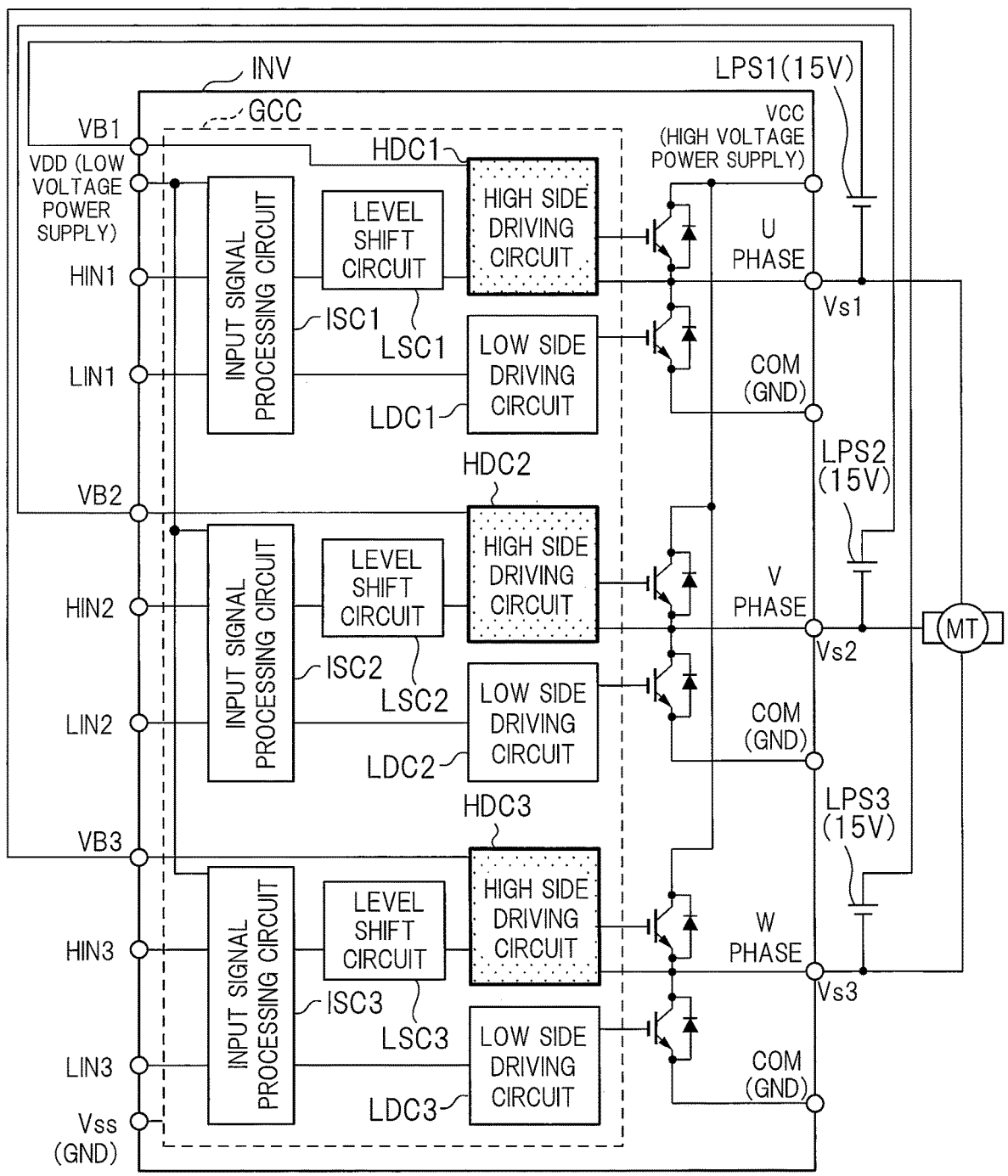
FIG. 17 is a diagram showing an internal block configuration of the gate control circuit of FIG. 16.

FIG. 17 is a diagram showing an internal block configuration of the gate control circuit GCC shown in FIG. 16. As shown in FIG. 17, the gate control circuit GCC has unit block configurations shown in FIG. 15 so as to correspond to the U phase, the V phase, and the W phase, respectively. At this time, in FIG. 17, one added with a number "1" to an end of reference symbols in the unit block configuration shown in FIG. 15 corresponds to the U phase, one added with a number "2" to an end of reference symbols in the unit block configuration shown in FIG. 15 corresponds to the V phase, and one added with a number "3" to an end of reference symbols in the unit block configuration shown in FIG. 15 corresponds to the W phase.

Next, a configuration of the semiconductor chip which embodies the gate control circuit of the semiconductor module SA according to the present first embodiment will be described.

Figure 18:
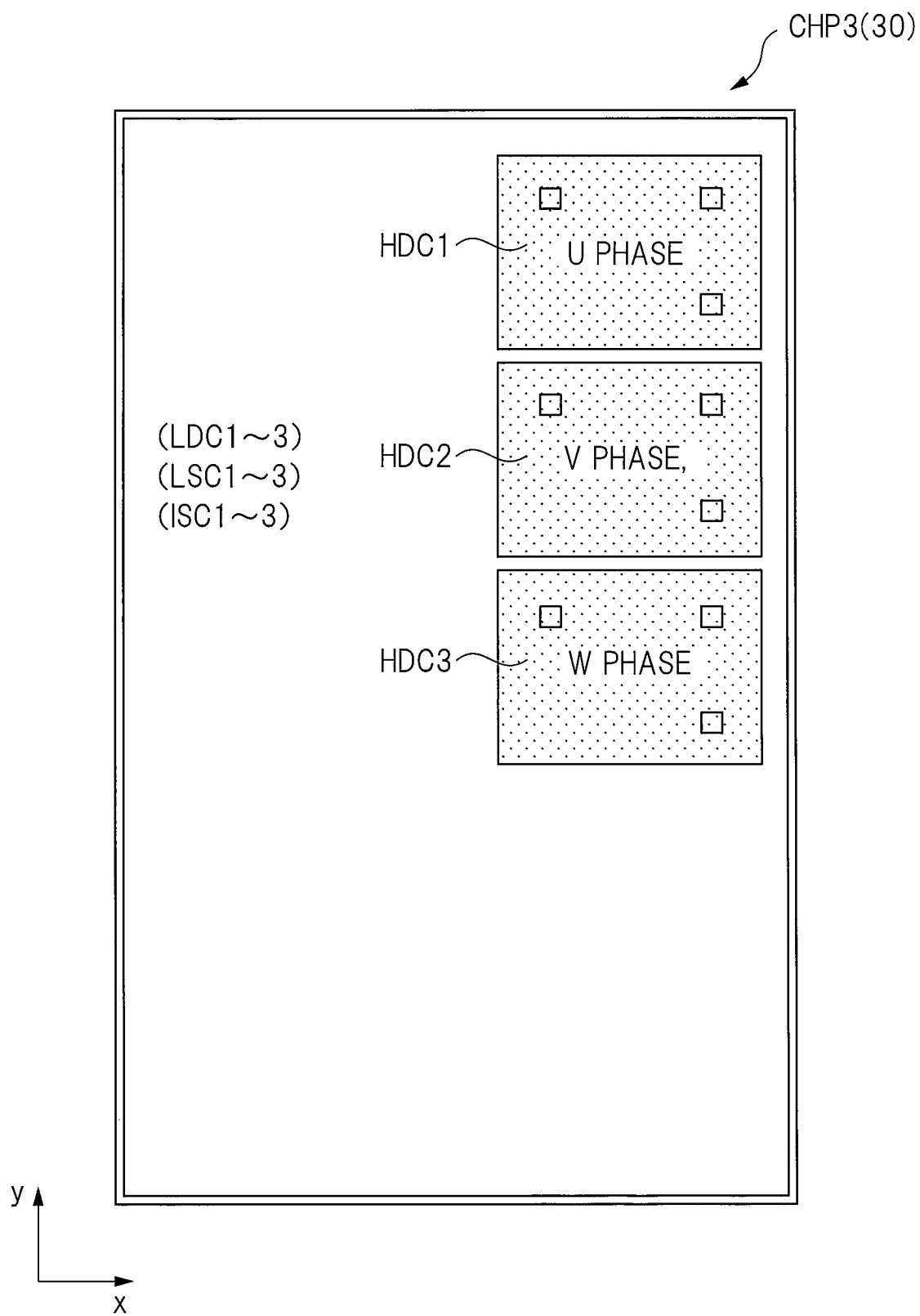
FIG. 18 is a schematic diagram showing a configuration of a semiconductor chip that embodies the gate control circuit of FIG. 17.

FIG. 18 is a schematic diagram showing a structure of a semiconductor chip CHP3 which embodies the gate control circuit GCC shown in FIG. 17. As shown in FIG. 18, in the semiconductor chip CHP3, the "floating island structure" in which the high side driving circuit HDC1 corresponding to the U phase is formed, the "floating island structure" in which the high side driving circuit HDC2 corresponding to the V phase is formed, and the "floating island structure" in which the high side driving circuit HDC2 corresponding to the W phase is formed. At this time, in the semiconductor chip CHP3 according to the present first embodiment, the three "floating island structures" are laid out so as to align in the y direction. In other regions than the "floating island structures", the low side driving circuits LDC1 to LDC3, the level shift circuits LSC1 to LSC3, and the input signal processing circuits ISC1 to ISC3 are formed.

According to the semiconductor chip CHP3 of the present first embodiment configured as described above, the gate control circuit GCC configuring the three-phase inverter circuit can be collectively formed on one semiconductor chip CHP3, and therefore, it is possible to obtain an advantage that is reduction in a manufacturing cost of the semiconductor module SA configuring the three-phase inverter circuit. Further, it is unnecessary to consider the performance variation among the chips, and therefore, the controllability of the IGBT by the gate control circuit GCC can be improved by using the semiconductor chip CHP3 according to the present first embodiment.

<Method of Manufacturing Semiconductor Module>

1. Lead Frame Preparation

Figure 19:
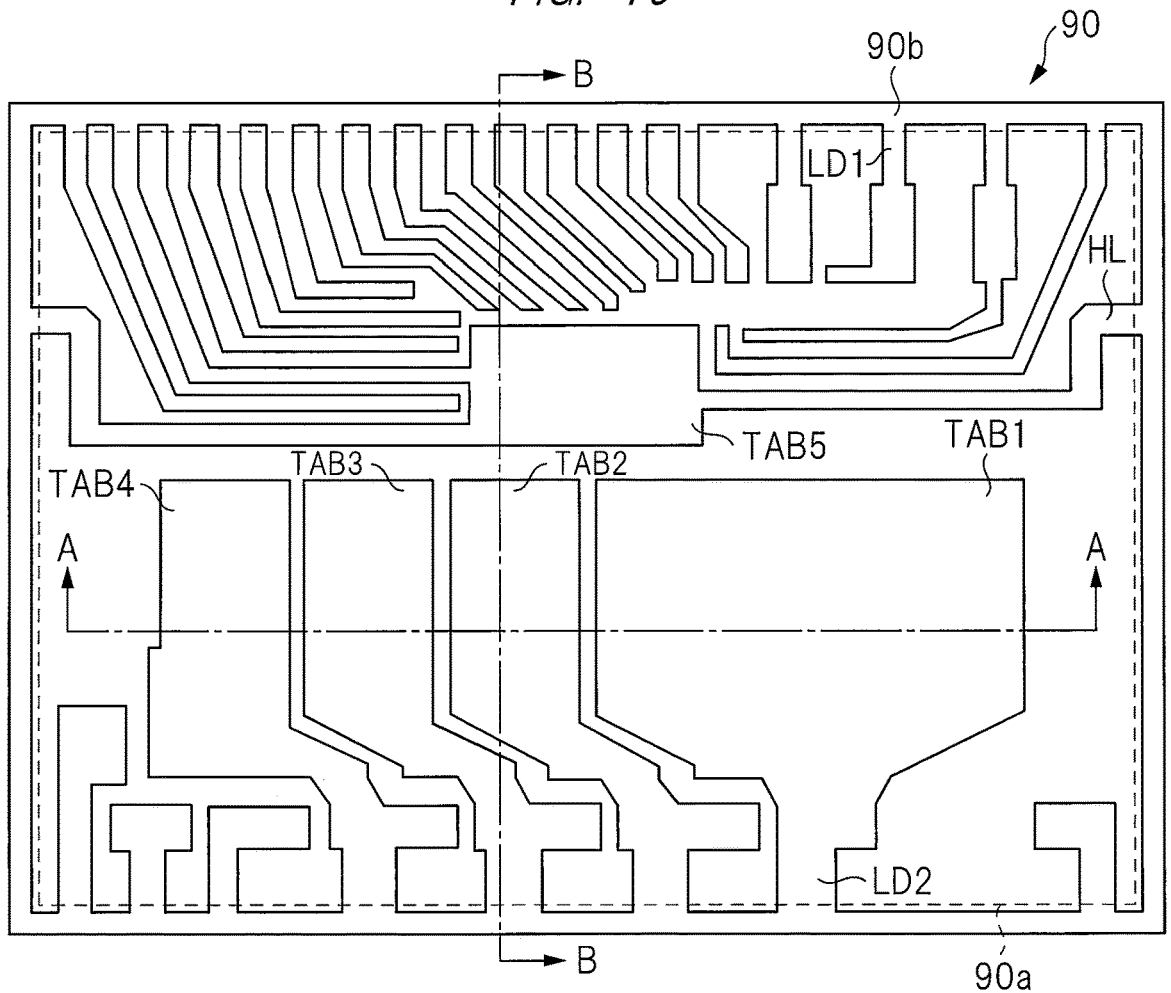
FIG. 19 is a plan view showing a structure of a lead frame used for assembling the semiconductor module shown in FIG. 1.
Figure 20:
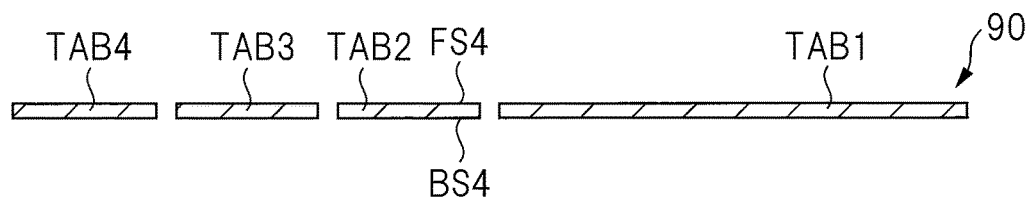
FIG. 20 is a cross-sectional view showing a structure taken along a line A-A of FIG. 19.
Figure 21:
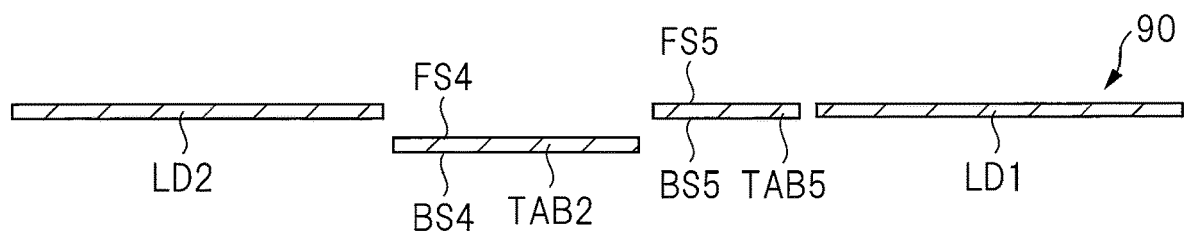
FIG. 21 is a cross-sectional view showing a structure taken along a line B-B of FIG. 19.

FIG. 19 is a plan view showing a structure of a lead frame used for assembling the semiconductor module shown in FIG. 1, FIG. 20 is a cross-sectional view showing a structure taken along a line A-A of FIG. 19, and FIG. 21 is a cross-sectional view showing a structure taken along a line B-B of FIG. 19.

First, a lead frame 90 as shown in FIG. 19 is prepared. A plurality of product forming regions 90a, in each of which one semiconductor module SA shown in FIG. 1 can be formed, are formed in the entire lead frame. However, in the present first embodiment, only one product forming region 90a will be exemplified and described. The product forming region 90a is provided with chip mounting portions TAB1 to TAB5, a plurality of leads LD1 arranged around the chip mounting portion TAB5, a plurality of leads LD2 arranged in the vicinity of the chip mounting portions TAB1 to TAB4, and two suspended leads HL supporting the chip mounting portion TAB5. The plurality of leads LD1 and LD2 and the two suspended leads HL are connected to a frame portion 90b.

As shown in FIG. 20, note that the chip mounting portions TAB1 to TAB4 have front surfaces (first main surfaces) such as FS3 and FS4, on each of which the semiconductor chip is mounted, and back surfaces (second main surfaces) such as BS3 and BS4, which are opposite to the front surfaces, and others, respectively. In addition, the chip mounting portions TAB1 to TAB4 have the same height as one another. On the other hand, as shown in FIG. 21, the chip mounting portion TAB5 has a front surface (third main surface) FS5, on which a semiconductor chip is mounted, and a back surface (fourth main surface) BS5, which is opposite to the front surface. As shown in FIG. 20 and FIG. 21, note that the chip mounting portion TAB5 has a height different from those of the chip mounting portions TAB1 to TAB4. More specifically, the chip mounting portion TAB5 is arranged at a position higher than those of the chip mounting portions TAB1 to TAB4.

Here, the lead frame 90 is made of, for example, a base material containing copper (Cu) as a main component, and a lead pattern shown in FIG. 19 is formed by etching processing, press processing, or others.

2. Die Bonding

Figure 22:
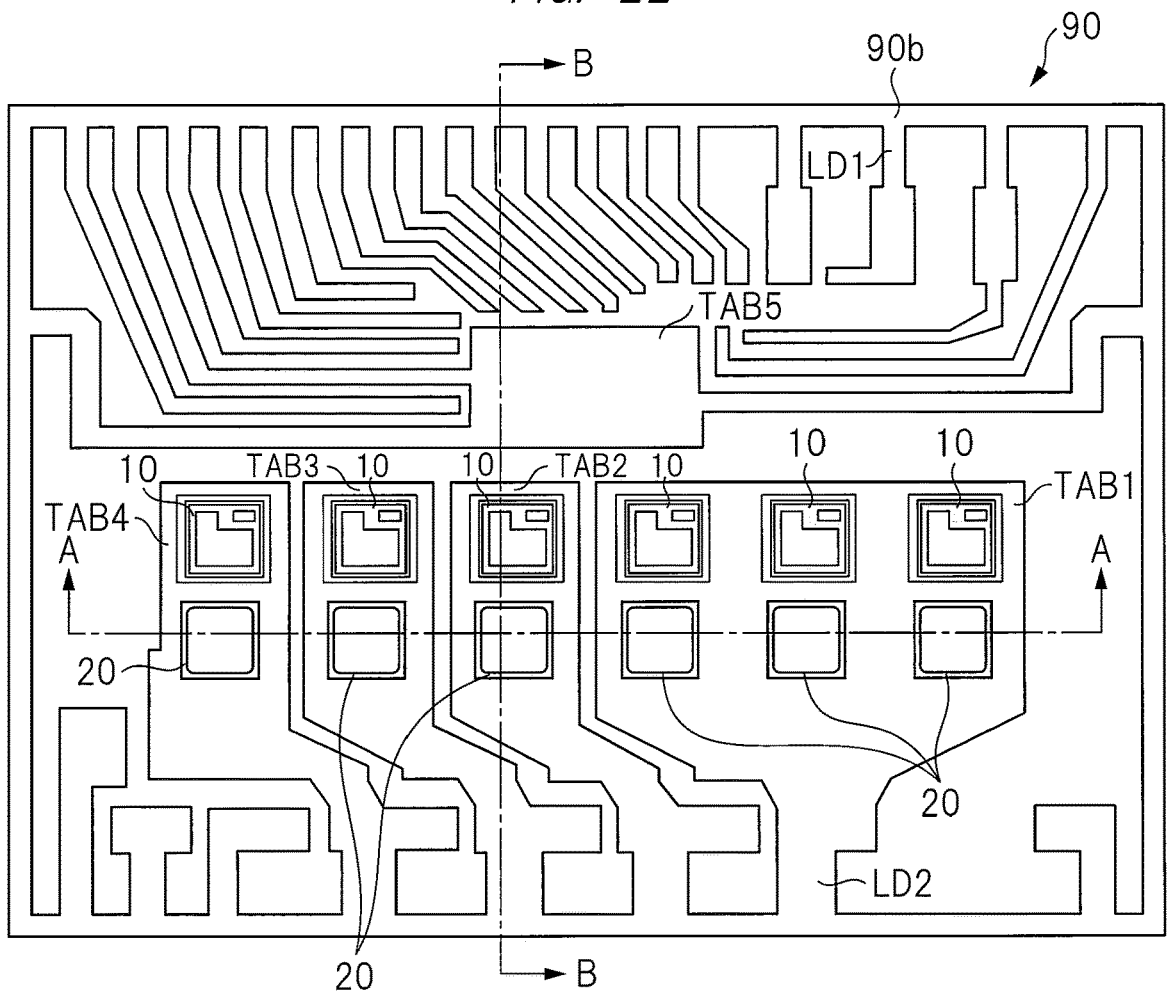
FIG. 22 is a plan view showing a structure at the time of completion of die bonding of the IGBT chip and the diode chip in the assembly of the semiconductor module shown in FIG. 1.
Figure 23:
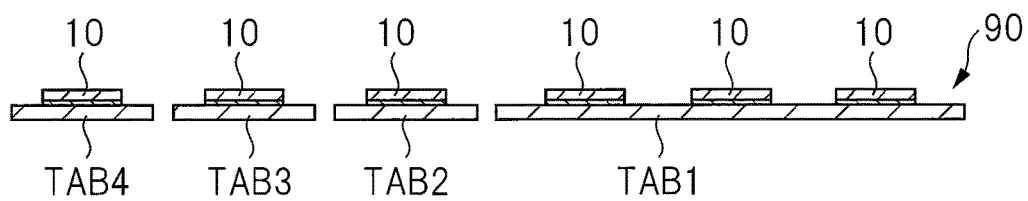
FIG. 23 is a cross-sectional view showing a structure taken along a line A-A of FIG. 22.
Figure 24:
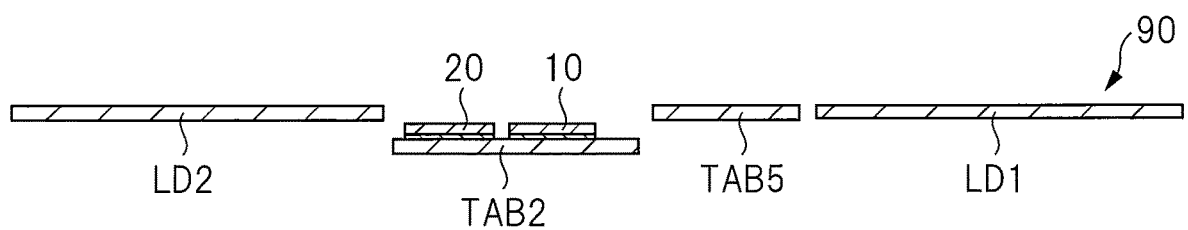
FIG. 24 is a cross-sectional view showing a structure taken along a line B-B of FIG. 22.
Figure 25:
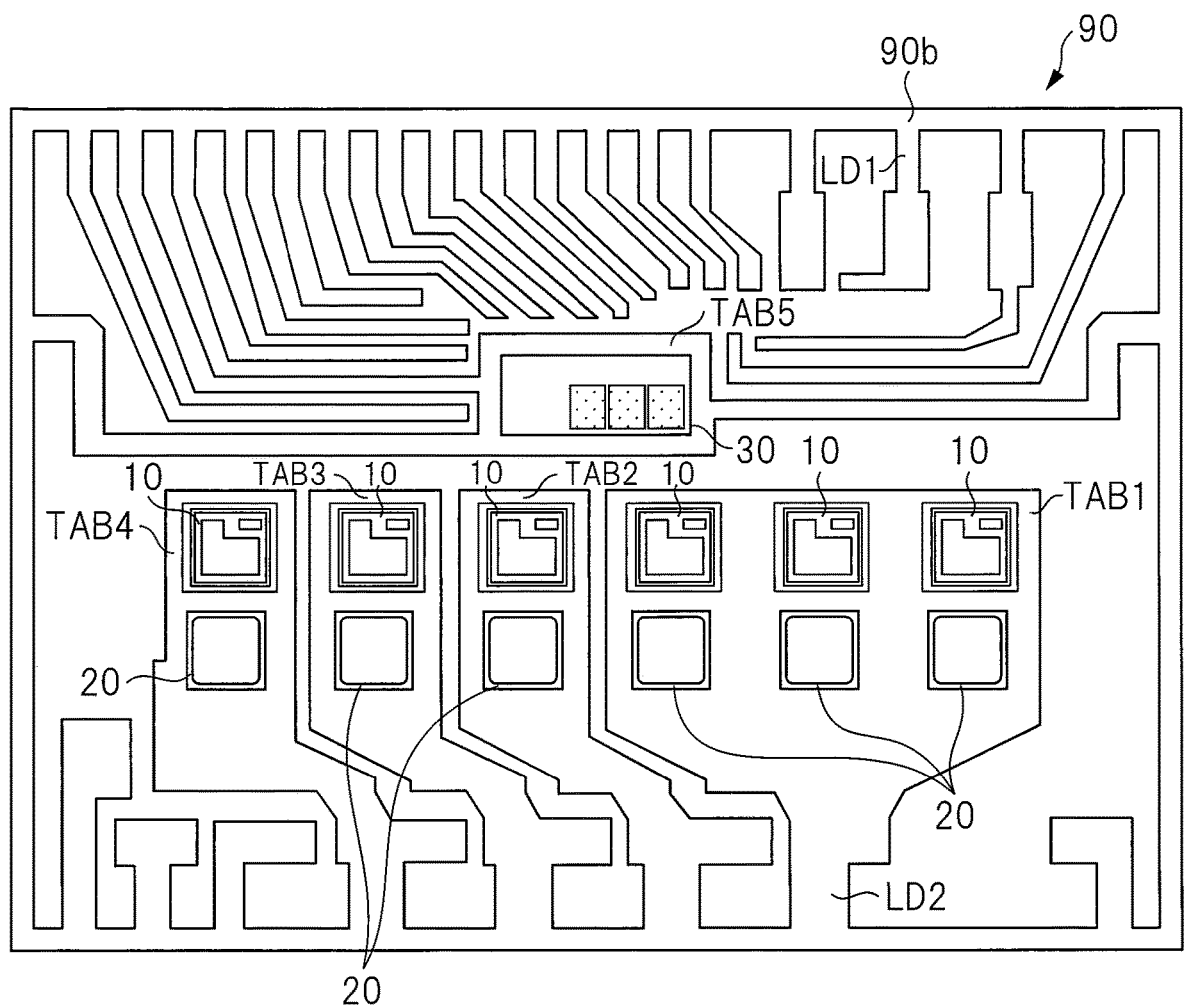
FIG. 25 is a plan view showing a structure at the completion of die bonding of the control chip in the assembly of the semiconductor module shown in FIG. 1.

FIG. 22 is a plan view showing a structure of the IGBT chip and the diode chip at the time of completion of the die bonding in the assembly of the semiconductor module shown in FIG. 1, FIG. 23 is a cross-sectional view showing a structure taken along a line A-A of FIG. 22, FIG. 24 is a cross-sectional view showing a structure taken along a line B-B of FIG. 22, and FIG. 25 is a plan view showing a structure of the control chip at the time of completion of the die bonding in the assembly of the semiconductor module shown in FIG. 1.

First, the IGBT chip 10 as shown in FIG. 11, the diode chip 20 as shown in FIG. 13, and the control chip 30 as shown in FIG. 18 are prepared. For example, note that the first semiconductor chip mounted on the chip mounting portion TAB1 is the IGBT chip 10. The IGBT chip 10 includes the power transistor therein, and an emitter terminal (first terminal) EP electrically connected to the emitter electrode (first electrode) of the power transistor is formed on the front surface (first surface) FS1 shown in FIG. 3. Further, on the front surface FS1, a gate terminal GP electrically connected to the gate electrode of the power transistor is formed. On the other hand, although not illustrated, a collector terminal (second terminal) is formed on a back surface (second surface) BS1 located on the opposite side of the front surface FS1. The collector terminal is electrically connected to the collector electrode (second electrode) of the power transistor.

For example, the second semiconductor chip mounted on the chip mounting portion TAB2 is an IGBT chip 10 as well. This IGBT chip (second semiconductor chip) 10 also includes the power transistor therein, and an emitter terminal (third terminal) EP electrically connected to the emitter electrode (third electrode) of the power transistor is formed on the front surface (first surface) FS2. Further, on the front surface FS2, a gate terminal GP electrically connected to the gate electrode of the power transistor is formed. On the other hand, although not illustrated, a collector terminal (fourth terminal) is formed on a back surface (second surface) BS2 located on the opposite side of the front surface FS2. The collector terminal is electrically connected to the collector electrode (fourth electrode) of the power transistor.

As shown in FIG. 13, on a front surface of the diode chip 20, an anode terminal ADP is formed. On the other hand, although not illustrated, a cathode terminal is formed on a back surface located on the opposite side of the front surface.

After preparing the lead frame 90 shown in FIG. 22, the die bonding is performed. In the present first embodiment, for example, silver paste or others is used as a die bond material (conductive bonding material 60 shown in FIG. 3) for fixing each semiconductor chip.

First, as shown in FIG. 22 to FIG. 24, three IGBT chips 10 are mounted on the chip mounting portion TAB1 of the lead frame 90 through the conductive bonding material 60. Further, one IGBT chip 10 is similarly mounted on each of the chip mounting portions TAB2 to TAB4 through the conductive bonding material 60.

Next, similarly, three diode chips 20 are mounted on the chip mounting portion TAB1 through the conductive bonding material 60. Further, one diode chip 20 is mounted on each of the chip mounting portions TAB2 to 4TAB through the conductive bonding material 60.

After mounting the IGBT chips 10 and the diode chips 20, the control chip 30 is mounted on the chip mounting portion TAB5 of the lead frame 90 as shown in FIG. 25. Note that the control chip 30 is mounted on the chip mounting portion TAB5 through a nonconductive bonding material 65 shown in FIG. 4.

The die bonding is performed by, for example, applying heat and load to each of the IGBT chips 10, the diode chips 20, and the control chip 30.

3. Wire Bonding

Figure 26:
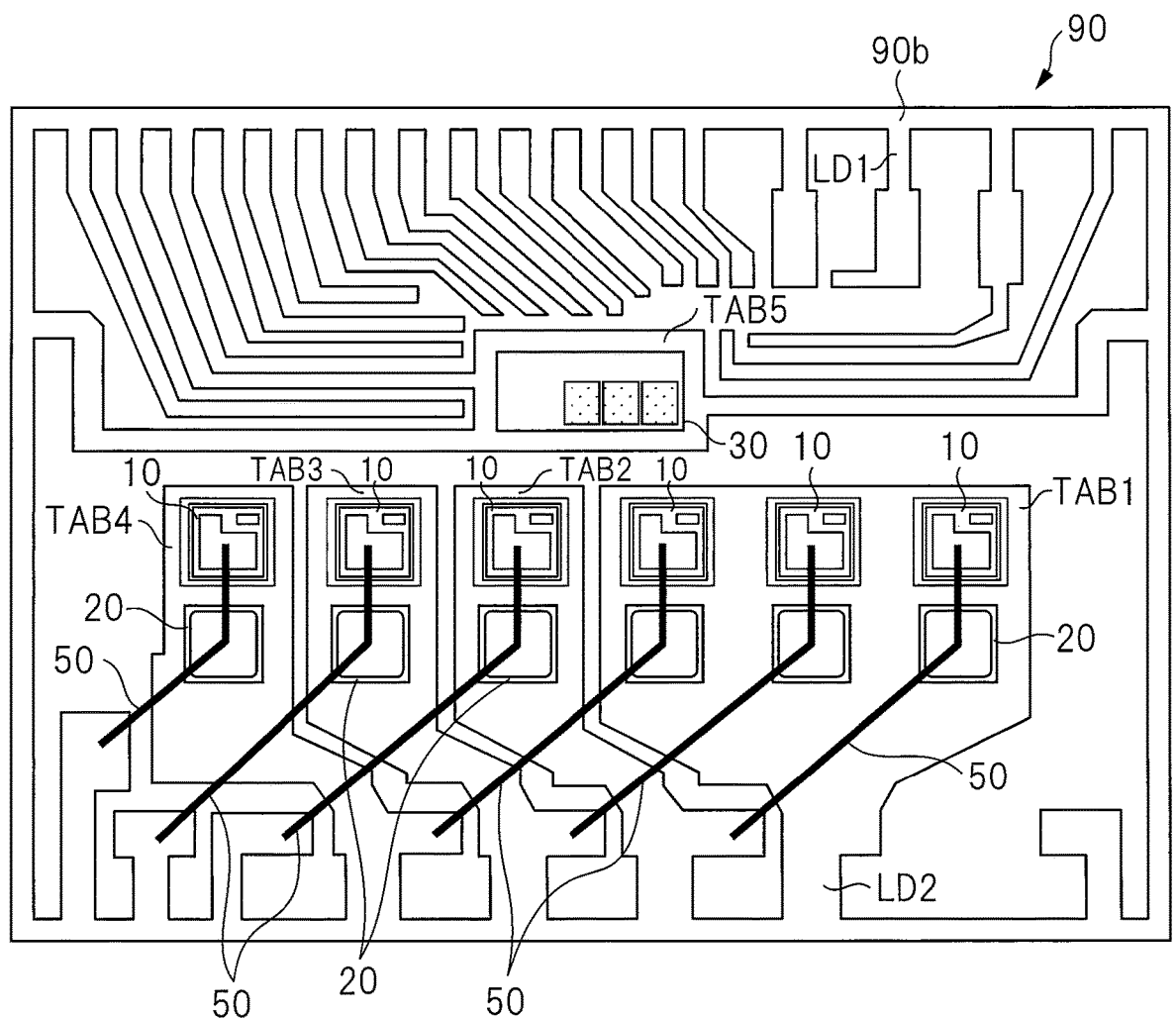
FIG. 26 is a plan view showing a structure at the time of wire bonding completion of an aluminum wire in the assembly of the semiconductor module shown in FIG. 1.
Figure 27:
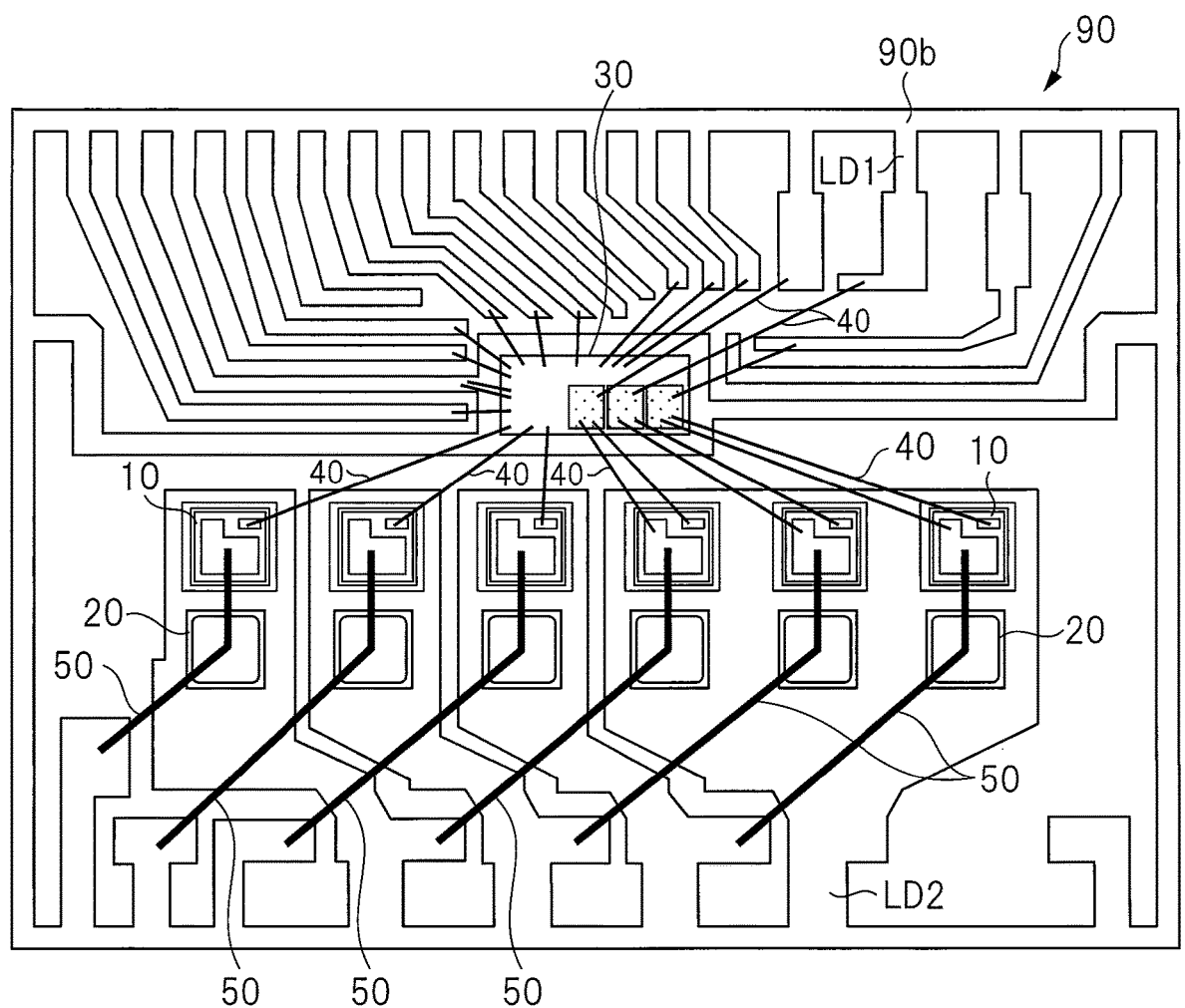
FIG. 27 is a plan view showing a structure at the time of completion of wire bonding of a gold wire in the assembly of the semiconductor module shown in FIG. 1.

FIG. 26 is a plan view showing a structure of an aluminum wire at the time of completion of the wire bonding in the assembly of the semiconductor module shown in FIG. 1, and FIG. 27 is a plan view showing a structure of a gold wire at the time of completion of the wire bonding in the assembly of the semiconductor module shown in FIG. 1.

After the die bonding, the wire bonding is performed as shown in FIG. 26 and FIG. 27. First, as shown in FIG. 26, the IGBT chip 10 and the diode chip 20 are electrically connected to each other by using an aluminum wire 50, and are electrically connected through the aluminum wire 50 to the lead LD2 (an inner portion of the lead LD2 arranged on a lower side of FIG. 26) which is connected to the chip mounting portion. Alternatively, the IGBT chip 10 and the diode chip 20 are electrically connected to each other by using the aluminum wire 50, and are further electrically connected through the aluminum wire 50 to the inner portion of the single lead LD2 not connected to the chip mounting portion. Note that the aluminum wire 50 is a conductive member containing aluminum (Al) as a main component.

After the bonding among the IGBT chip 10, the diode chip 20, and the lead LD2 by using the aluminum wire 50 ends, wire bonding using a gold wire 40 having a smaller (thinner) wire diameter than that of the aluminum wire 50 is performed as shown in FIG. 27. First, each of the IGBT chips 10 and the control chip 30 are electrically connected to each other by using the gold wire 40. Similarly, the control chip 30 and the lead LD1 (the inner portion of the lead LD1 arranged on an upper side of FIG. 27) are further electrically connected to each other by using the gold wire 40. Note that the gold wire 40 is a conductive member containing gold (Au) as a main component.

4. Resin Sealing (Resin Mold)

Figure 28:
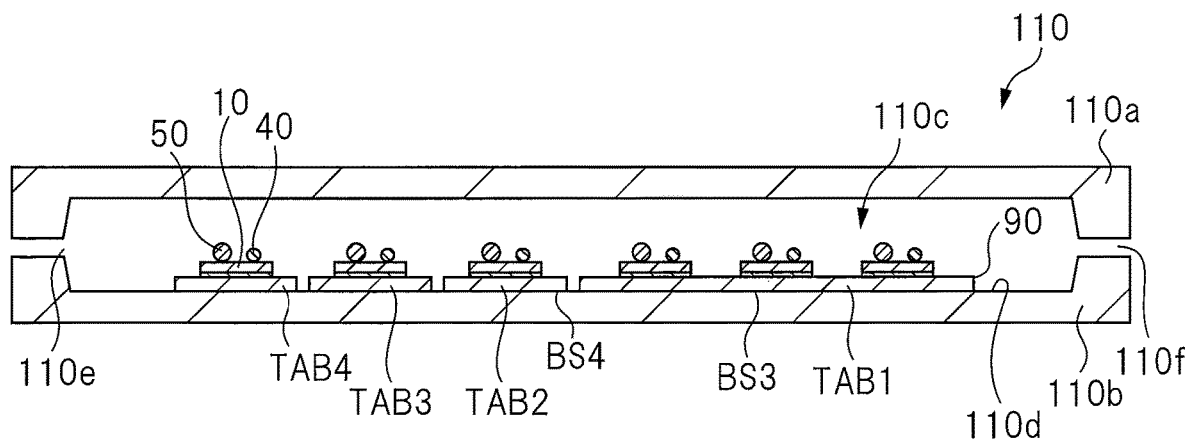
FIG. 28 is a cross-sectional view showing a structure obtained by taking, along a line A-A of FIG. 22, a structure in which a wire-bonded lead frame is arranged in a cavity of a mold die in the assembly of the semiconductor module shown in FIG. 1.
Figure 29:
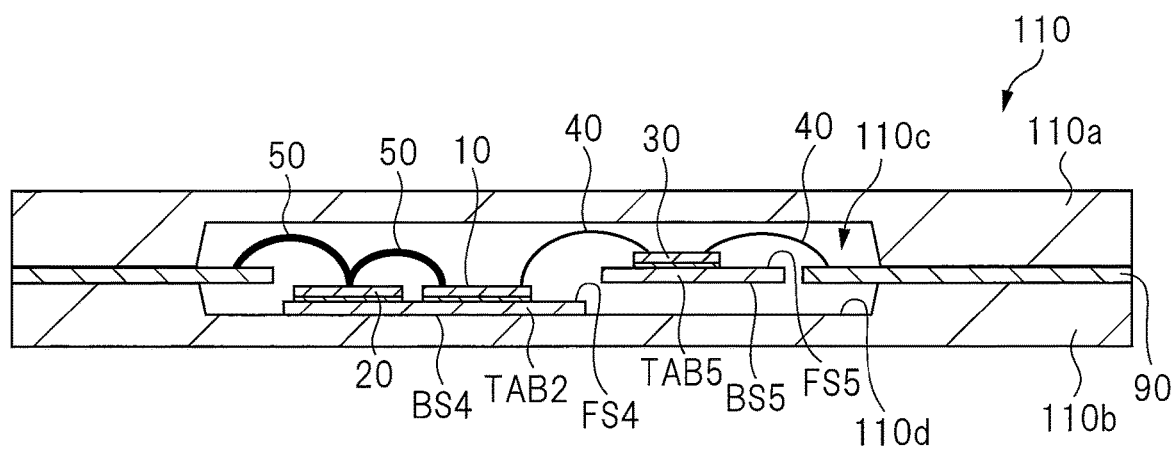
FIG. 29 is a cross-sectional view showing a structure obtained by taking, along a line B-B of FIG. 22, a structure in which a wire-bonded lead frame is arranged in a cavity of a mold die in the assembly of the semiconductor module shown in FIG. 1.
Figure 30:
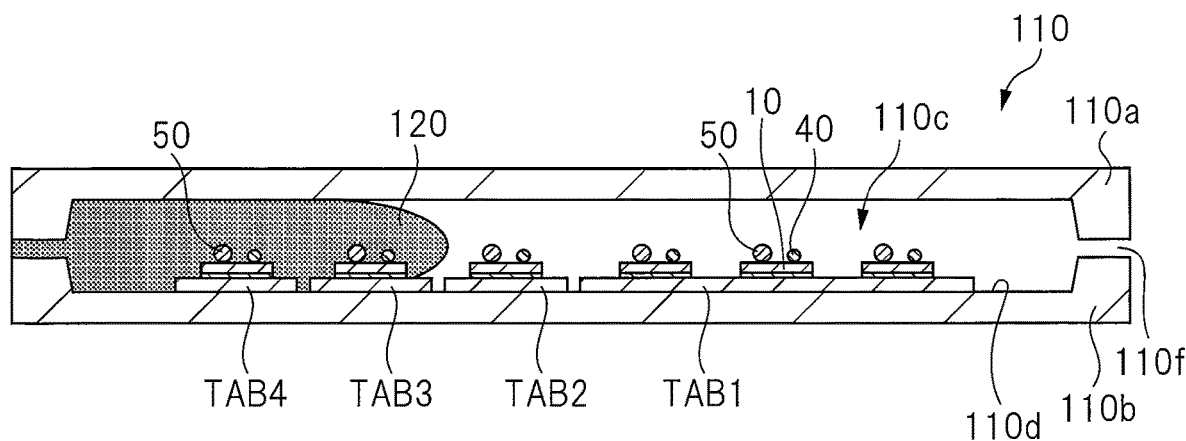
FIG. 30 is a cross-sectional view showing a start state of injection of a resin into the cavity in the structure shown in FIG. 28.
Figure 31:
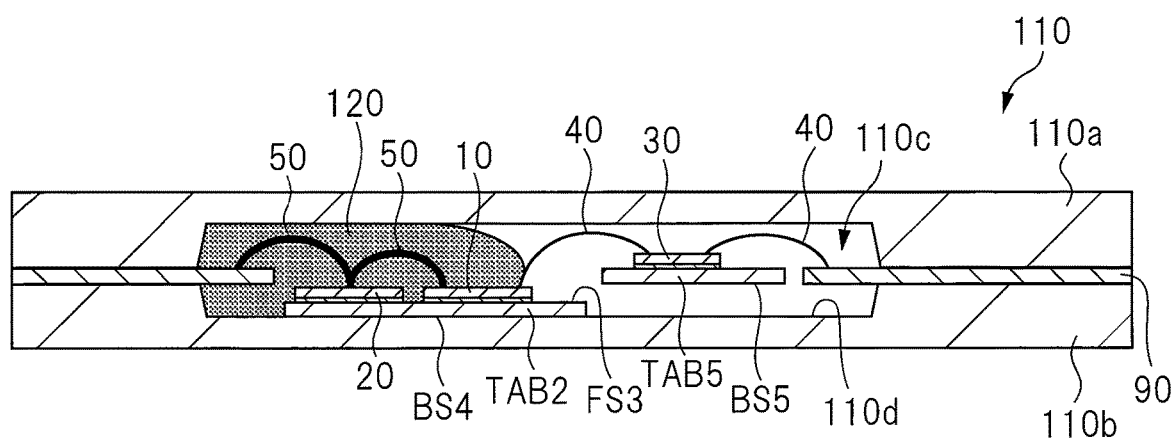
FIG. 31 is a cross-sectional view showing a start state of injection of a resin into the cavity in the structure shown in FIG. 29.
Figure 32:
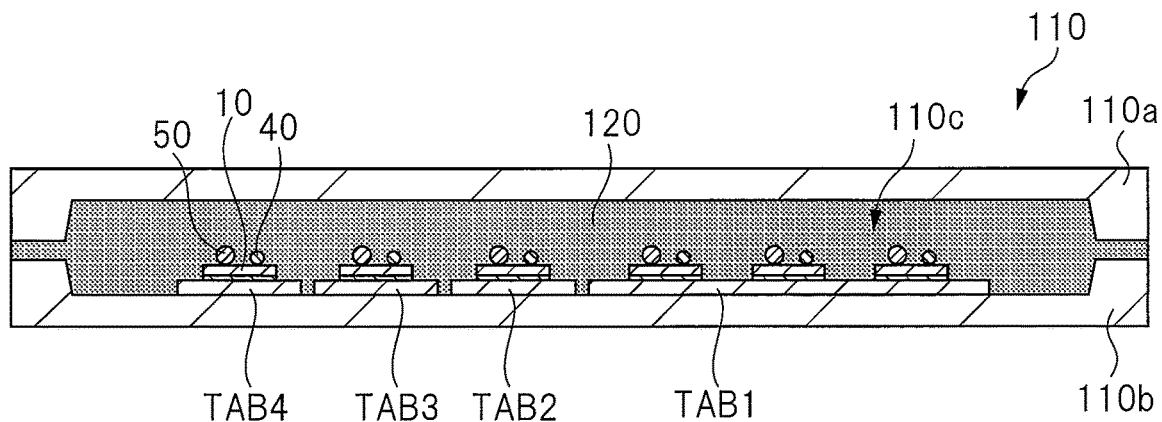
FIG. 32 is a cross-sectional view showing a completion state of the injection of the resin into the cavity in the structure shown in FIG. 28.
Figure 33:
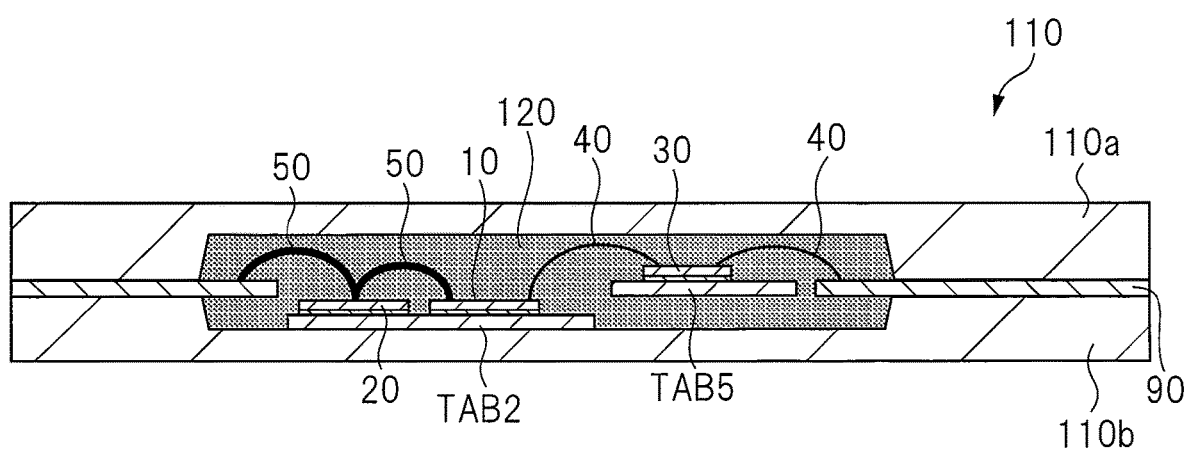
FIG. 33 is a cross-sectional view showing a completion state of the injection of the resin into the cavity in the structure shown in FIG. 29.
Figure 34:
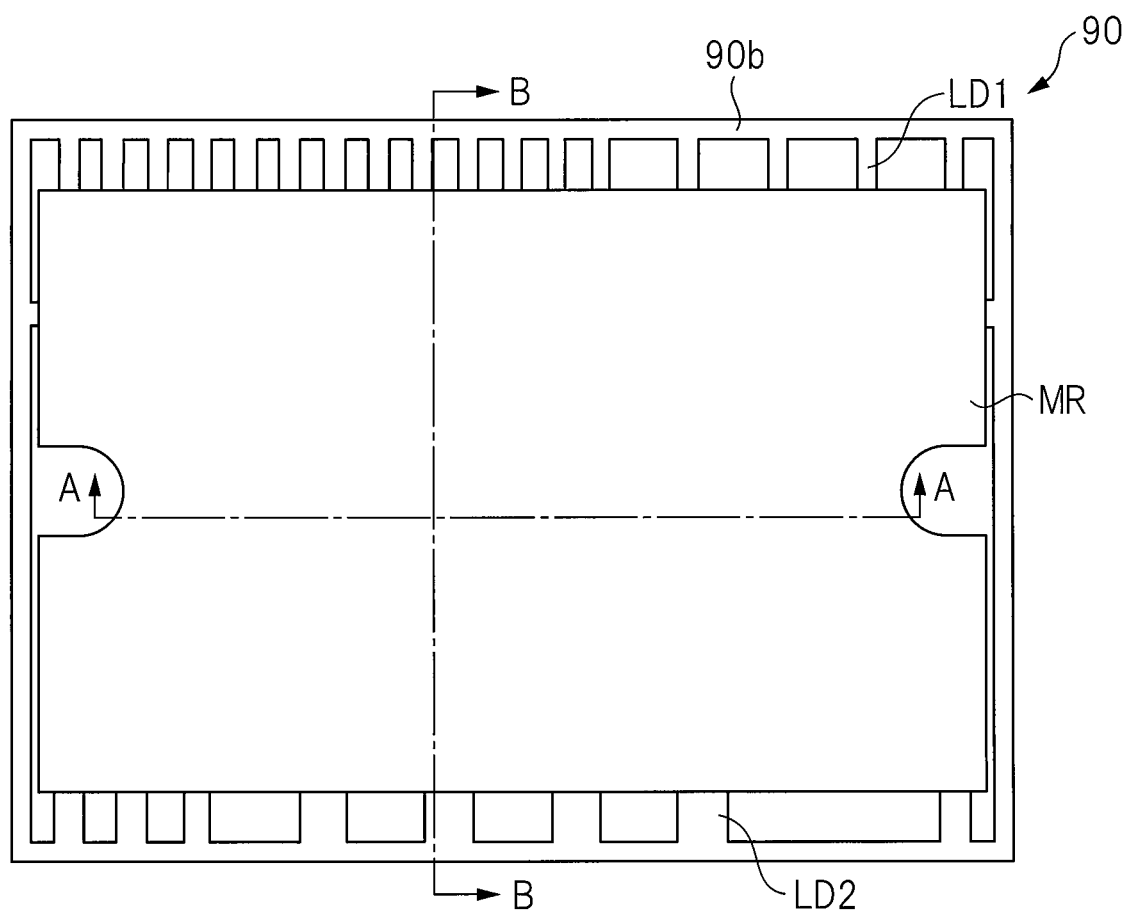
FIG. 34 is a plan view showing a structure in which the molded lead frame is taken out from the mold die.
Figure 35:
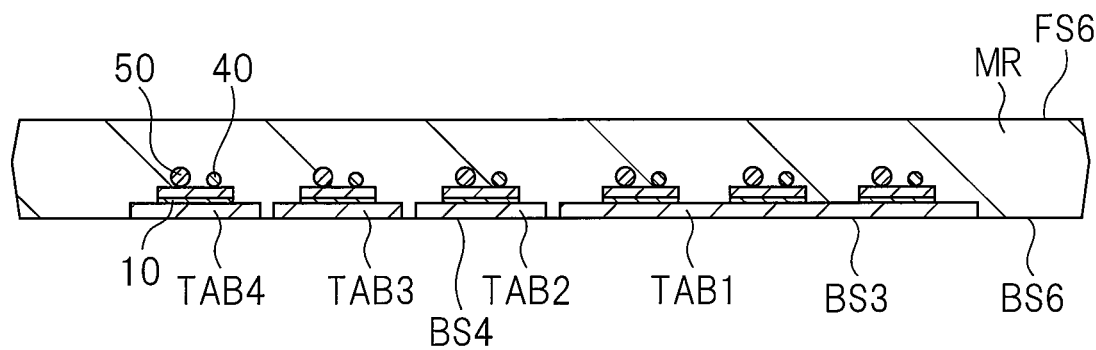
FIG. 35 is a cross-sectional view showing a structure taken along a line A-A in FIG. 34.
Figure 36:
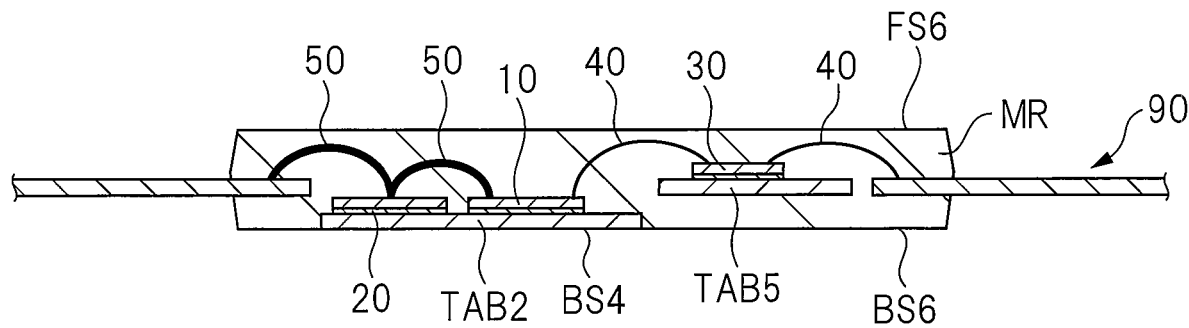
FIG. 36 is a cross-sectional view showing a structure taken along a line B-B of FIG. 34.

FIG. 28 is a cross-sectional view showing a structure obtained by, along a line A-A of FIG. 22, taking a structure in which the wire-bonded lead frame is arranged in a cavity of a mold die in the assembly of the semiconductor module shown in FIG. 1. FIG. 29 is a cross-sectional view showing a structure obtained by, along a line B-B of FIG. 22, taking a structure in which the wire-bonded lead frame is arranged in a cavity of a mold die in the assembly of the semiconductor module shown in FIG. 1, and FIG. 30 is a cross-sectional view showing a start state of resin injection into the cavity in the structure shown in FIG. 28. FIG. 31 is a cross-sectional view showing a start state of the resin injection into the cavity in the structure shown in FIG. 29, FIG. 32 is a cross-sectional view showing a completion state of the resin injection into the cavity in the structure shown in FIG. 28, and FIG. 33 is a cross-sectional view showing a completion state of the resin injection into the cavity in the structure shown in FIG. 29. FIG. 34 is a plan view showing a structure in which the molded lead frame is taken out from the mold die, FIG. 35 is a cross-sectional view showing a structure taken along a line A-A of FIG. 34, and FIG. 36 is a cross-sectional view showing a structure taken along a line B-B of FIG. 34.

After the wire bonding, resin sealing is performed. Here, the plurality of IGBT chips 10, the plurality of diode chips 20, the control chip 30, a part of the plurality of chip mounting portions TAB1 to TAB4, the chip mounting portion TAB5, the plurality of gold wires 40, the plurality of aluminum wires 50, the inner portions of the plurality of leads LD1, and the inner portions of the plurality of leads LD2 are covered with the sealing body MR. At that time, these members are sealed (the sealing body MR is formed) by using the sealing resin 120 shown in FIG. 30 so that each back surface (second surface) of the plurality of chip mounting portions TAB1 to TAB4 is exposed from a back surface BS6 of the sealing body MR having a front surface (first surface) FS6 and the back surface (second surface) BS6 on the opposite side of the front surface.

First, as shown in FIG. 28, the lead frame 90 having the plurality of product forming regions 90a (see FIG. 19) is housed in a cavity 110c of a lower mold 110b of a mold die 110 formed of an upper mold 110a and the lower mold 110b.

After the housing, the upper mold 110a and the lower mold 110b are closed to sandwich the lead frame 90 between the upper mold 110a and the lower mold 110b as shown in FIG. 29. At this time, as shown in FIG. 28 and FIG. 29, each back surface (a back surface BS3, a back surface BS4, or others) of the chip mounting portions TAB1 to TAB4 is brought into close contact with a bottom surface 110d of the cavity 110c of the lower mold 110b. Meanwhile, as shown in FIG. 29, the chip mounting portion TAB5 is floated (separated) from the bottom surface 110d of the cavity 110c.

While each back surface of the chip mounting portions TAB1 to TAB4 is brought into close contact with the bottom surface 110d of the cavity 110c of the lower mold 110b as described above, the sealing resin 120 is injected from a gate 110e (see FIG. 28) of the mold die 110 as shown in FIG. 30. As shown in FIG. 30 and FIG. 31, even if the filling of the sealing resin 120 into a vent hole 110f in the cavity 110c starts, the sealing resin 120 does not run around a portion between each of the chip mounting portions TAB1 to TAB4 and the bottom surface 110d of the cavity 110c since each back surface of the chip mounting portions TAB1 to TAB4 is brought in close contact with the bottom surface 110d of the cavities 110c of the lower mold 110b.

In this state, the filling of the sealing resin 120 into the cavity 110c is completed as shown in FIG. 32 and FIG. 33. Note that the sealing resin 120 is, for example, a thermoplastic resin such as an epoxy-based resin.

Here, for example, by the resin molding in a state in which the insulating layer 70 and the TIM layer 80 are bonded onto each back surface of the chip mounting portions TAB1 to TAB4 exposed from the sealing body MR, the insulating layer 70 and the TIM layer 80 are deteriorated due to the heat of the mold die 110, and therefore, a semiconductor module SA with a desired quality cannot be assembled.

Therefore, when the resin molding for forming the sealing body MR is performed in the assembly of the semiconductor module SA of the present first embodiment, the resin molding is performed without arranging the insulating layer 70 and the TIM layer 80 in the mold die 110. That is, in the assembly of the semiconductor module SA according to the present first embodiment, the insulating layer 70 and the TIM layer 80 are bonded (joined) to the back surface BS6 of the sealing body MR after completion of the resin molding. In this manner, by the bonding of the insulating layer 70 and the TIM layer 80 onto the back surface BS6 of the sealing body MR after the completion of the resin molding, the deterioration of the insulating layer 70 and the TIM layer 80 due to the heat of the mold die 110 can be prevented, so that the desired quality can be obtained in the assembly of the semiconductor module SA.

After the completion of the molding, the lead frame 90 is taken out from the mold die 110 of FIG. 33 as shown in FIG. 34. In the product forming region 90a (see FIG. 19) of the lead frame 90, the sealing body MR is formed. As shown in FIG. 35 and FIG. 36, the back surface BS6 of the sealing body MR has a structure in which each back surface (back surface BS3, back surface BS3, or others) of the chip mounting portions TAB1 to TAB4 is exposed.

5. Plating Formation

Figure 37:
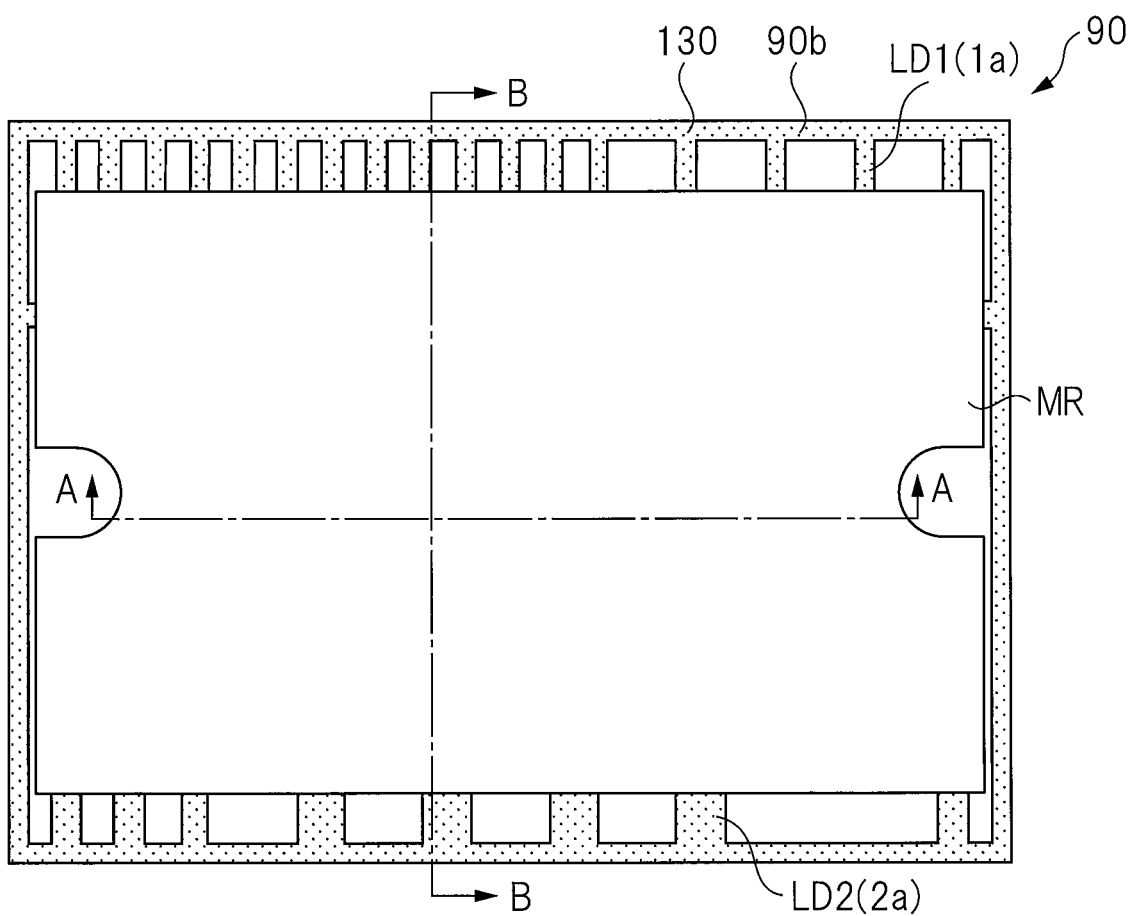
FIG. 37 is a plan view showing the structure after plating formation in the assembly of the semiconductor module shown in FIG. 1.
Figure 38:
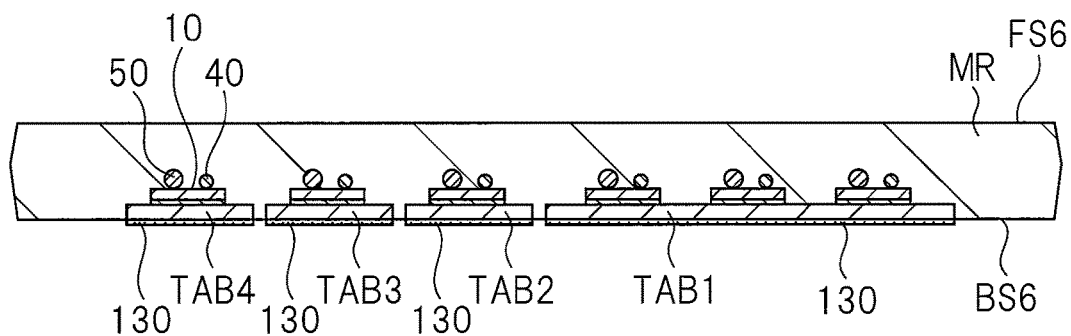
FIG. 38 is a cross-sectional view showing a structure taken along a line A-A of FIG. 37.
Figure 39:
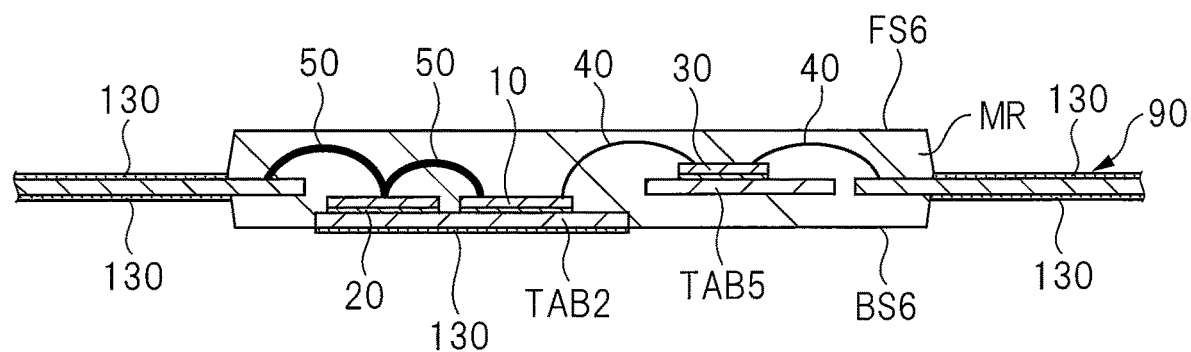
FIG. 39 is a cross-sectional view showing a structure taken along a line B-B of FIG. 37.

FIG. 37 is a plan view showing a structure obtained after plating formation in the assembly of the semiconductor module shown in FIG. 1, FIG. 38 is a cross-sectional view showing a structure taken along a line A-A of FIG. 37, and FIG. 39 is a cross-sectional view showing a structure taken along a line B-B of FIG. 37.

After the resin sealing, the plating formation is performed.

In a plating formation step, as shown in FIG. 37, a plating film 130 which is a metal film is formed as exterior plating on the outer leads (external terminals) 1a and 2a of the respective leads and the frame portion 90b exposed from the sealing body MR, and besides, on the respective back surfaces including the back surfaces such as BS3 and BS4 (second surfaces) of the chip mounting portions TAB1 to TAB4 exposed from the back surface BS6 (second surface) of the sealing body MR as shown in FIG. 38 and FIG. 39.

6. Lead Cutting/Shaping

Figure 40:
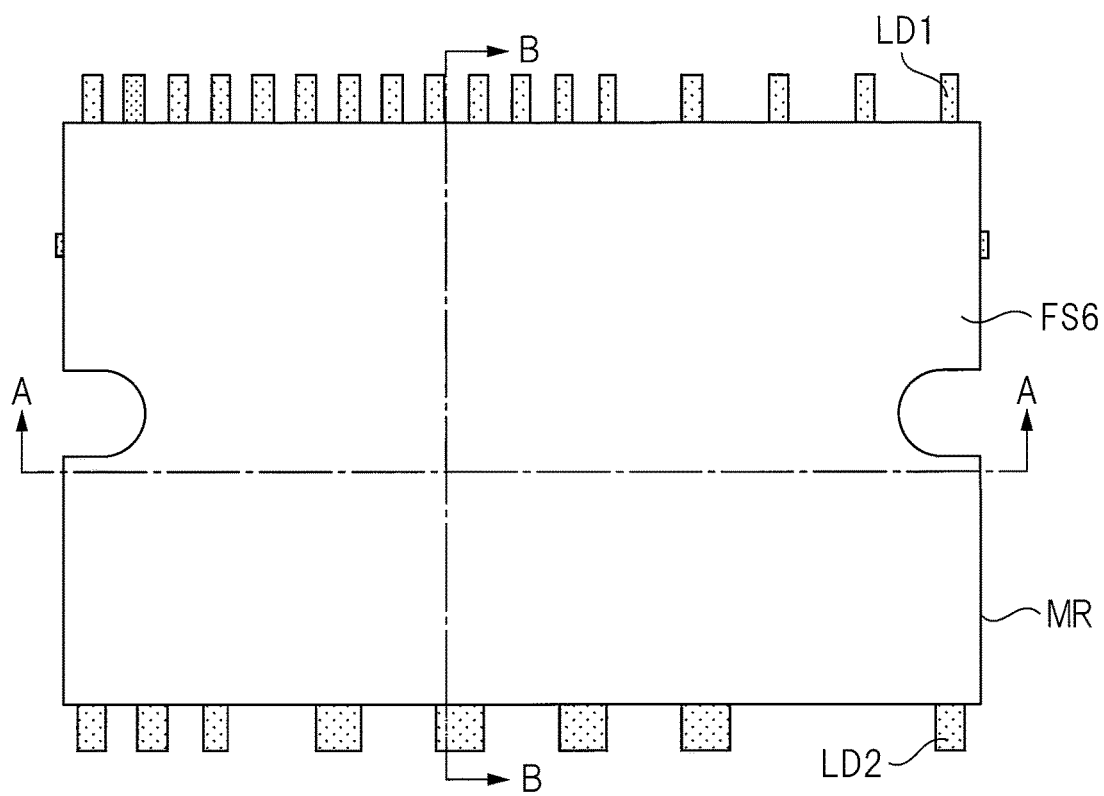
FIG. 40 is a plan view showing a structure after lead cutting/shaping in the assembly of the semiconductor module shown in FIG. 1.
Figure 41:
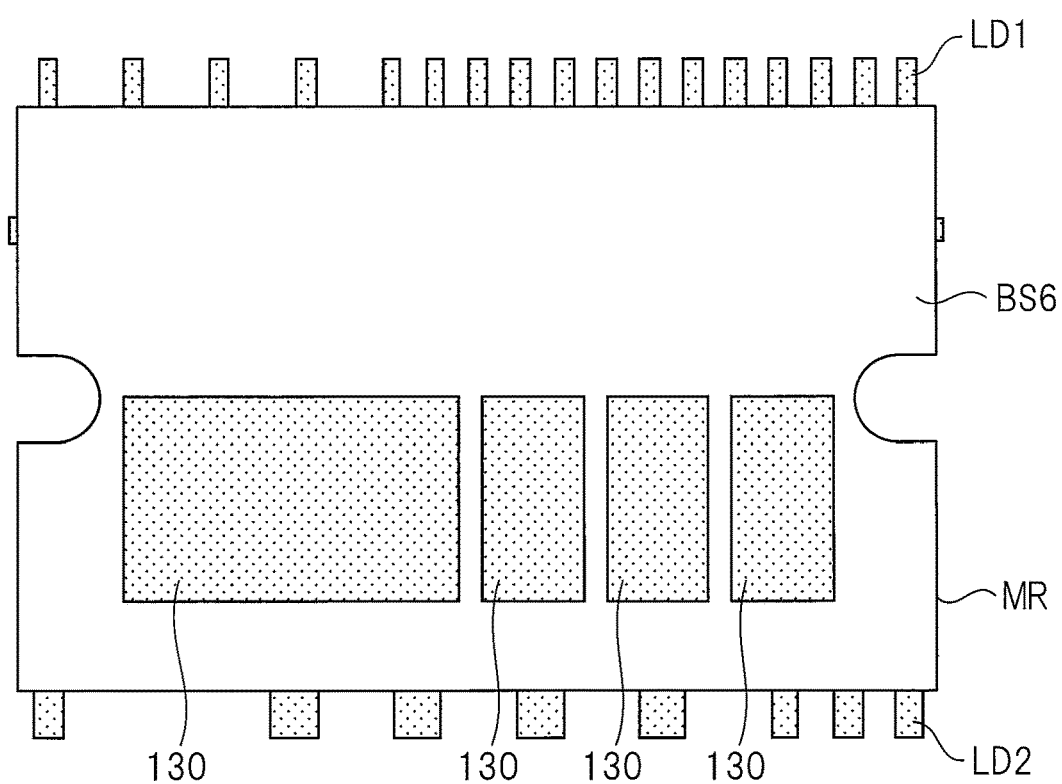
FIG. 41 is a back view showing a structure of the semiconductor module of FIG. 40.
Figure 42:
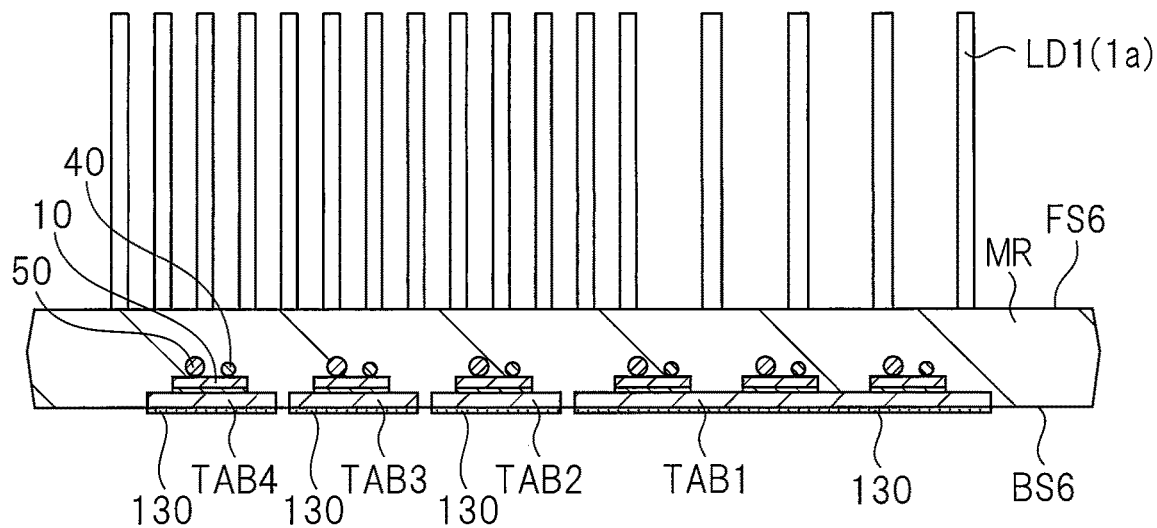
FIG. 42 is a cross-sectional view showing a structure taken along a line A-A in FIG. 40.
Figure 43:
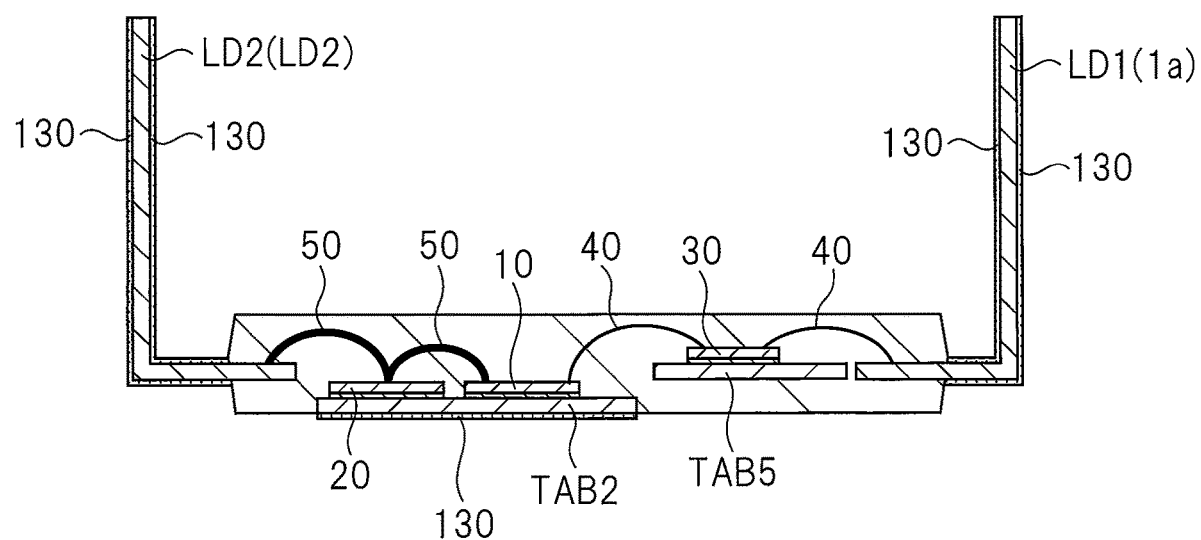
FIG. 43 is a cross-sectional view showing a structure taken along a line B-B of FIG. 40.

FIG. 40 is a plan view showing a structure obtained after lead cutting/shaping in the assembly of the semiconductor module shown in FIG. 1, FIG. 41 is a back view showing a structure of the semiconductor module of FIG. 40, FIG. 42 is a cross-sectional view showing a structure taken along a line A-A in FIG. 40, and FIG. 43 is a cross-sectional view showing a structure taken along a line B-B of FIG. 40.

After the plating formation, the lead cutting/shaping is performed.

In a lead cutting/shaping process, the semiconductor module SA shown in FIG. 1 is separated and individualized (cut) from the frame portion 90b of the lead frame 90 shown in FIG. 19 as shown in FIG. 40 and FIG. 41, and besides, each of the outer leads (external terminals) 1a and 2a is bent as shown in FIG. 42 and FIG. 43. At this time, each of the outer leads 1a and 2a is bent toward the opposite side of the exposed side of each of the chip mounting portions TAB1 to TAB4 (toward the front surface FS6 of the sealing body MR).

7. Bonding of Insulating Layer and TIM Layer

Figure 44:
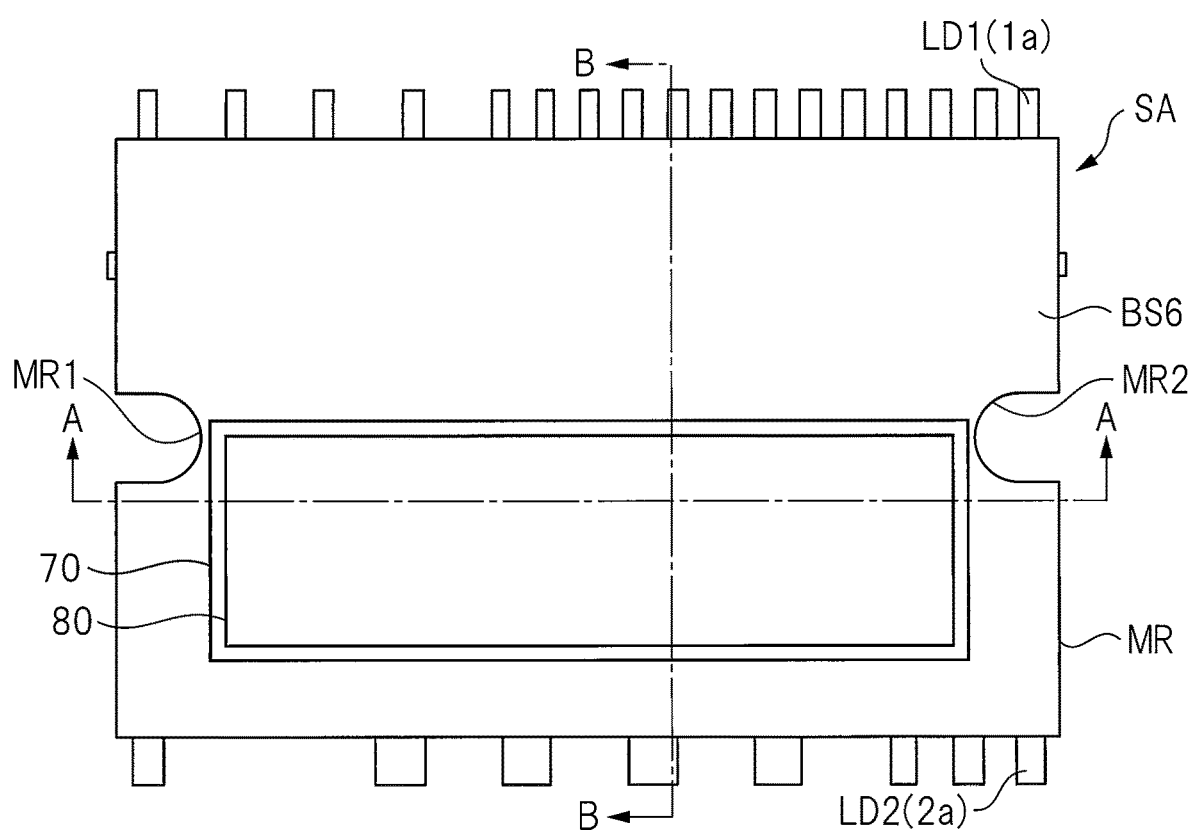
FIG. 44 is a back view showing a structure after bonding of an insulating layer and a TIM layer in the assembly of the semiconductor module shown in FIG. 1.
Figure 45:
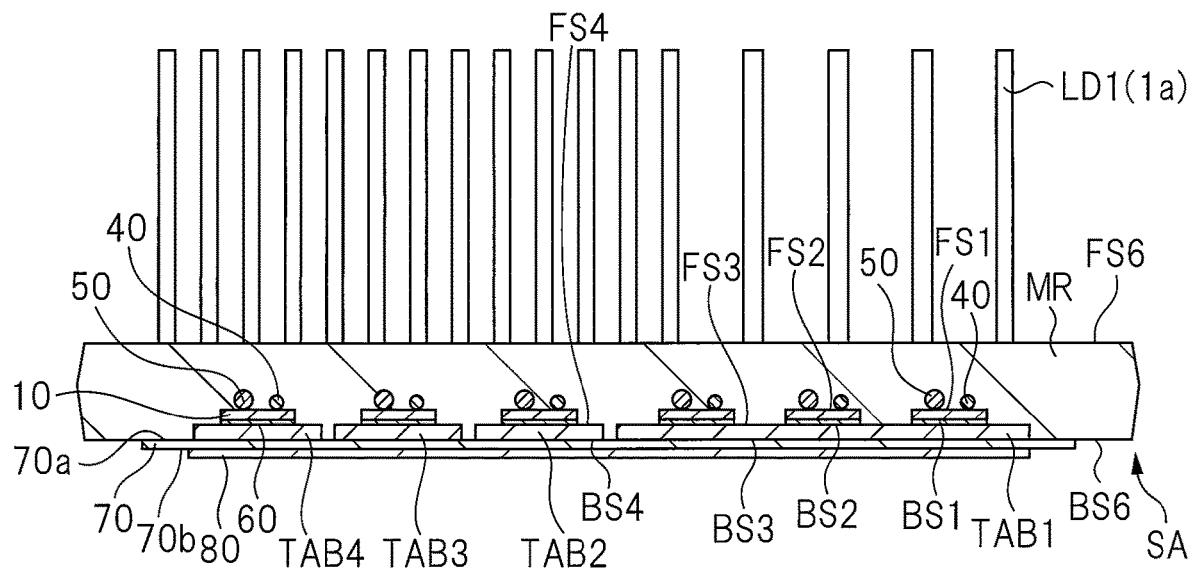
FIG. 45 is a cross-sectional view showing a structure taken along a line A-A of FIG. 44.
Figure 46:
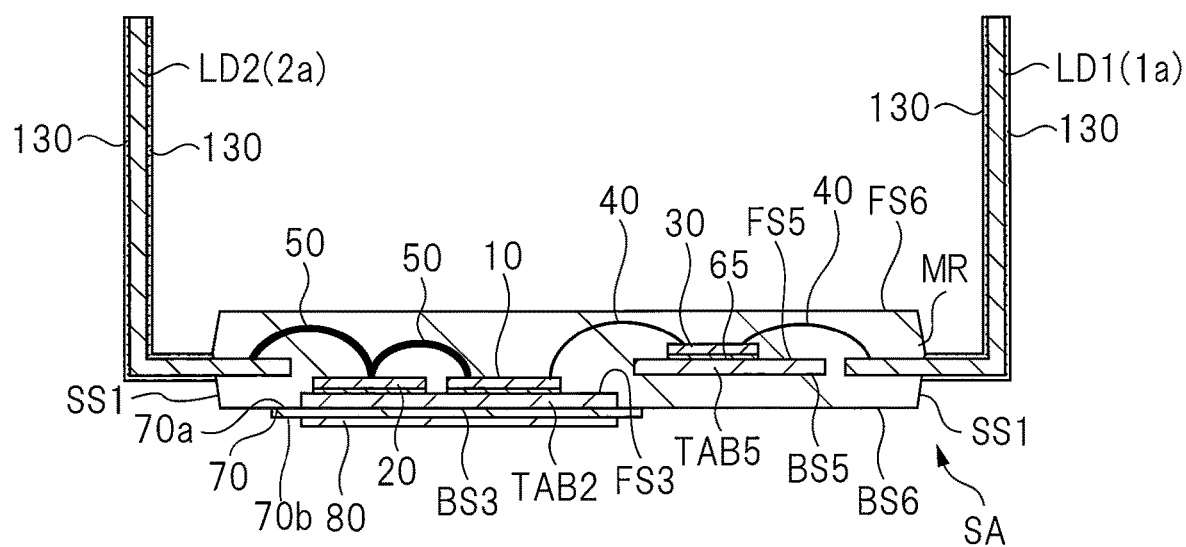
FIG. 46 is a cross-sectional view showing a structure taken along a line B-B of FIG. 44.

FIG. 44 is a back view showing a structure obtained after bonding of the insulating layer and the TIM layer in the assembly of the semiconductor module shown in FIG. 1. FIG. 45 is a cross-sectional view showing a structure taken along a line A-A of FIG. 44, and FIG. 46 is a cross-sectional view showing a structure taken along a line B-B of FIG. 44.

After the lead cutting/shaping, the bonding of the insulating layer and the TIM layer is performed.

After the lead cutting/shaping, first, the insulating layer 70 is bonded to the back surface (second surface) BS6 of the sealing body MR so as to cover the respective back surfaces of the chip mounting portion TAB1 to TAB4 including the back surface (second surface) BS3 of the chip mounting portion TAB1 and the back surface (second surface) BS4 of the chip mounting portion TAB2. The insulating layer 70 is, for example, an insulating resin sheet made of ceramic or an insulating resin material, and is bonded to the back surface BS6 of the sealing body MR by thermocompression bonding.

Here, the insulating layer 70 has a front surface (first surface) 70a and a back surface (second surface) 70b opposite to the front surface 70a, the front surface 70a facing the back surface BS3 of the chip mounting portion TAB1, the back surface BS4 of the chip mounting portion TAB2, and the back surface BS6 of the sealing body MR. Therefore, in this case, the front surface 70a of the insulating layer 70 is bonded to the back surface BS6 of the sealing body MR so as to cover each back surface of the chip mounting portions TAB1 to TAB4 exposed from the back surface BS6.

After the bonding of the insulating layer 70 to the sealing body MR, a TIM layer (heat transfer material layer) 80 is bonded to the insulating layer 70. In other words, the TIM layer 80 is laminated and bonded on the insulating layer 70. Note that the TIM layer 80 is, for example, a resin sheet material containing carbon particles, a silicone resin layer or a heat dissipation grease layer containing metal or ceramics, or others.

As shown in FIG. 44, in a plan view (back view), a region of the TIM layer 80 is included in a region of the insulating layer 70. That is, a size of the TIM layer 80 in a plan view is smaller than a size of the insulating layer 70, and an end portion (outer peripheral portion) of the TIM layer 80 is located at a position inside an outer peripheral portion of the insulating layer 70. In other words, the insulating layer 70 protrudes from each of four sides of a rectangular TIM layer 80. As a result, by the insulating layer 70, a withstanding voltage between the TIM layer 80 and the exposed chip mounting portions TAB1 to TAB4 (having the potentials) can be ensured (details will be described later with reference to FIG. 50).

As shown in FIG. 45 and FIG. 46, each of the plurality of diode chips 20 and the plurality of IGBT chips 10 which are the first semiconductor chip and the second semiconductor chip is located inside the region of the TIM layer 80.

Further, in a plan view shown in FIG. 44, the sealing body MR has a through hole (first through hole) MR1 and a through hole (second through hole) MR2 penetrating from the front surface (first surface) FS6 to the back surface (second surface) BS6 of the sealing body MR shown in FIG. 45, respectively. The through hole MR1 and the through hole MR2 are located at the center of two facing short sides of the rectangular back surface (second surface) BS6 of the sealing body MR. Then, in the assembly of the semiconductor module SA, the insulating layer 70 and the TIM layer 80 are bonded (joined) so that the insulating layer 70 and the TIM layer 80 are located between the through hole MR1 and the through hole MR2.

In the assembly of the semiconductor module SA according to the present first embodiment, note that it is preferable to cut and shape the outer leads (portions) 1a and 2a of the plurality of respective leads exposed from the sealing body MR after forming the sealing body MR by the resin mold and before bonding the insulating layer 70 to the sealing body MR. That is, it is preferable to bond the insulating layer 70 and the TIM layer 80 to the sealing body MR after forming the sealing body MR by the resin mold, and then, cutting and shaping each of the outer leads 1a and 2a.

By such assembly as bonding the insulating layer 70 and the TIM layer 80 to the sealing body MR after cutting and shaping each of the outer leads 1a and 2a, the insulating layer 70 and the TIM layer 80 can be also bonded at a customer (user) site after delivery. In this manner, variation in the assembly procedure of the semiconductor module SA can increase.

However, the insulating layer 70 and the TIM layer 80 may be bonded at any timing as long as it is after the resin molding, for example, may be after the plating formation step or others.

In this manner, the assembly of the semiconductor module SA shown in FIG. 1 is completed.

Figure 47:
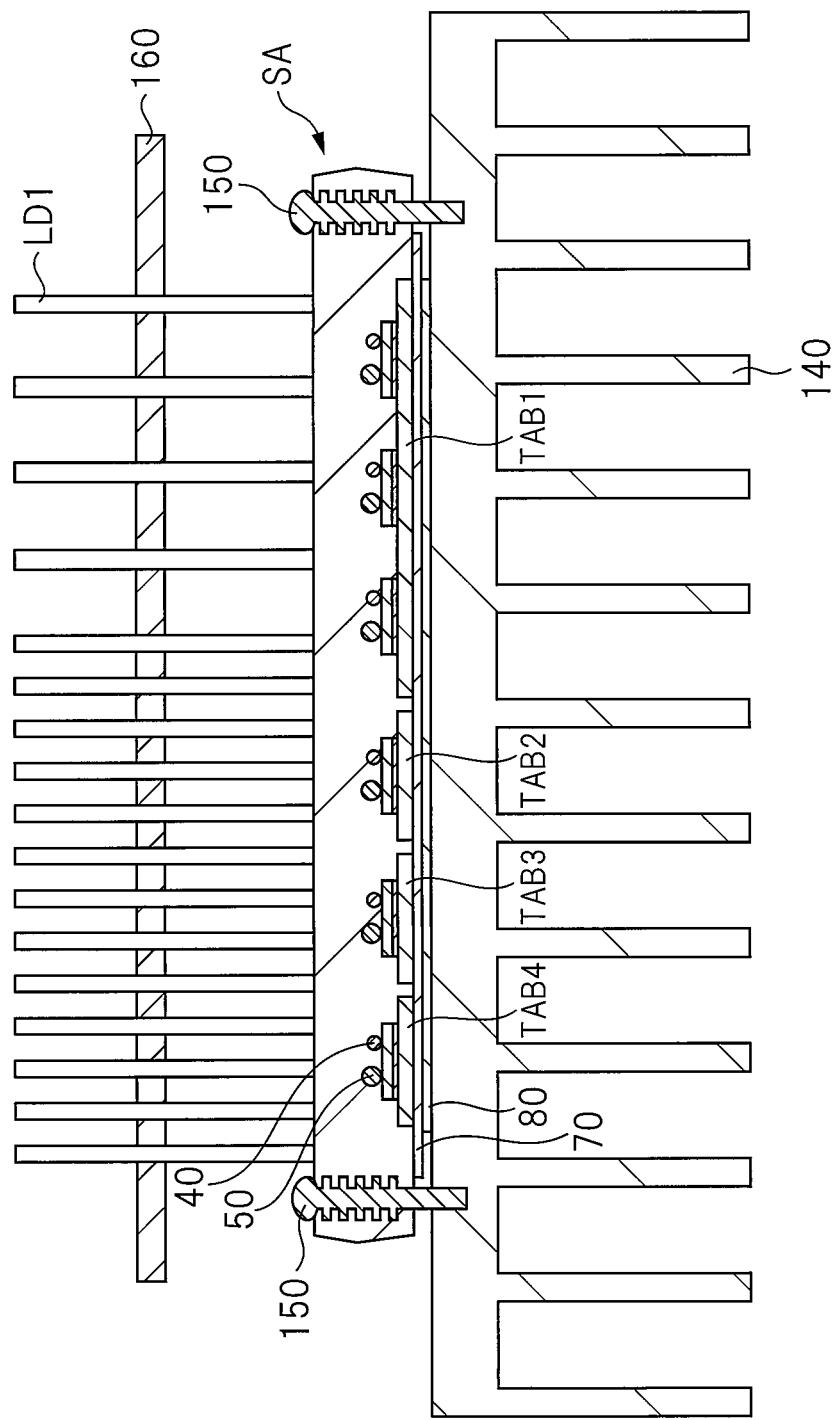
FIG. 47 is a cross-sectional view showing a structure obtained by taking, along a line A-A of FIG. 44, a structure in which the semiconductor module shown in FIG. 44 is mounted on a heat sink.
Figure 48:
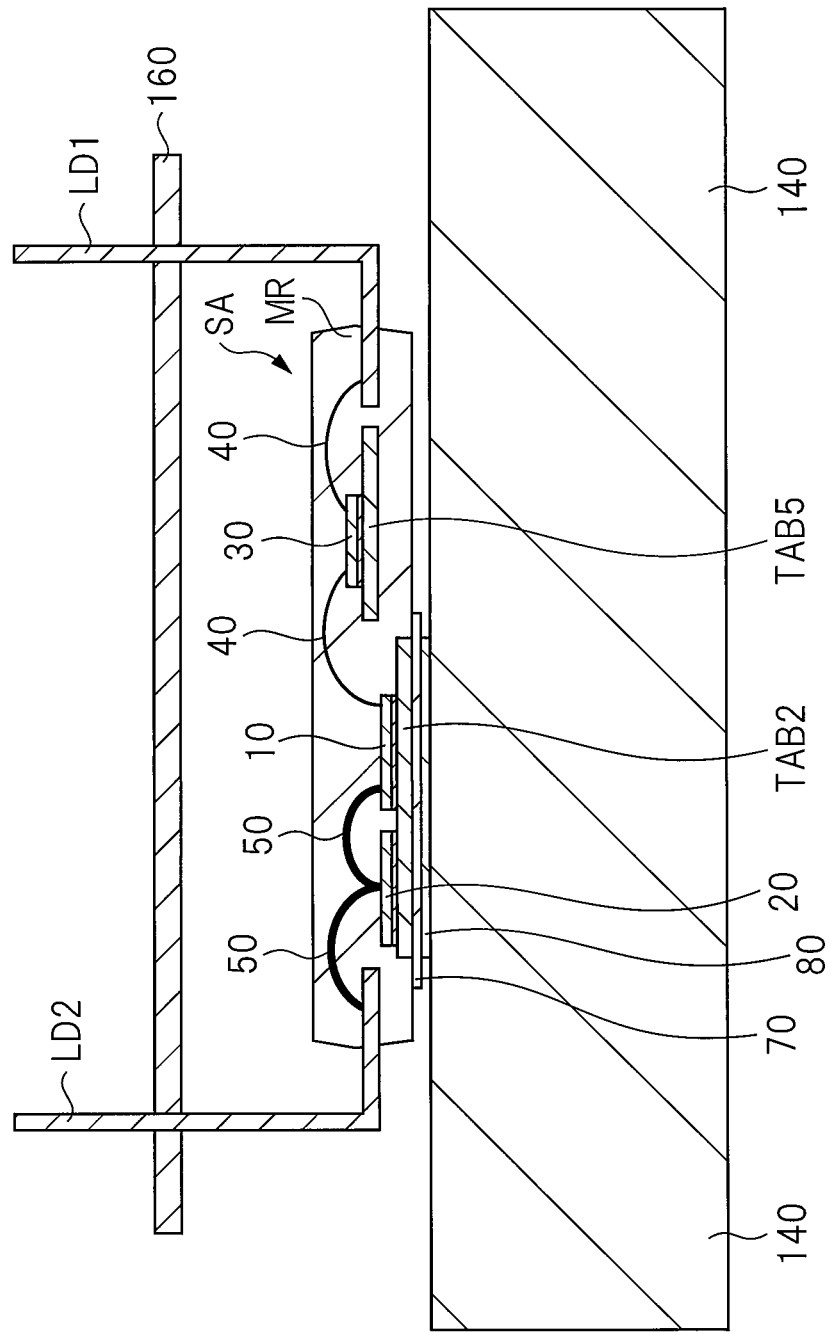
FIG. 48 is a cross-sectional view showing a structure obtained by taking, along a line B-B of FIG. 44, the structure in which the semiconductor module shown in FIG. 44 is mounted on the heat sink.
Figure 49:
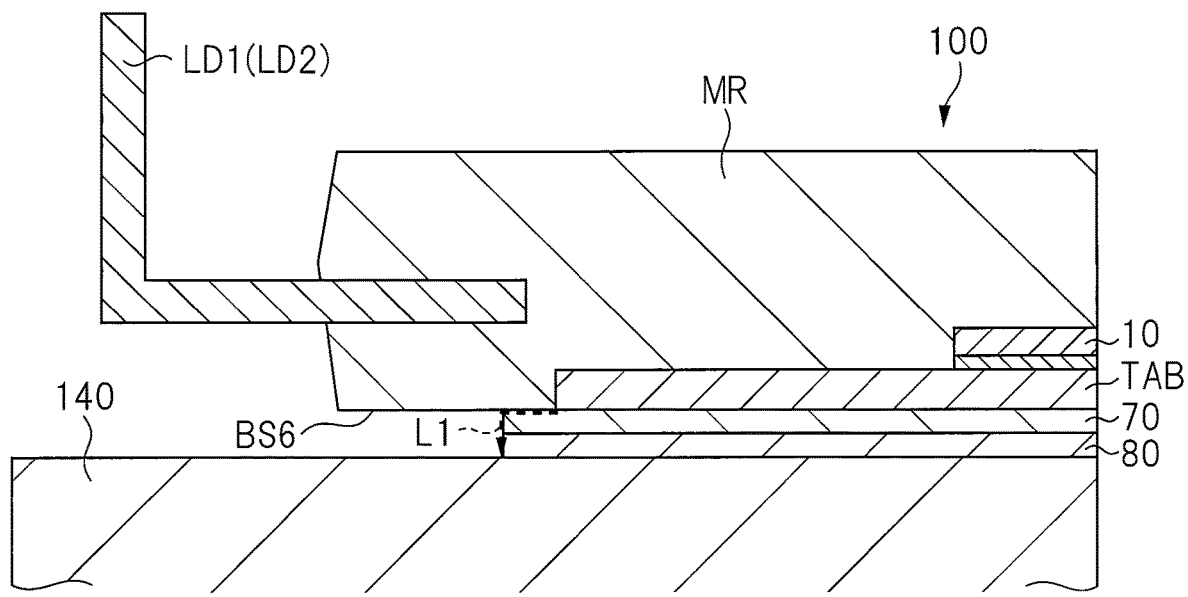
FIG. 49 is a partial cross-sectional view showing a structure of a semiconductor module having been compared and studied by the present inventors.

Next, a mounting structure of the semiconductor module SA according to the present first embodiment will be described. FIG. 47 is a cross-sectional view showing a structure obtained by, along a line A-A of FIG. 44, taking a structure in which the semiconductor module shown in FIG. 44 is mounted on a heat sink, and FIG. 48 is a cross-sectional view showing a structure obtained by, along a line B-B of FIG. 44, taking the structure in which the semiconductor module shown in FIG. 44 is mounted on the heat sink. FIG. 49 is a partial cross-sectional view showing a structure of a semiconductor module compared and studied by the present inventors, and FIG. 50 is a partial cross-sectional view showing a structure of the semiconductor module of the present first embodiment.

As shown in FIG. 47, the semiconductor module SA has a plurality of power transistors, and therefore, has large heat generation during its operation. Therefore, as shown in FIG. 47, when the semiconductor module SA is mounted on a mounting substrate such as a printed circuit board (PCB) substrate 160, the heat sink 140 is attached to the semiconductor module SA. In other words, the semiconductor module SA is mounted on the heat sink 140. At that time, as shown in FIG. 47 and FIG. 48, a screw member 150 is attached to each of through hole MR1 and through hole MR2 of FIG. 44, and the sealing body MR and the heat sink 140 are joined to each other by the screw member 150. That is, by fastening with the screw member 150, the sealing body MR of the semiconductor module SA is attached to the heat sink 140.

As a result, when a distance between the heat sink 140 and any exposed portion of the chip mounting portions TAB1 to TAB4 is too small, the withstanding voltage between the semiconductor module SA and the heat sink 140 cannot be secured. FIG. 49s shows a structure compared and studied by the inventors of the present invention in a case in which the insulating layer 70 and the TIM layer 80 bonded to the back surface BS6 of the sealing body MR are almost the same in a size as each other. In the structure shown in FIG. 49, for example, a creepage distance L1 between an edge of the chip mounting portion TAB and the heat sink 140 is small.

Figure 50:
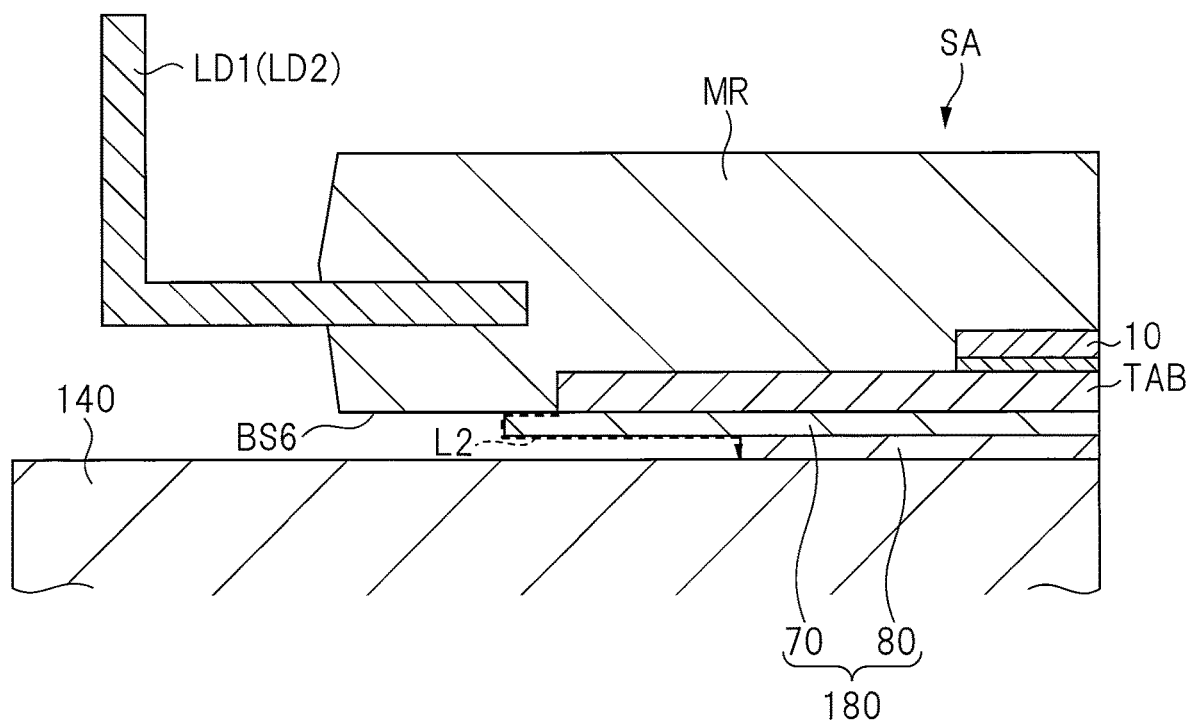
FIG. 50 is a partial cross-sectional view showing the structure of the semiconductor module of the present first embodiment.

Meanwhile, in the structure of the semiconductor module SA of the present first embodiment shown in FIG. 50, the insulating layer 70 is bonded to the back surface BS6 of the sealing body MR so as to cover the chip mounting portion TAB1 (the chip mounting portions TAB1 to TAB4 although only the chip mounting portion TAB1 is illustrated here), and besides, the size of the TIM layer 80 is smaller than the size of the insulating layer 70 (the size of the insulating layer 70>the size of the TIM layer 80). As a result, a creepage distance L2 between an edge of the chip mounting portion TAB1 and the heat sink 140 is much larger than the creepage distance L1 of the structure of FIG. 49 (L2>L1).

That is, the relation of "the size of the insulating layer 70>the size of the TIM layer 80" is established, and besides, the insulating layer 70 and the TIM layer 80 are bonded to each other so that the insulating layer 70 protrudes from all sides of the rectangular TIM layer 80 in a plan view, so that the creepage distance L2 between the edge portion of the chip mounting portion TAB1 and the heat sink 140 can be made large, and an amount of the withstanding voltage caused between the semiconductor module SA and the heat sink 140 can be increased. As a result, a withstanding voltage of the semiconductor module SA can be increased.

Figure 51:
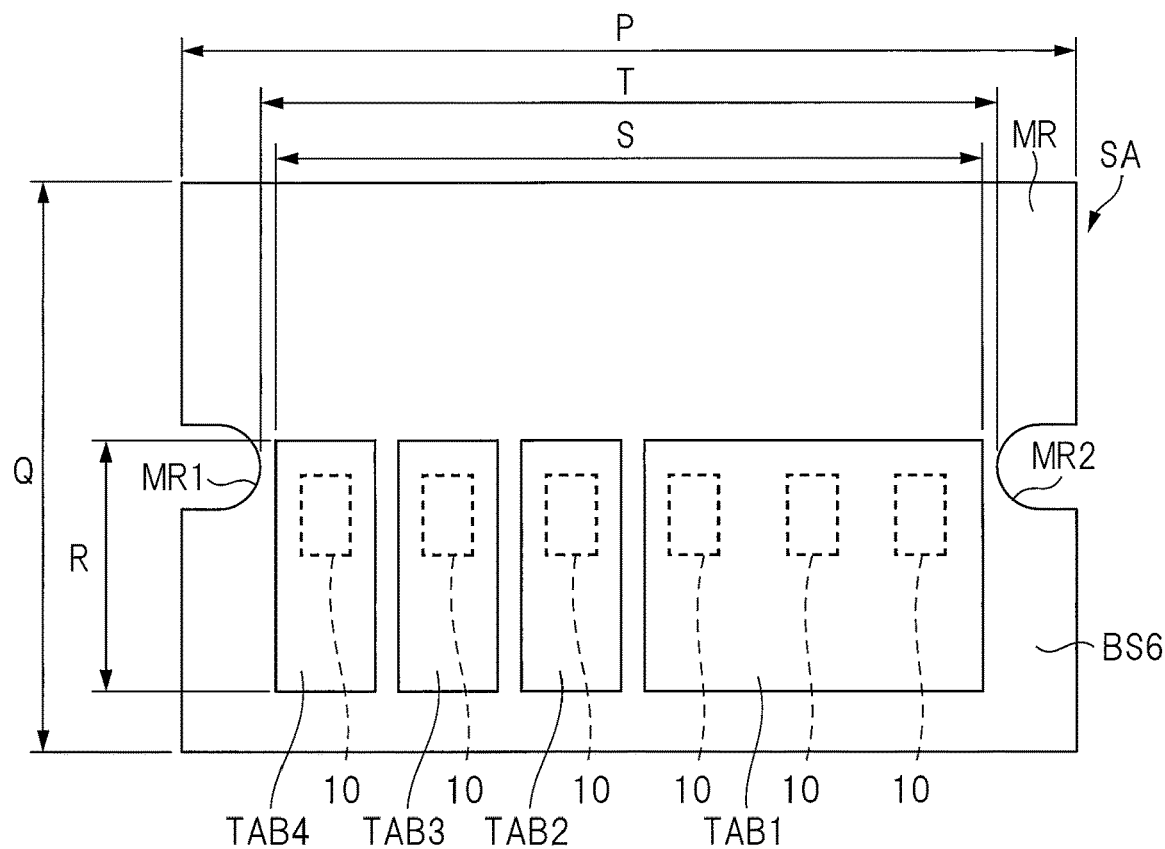
FIG. 51 is a back view showing an example of a dimension of each portion of an exposed portion of the chip mounting portion in the structure on the back side of the semiconductor module of the present first embodiment.

Next, a specific example of the relation between the module size of the semiconductor module SA according to the present first embodiment and the sizes of the insulating layer and the TIM layer will be described. FIG. 51 is a back view showing an example of dimensions of each portion of the exposed portion of the chip mounting portion in the structure of the back side of the semiconductor module of the present first embodiment, and FIG. 52 is a back view showing a structure of the back side of the semiconductor module of the present first embodiment.

The semiconductor module SA shown in FIG. 51 shows an example of each dimension in its back view. The size of a plan view of the back surface BS6 of the sealing body MR is, for example, a lateral length P=38.0 mm and a longitudinal length Q=24.0 mm. A distance from the through hole MR1 to the through hole MR2 in the sealing body MR is, for example, T=31.8 mm. Further, the size of the exposed portion of the entire chip mounting portions TAB1 to TAB4 is, for example, S=29.9 mm and R=10.4 mm. However, it is needless to say that these dimensions are merely examples and are not limited to the above-described numerical values.

Figure 52:
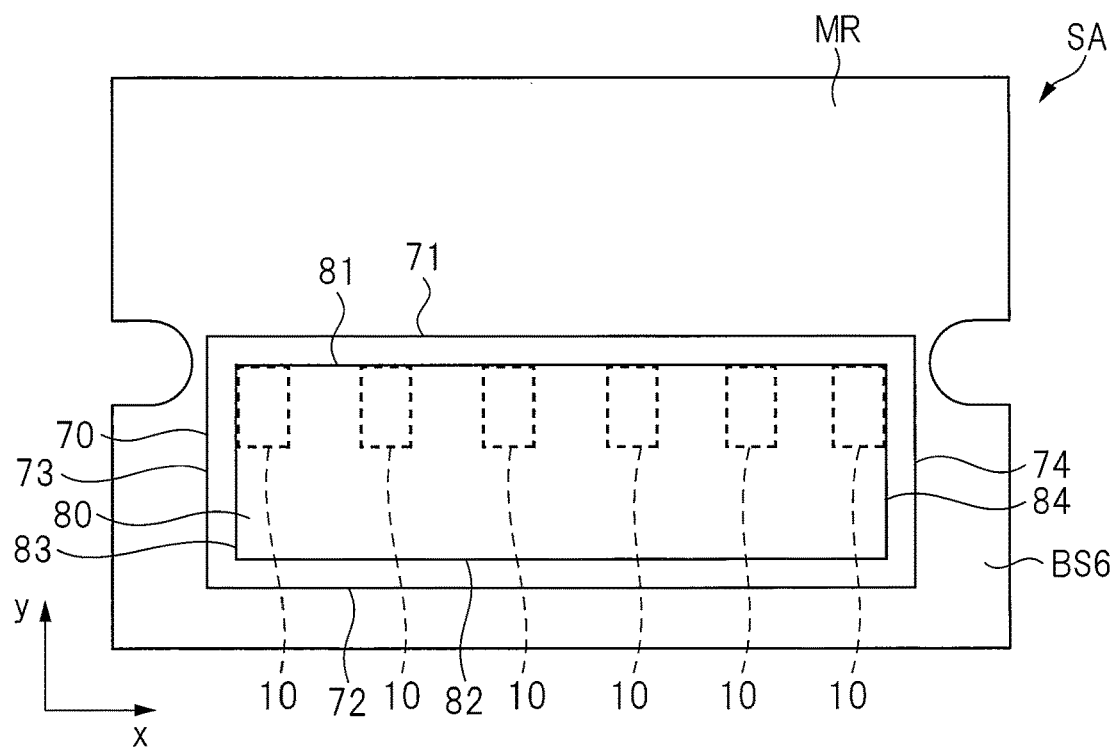
FIG. 52 is a back view showing the structure on the back side of the semiconductor module of the present first embodiment.

FIG. 52 shows each size and each bonding position of the insulating layer 70 and the TIM layer 80 with respect to the back surface structure of FIG. 51. As shown in FIG. 52, in the semiconductor module SA of the present first embodiment, the size of the insulating layer 70 is configured so as to have a relation of "the size of the insulating layer 70 the size of the exposed portion of each of the chip mounting portions TAB1 to TAB4". That is, the insulating layer 70 is the same in the size as the exposed portion of each of the chip mounting portions TAB1 to TAB4 or larger in the size than the exposed portion of each of the chip mounting portions TAB1 to TAB4.

The size of the insulating layer 70 is configured so as to establish the relation of "the size of the insulating layer 70≥the size of the exposed portion of each of the chip mounting portions TAB1 to TAB4, so that the size of the insulating layer 70 can be designed to be a size in consideration of positional shift at the time of bonding the insulating layer 70 (a margin for the positional shift can be increased).

The size of the insulating layer 70 is configured so as to establish the relation of "the size of the insulating layer 70>the size of the TIM layer 80". As a result, as shown in the structure of FIG. 50, the creepage distance L2 between the edge of the chip mounting portion TAB1 and the heat sink 140 obtained when the semiconductor module SA is mounted on the heat sink 140 can be made large, so that the withstanding voltage can be secured.

Next, the minimum size of each of an insulating layer 70 and a TIM layer 80 in a semiconductor module SA according to a modification example of the present first embodiment will be described.

Figure 53:
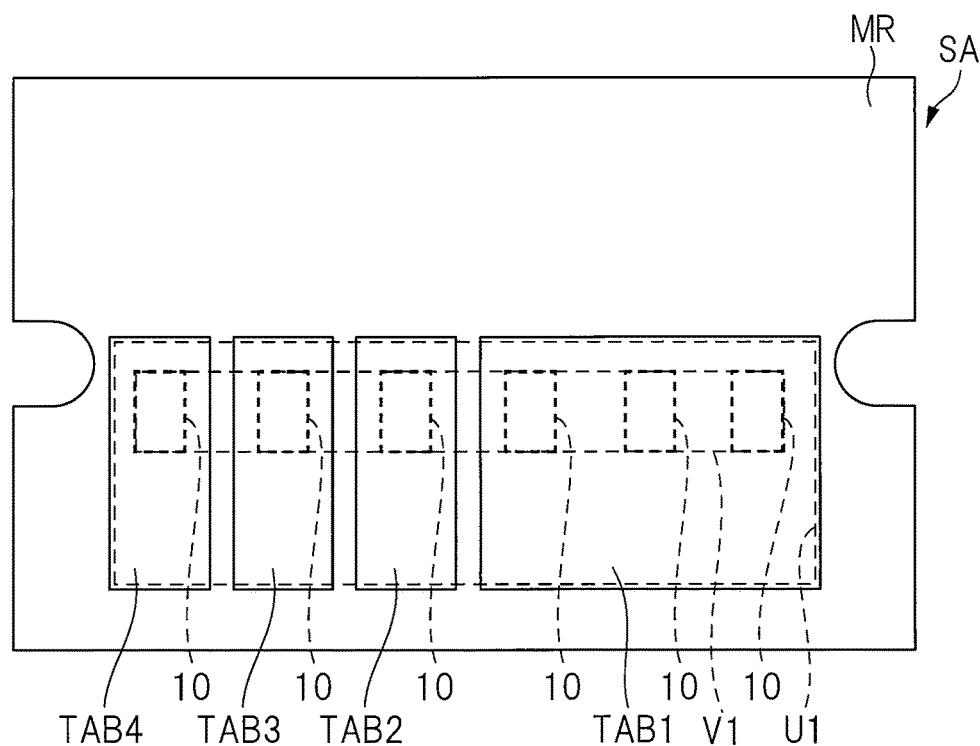
FIG. 53 is a back view showing an exposed structure of a chip mounting portion in a structure on a back side on a semiconductor module according to a modification of the present first embodiment.
Figure 54:
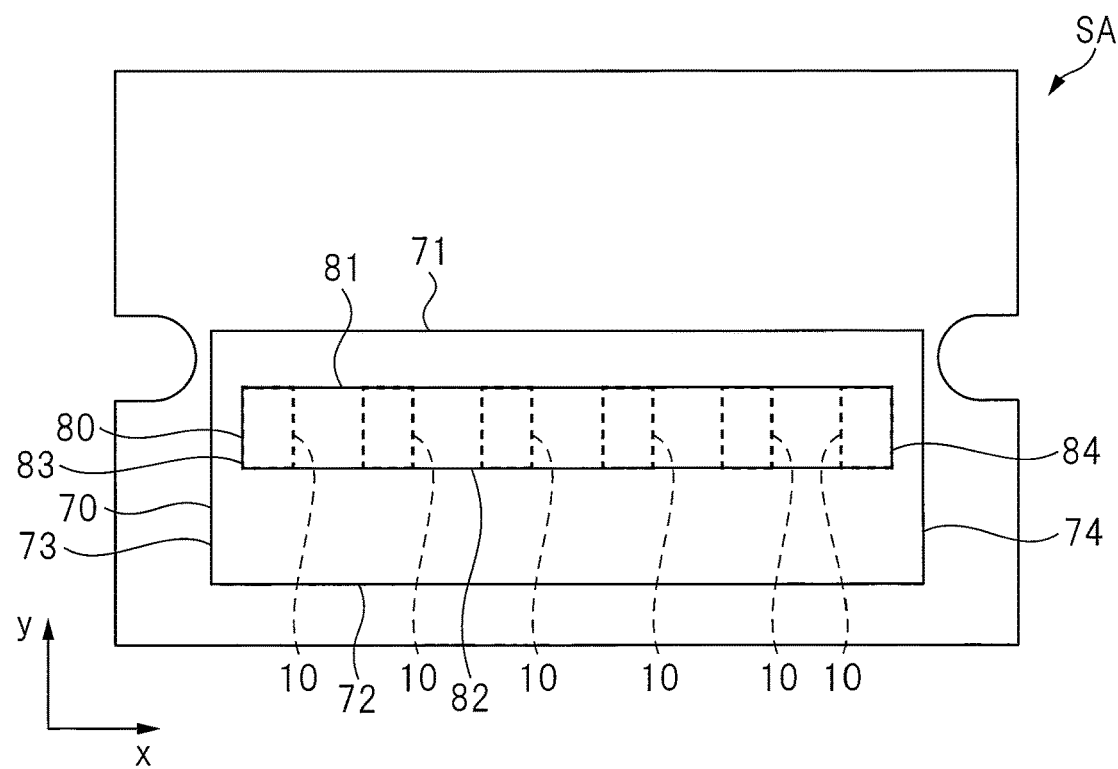
FIG. 54 is a back view showing the structure on the back side of the semiconductor module according to the modification of the present first embodiment.

FIG. 53 is a back view showing the exposed structure of the chip mounting portion in the structure on the back side of the semiconductor module according to the modification example of the present first embodiment, and FIG. 54 is a back view showing a structure on the back side of the semiconductor module according to the modification example of the present first embodiment.

Since a purpose for using the insulating layer 70 in the semiconductor module SA is insulation, it is necessary to cover at least the exposed portions (region U1 shown in FIG. 53) of the chip mounting portions TAB1 to TAB4. That is, the minimum size of the insulating layer 70 is the same as the size of the exposed portions (region U1) of the chip mounting portions TAB1 to TAB4 (the minimum dimension of the insulating layer 70=the dimension of the exposed portions of the chip mounting portions). Therefore, as shown in FIG. 54, the insulating layer 70 is bonded to at least a region corresponding to the region U1 of FIG. 53.

Meanwhile, a purpose for using the TIM layer 80 is heat dissipation. Thus, the minimum size of the TIM layer 80 is as large as covering at least a heating body region (for example, the IGBT chip 10). That is, the minimum size of the TIM layer 80 is as large as a size of a region V1 shown in FIG. 53 (the minimum dimension of the TIM layer 80=the dimension of the region of the whole chip). Therefore, as shown in FIG. 54, the TIM layer 80 is bonded to at least a region corresponding to the region V1 of FIG. 53.

By reducing the sizes of the insulating layer 70 and the TIM layer 80, a member cost in the assembly of the semiconductor module SA can be reduced.

A case with the relation of "the size of the insulating layer 70>the size of the TIM layer 80" and with the state in which "the region of the TIM layer 80 is included in the region of the insulating layer 70 in a plan view" also includes a case with a state in which an edge of the region of the TIM layer 80 is in contact with an edge of the region of the insulating layer 70 although not illustrated. However, in order to secure the creepage distance L2, the insulating layer 70 and the TIM layer 80 are preferably the same as each other in the size and the positional relation as shown in FIG. 52 and FIG. 54. More specifically, in a plan view, the insulating layer 70 has: a first side 71 extending in a first direction (x direction); a second side 72 on the opposite side of the first side 71; a third side 73 extending in a second direction (y direction) crossing the first direction (x direction); and a fourth side 74 opposite to the third side 73. The TIM layer 80 has: a fifth side 81 extending in the first direction (x direction); a sixth side 82 on the opposite side of the fifth side 81; a seventh side 83 extending in the second direction (y direction); and an eighth side 84 on the opposite to the seventh side 83. In a plan view, the fifth side 81 of the TIM layer 80 is located between the first side 71 of the insulating layer 70 and the second side 72 of the insulating layer 70. The sixth side 82 of the TIM layer 80 is located between the second side 72 of the insulating layer 70 and the fifth side 81 of the TIM layer 80. Further, the seventh side 83 of the TIM layer 80 is located between the third side 73 of the insulating layer 70 and the fourth side 74 of the insulating layer 70. The eighth side 84 of the TIM layer 80 is located between the fourth side 74 of the insulating layer 70 and the seventh side 83 of the TIM layer 80. The insulating layer 70 and the TIM layer 80 preferably have the above-described size and the positional relation. That is, the relation of "the size of the insulating layer 70>the size of the TIM layer 80", the state in which "the region of the TIM layer 80 is included in the region of the insulating layer 70 in a plan view", and the state in which "the edge of the region of the TIM layer 80 is spaced inward from the edge of the region of the insulating layer 70 in a plan view" are most preferable.

In the present first embodiment, as shown in FIG. 52 and FIG. 54, note that each of the planar shape of the TIM layer 80 and the planar shape of the insulating layer 70 is described as a substantially rectangular shape. However, each of the planar shape of the TIM layer 80 and the planar shape of the insulating layer 70 is not limited thereto, and may be a substantially circular shape or a substantially polygonal shape.

<Effect>

According to the semiconductor module SA of the present first embodiment, heat can be directly transferred from the chip mounting portions TAB1 to TAB4 to the heat sink 140 or others through the insulating layer 70 and the TIM layer 80, and therefore, heat dissipation of the semiconductor module SA can be improved. As a result, the reliability (performance) of the semiconductor module SA can be improved.

By allowing the TIM layer 80 to be included in the insulating layer 70, that is, by making the TIM layer 80 smaller than the insulating layer 70, the insulating property between the sealing body MR and the heat sink 140 of the semiconductor module SA can be improved. This means that the withstanding voltage of the semiconductor module SA can be ensured, and as a result, the reliability of the semiconductor module SA can be improved.

Further, the TIM layer 80 is bonded so as to be included in the insulating layer 70, so that occurrence of short circuit among the chip mounting portions TAB1 to TAB4 when being mounted on the heat sink 140 or others can be prevented.

The TIM layer 80 is bonded to the region corresponding to the heating body region (for example, the IGBT chip 10), so that the heat dissipation of the semiconductor module SA can be improved.

The insulating layer 70 and the TIM layer 80 are bonded to the back surface BS6 of the sealing body MR after the resin molding in the assembly of the semiconductor module SA, so that a component cost can be smaller than that of a semiconductor module having a structure that exposes a ceramic plate or a metal substrate. As a result, an assembly cost of the semiconductor module SA can be reduced.

In the foregoing, the invention made by the present inventors has been concretely described based on the embodiments. However, it is needless to say that the present invention is not limited to the foregoing embodiments and various modifications can be made within the scope of the present invention.

Second Embodiment

Figure 55:
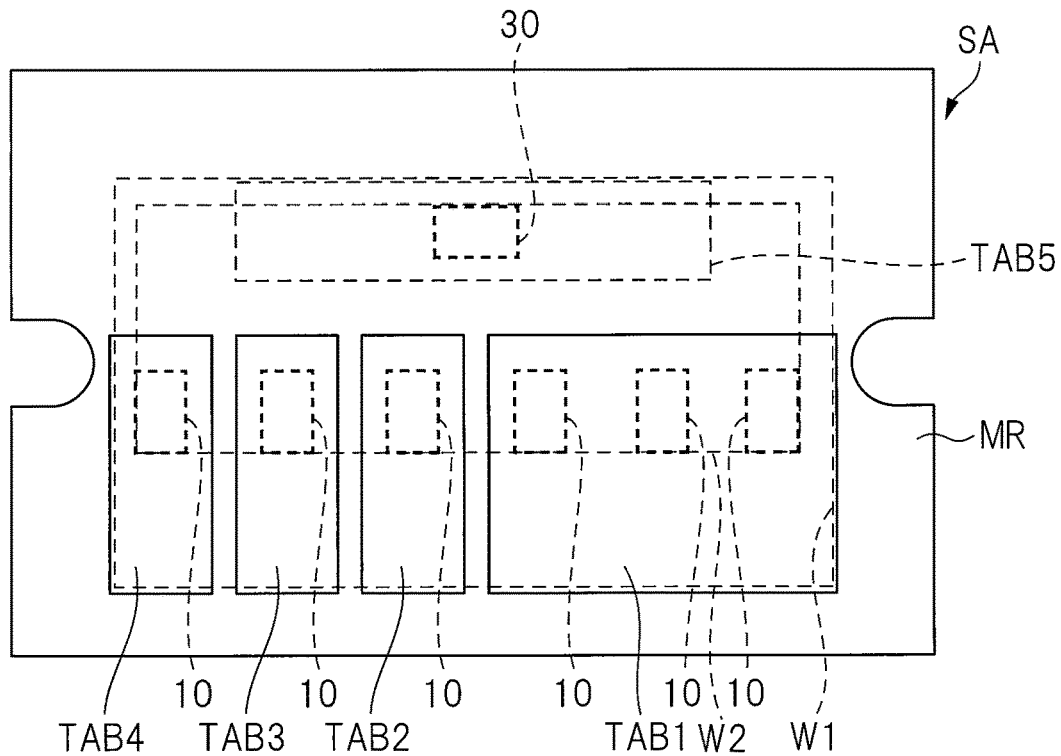
FIG. 55 is a back view showing an exposed structure of a chip mounting portion in a structure on a back side on a semiconductor module according to a second embodiment.
Figure 56:
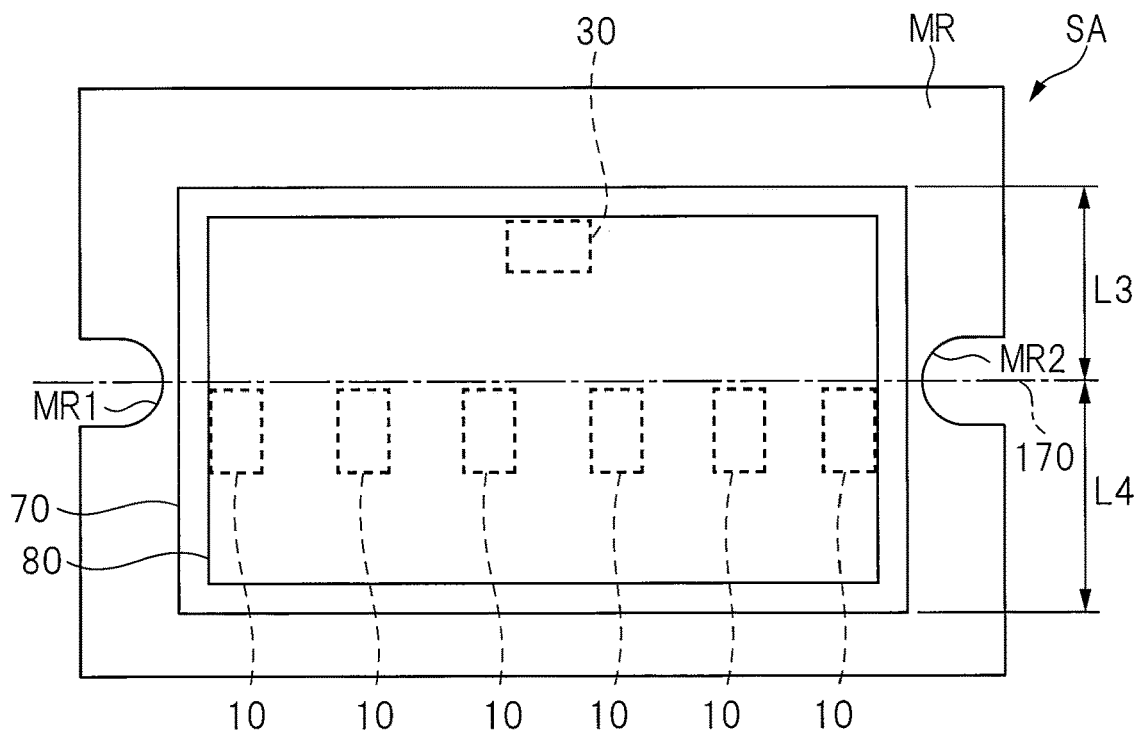
FIG. 56 is a back view showing the structure on the back side of the semiconductor module according to the present second embodiment.

FIG. 55 is a back view showing an exposed structure of a chip mounting portion in a structure on a back side of a semiconductor module according to the present second embodiment, and FIG. 56 is a back view showing a structure on the back side of the semiconductor module of the present second embodiment.

As shown in FIG. 55, on the semiconductor module SA, a control chip 30 for controlling the IGBT chip 10 is mounted. At this time, the control chip 30 tends to be influenced by heat since the control chip is mounted near the heating body such as the IGBT chip 10. Therefore, as shown in FIG. 56, the insulating layer 70 and the TIM layer 80 are bonded in the intended regions so that the insulating layer 70 covers a region W1 of all the chip mounting portions TAB1 to TAB5 including the chip mounting portion TAB5 used for the control chip 30 and so that the TIM layer 80 covers a region W2 of all the semiconductor chips. As a result, in the structure shown in FIG. 56, the control chip 30 is located in the region of the insulating layer 70 and the region of the TIM layer 80 in a transparent plan view.

The TIM layer 80 is bonded so as to cover the region W2 of all the semiconductor chips, so that the influence of the heat on the control chip 30 can be moderated.

The structure shown in FIG. 56 also satisfies the relations of "the size of the insulating layer 70>the size of the TIM layer 80", "the size of the insulating layer 70≥the size of the exposed portion of the chip mounting portion", and "the size of the TIM layer 80≥the region of all the semiconductor chips".

The semiconductor module SA is fixed to the heat sink 140 shown in FIG. 47 by the screw member 150, and therefore, there is concern about damage in the fixing such as package cracks. Therefore, in the structure shown in FIG. 56 according to the present second embodiment, in a plan view (back view), the insulating layer 70 and the TIM layer 80 are formed to extend over both sides of a virtual line 170 connecting the respective centers of the through hole MR1 and the through hole MR2 of the sealing body MR. In other words, the insulating layer 70 and the TIM layer 80 are arranged on the virtual line 170.

Thus, by arranging the insulating layer 70 and the TIM layer 80 on the virtual line 170, the damage in the screw fixing can be moderated.

In a plan view (back view), a distance L3 between the virtual line 170 and one end (long side) of the insulating layer 70 arranged in the direction along the virtual line 170 and a distance L4 between the virtual line 170 and the other (opposite) end (long side) of the insulating layer 70 are preferably the same as each other. That is, in the structure shown in FIG. 56, a relation of "L3=L4" is preferable. By the relation of "L3=L4", the stability in the screw fixing of the semiconductor module SA to the heat sink 140 can be improved.

Further, the embodiment and the modification example can be combined and applied within the scope of the concept of the technical idea described in the first and second embodiments.

The first and second embodiments have been described while exemplifying the IGBT such as a power bipolar transistor (Bipolar Transistor) as a power element embedded in the semiconductor module. However, as the embedded element, a power MOSFET or others may be applicable.

In the first embodiment described above, the case of the bonding of the insulating layer 70 and the TIM layer 80 which are different members from each other to the sealing body MR has been described. However, a sheet structural body 180 (see FIG. 50) formed by previously joining the insulating layer 70 and the TIM layer 80 may be prepared, and the above-described sheet structural body 180 may be bonded to the sealing body MR formed by the resin molding. At that time, the sheet structural body 180 is bonded to the back surface BS6 of the sealing body MR so that the insulating layer 70 covers the exposed portion of each back surface of the chip mounting portions TAB1 to TAB4.

Also in this case, note that the region of the TIM layer 80 in the sheet structural body 180 is included in the region of the insulating layer 70 in a plan view (back view).

The insulating layer 70 and the TIM layer 80 may be divided and bonded to the sealing body MR for each chip mounting portion or each semiconductor chip. Also in this case, the same effect as that of the semiconductor module SA in the first embodiment can be obtained.

More specifically, even the structure in which the insulating layer 70 and the TIM layer 80 are divided for each chip mounting portion or each semiconductor chip to bond the divided insulating layers 70 and the divided TIM layers 80 to the sealing body MR may be applicable as long as satisfying the relations of "the size of the insulating layer 70>the size of the TIM layer 80", "the size of the insulating layer 70≥the size of the exposed portion of the chip mounting portion", and "the size of the TIM layer 80≥the region of all the semiconductor chips". Therefore, the same effect as that of the semiconductor module SA of the first embodiment can be obtained.

The embodiments include the following aspects.

(Statement 1)

A sheet structural body is bonded to a semiconductor module including a semiconductor chip to which a power transistor is embedded, the sheet structural body includes an insulating layer and a heat transfer material layer, the insulating layer in which a part of the chip mounting portion on which the semiconductor chip is mounted is exposed from a back surface of a sealing body of the semiconductor module and which is bonded to the sealing body so as to cover a part of the chip mounting portion exposed from the back surface of the sealing body, and the heat transfer material layer being laminated and bonded onto the insulating layer, and a region of the heat transfer material layer is included in a region of the insulating layer in a plan view.

What is claimed is:

1. A semiconductor module comprising:
a first semiconductor chip including a first power transistor therein and having a first surface formed with a first terminal electrically connected to the first power transistor and a second surface opposite to the first surface, the second surface being formed with a second terminal electrically connected to the first power transistor;
a second semiconductor chip including a second power transistor therein and having a first surface formed with a third terminal electrically connected to the second power transistor and a second surface opposite to the first surface, the second surface being formed with a fourth terminal electrically connected to the second power transistor;
a first chip mounting portion having a first surface and a second surface opposite to the first surface, the first chip mounting portion mounting the first semiconductor chip thereon through a first conductive bonding material so that the first surface of the first chip mounting portion and the second surface of the first semiconductor chip face each other;
a second chip mounting portion having a first surface and a second surface opposite to the first surface, the second chip mounting portion mounting the second semiconductor chip thereon through a second conductive bonding material so that the first surface of the second chip mounting portion and the second surface of the second semiconductor chip face each other;
a plurality of leads arranged around the first chip mounting portion and the second chip mounting portion;
a first conductive member electrically connecting the second chip mounting portion and the first terminal of the first semiconductor chip;
a second conductive member electrically connecting the third terminal of the second semiconductor chip and any lead of the plurality of leads;
a sealing body having a first surface and a second surface opposite to the first surface, the sealing body sealing the first semiconductor chip, the second semiconductor chip, a part of the first chip mounting portion, a part of the second chip mounting portion, the first conductive member, the second conductive member, and a part of each of the plurality of leads so that each of the second surface of the first chip mounting portion and the second surface of the second chip mounting portion is exposed from the second surface of the sealing body;
an insulating layer bonded to the second surface of the sealing body so as to cover the second surface of the first chip mounting portion and the second surface of the second chip mounting portion; and
a heat transfer material layer laminated and bonded onto the insulating layer,
wherein a region of the heat transfer material layer is included in a region of the insulating layer in a plan view,
wherein, in the plan view, the insulating layer includes: a first side extending in a first direction; a second side opposite to the first side; a third side extending in a second direction crossing the first direction; and a fourth side opposite to the third side,
wherein, in a plan view, the heat transfer material layer includes: a fifth side extending in the first direction; a sixth side opposite to the fifth side; a seventh side extending in the second direction; and an eighth side opposite to the seventh side, and
wherein, in a plan view, the fifth side of the heat transfer material layer is located between the first side of the insulating layer and the second side of the insulating layer, the sixth side of the heat transfer material layer is located between the second side of the insulating layer and the fifth side of the heat transfer material layer, the seventh side of the heat transfer material layer is located between the third side of the insulating layer and the fourth side of the insulating layer, and the eighth side of the heat transfer material layer is located between the fourth side of the insulating layer and the seventh side of the heat transfer material layer.

2. The semiconductor module according to claim 1, wherein each of the first semiconductor chip and the second semiconductor chip is located inside the region of the heat transfer material layer in a transparent plan view.

3. The semiconductor module according to claim 1 further comprising
a control chip controlling the first semiconductor chip and the second semiconductor chip,
wherein, in a transparent plan view, the control chip is located in the region of the insulating layer and the region of the heat transfer material layer.

* * * * *